(12) United States Patent
Koga

(10) Patent No.: US 11,290,668 B2
(45) Date of Patent: Mar. 29, 2022

(54) IMAGING ELEMENT AND IMAGING APPARATUS

(71) Applicant: SONY SEMICONDUCTOR SOLUTIONS CORPORATION, Kanagawa (JP)

(72) Inventor: Fumihiko Koga, Kanagawa (JP)

(73) Assignee: Sony Semiconductor Solutions Corporation, Kanagawa (JP)

(*) Notice: Subject to any disclaimer, the term of this patent is extended or adjusted under 35 U.S.C. 154(b) by 267 days.

(21) Appl. No.: 16/488,743

(22) PCT Filed: Feb. 13, 2018

(86) PCT No.: PCT/JP2018/004795
§ 371 (c)(1),
(2) Date: Aug. 26, 2019

(87) PCT Pub. No.: WO2018/163720
PCT Pub. Date: Sep. 13, 2018

(65) Prior Publication Data
US 2021/0136309 A1 May 6, 2021

(30) Foreign Application Priority Data
Mar. 10, 2017 (JP) .............................. JP2017-045687

(51) Int. Cl.
*H04N 5/374* (2011.01)
*H04N 5/3745* (2011.01)
*H01L 27/146* (2006.01)

(52) U.S. Cl.
CPC ....... *H04N 5/3745* (2013.01); *H01L 27/1461* (2013.01)

(58) Field of Classification Search
CPC .. H04N 5/3745; H04N 5/374; H01L 27/1461; H01L 27/14636; H01L 27/14621; H01L 27/14627
See application file for complete search history.

(56) References Cited

U.S. PATENT DOCUMENTS

| 6,163,030 A | 12/2000 | Johnson et al. |
| 2008/0087835 A1 | 4/2008 | Okada |

(Continued)

FOREIGN PATENT DOCUMENTS

| JP | 2008-072090 | 3/2008 |
| JP | 2008-098390 | 4/2008 |

(Continued)

OTHER PUBLICATIONS

International Search Report prepared by the Japan Patent Office on Apr. 18, 2018, for International Application No. PCT/JP2018/004795.

*Primary Examiner* — Tony Ko
(74) *Attorney, Agent, or Firm* — Sheridan Ross P.C.

(57) ABSTRACT

An imaging element according to an embodiment of the present disclosure includes: a photoelectric conversion layer; a first electrode that collects a negative signal charge generated in the photoelectric conversion layer; and a second electrode that collects a positive signal charge generated in the photoelectric conversion layer. Each of the first electrode and the second electrode is provided on side opposite to a light incident surface of the photoelectric conversion layer.

20 Claims, 39 Drawing Sheets

(56) References Cited

U.S. PATENT DOCUMENTS

| | | |
|---|---|---|
| 2012/0086095 A1 | 4/2012 | Nishiyama et al. |
| 2015/0349008 A1 | 12/2015 | Yamaguchi |
| 2016/0037098 A1 | 2/2016 | Lee et al. |
| 2016/0301882 A1 | 10/2016 | Yamashita et al. |
| 2017/0162617 A1 | 6/2017 | Takahashi et al. |
| 2018/0151620 A1* | 5/2018 | Tashiro ............... H04N 5/374 |

FOREIGN PATENT DOCUMENTS

| | | |
|---|---|---|
| JP | 2011-166394 | 8/2011 |
| JP | 2016-201449 | 12/2016 |
| JP | 2017-108101 | 6/2017 |
| WO | WO 2010/116974 | 10/2010 |
| WO | WO 2014/112279 | 7/2014 |
| WO | WO 2016/104177 | 6/2016 |

* cited by examiner

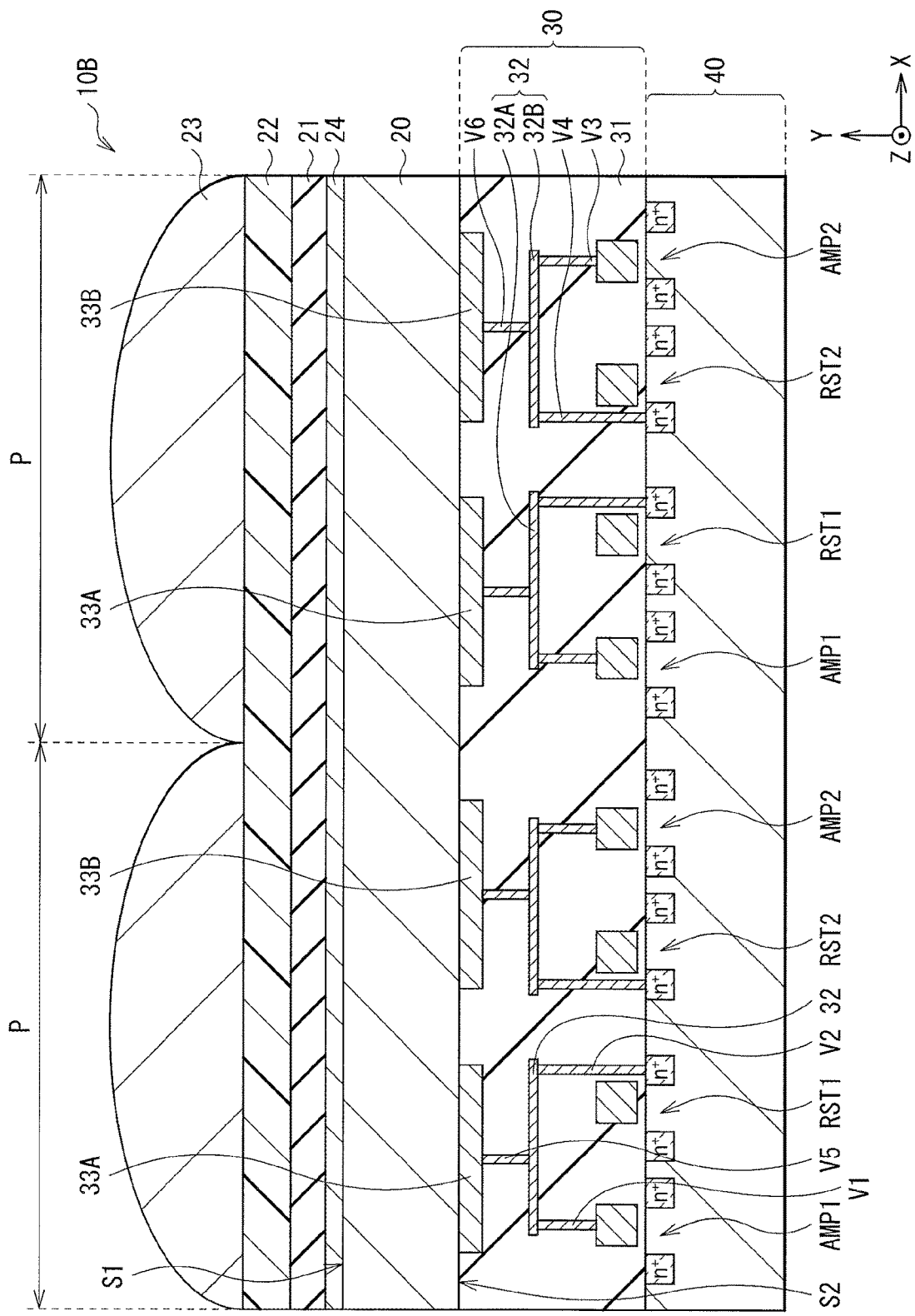

IMAGING ELEMENT AND IMAGING APPARATUS

CROSS REFERENCE TO RELATED APPLICATIONS

This application is a national stage application under 35 U.S.C. 371 and claims the benefit of PCT Application No. PCT/JP2018/004795 having an international filing date of 13 Feb. 2018, which designated the United States, which PCT application claimed the benefit of Japanese Patent Application No. 2017-045687 filed 10 Mar. 2017, the entire disclosures of each of which are incorporated herein by reference.

TECHNICAL FIELD

The present disclosure relates to, for example, an imaging element using both an electron and a hole as signal charges and an imaging apparatus including the same.

BACKGROUND ART

In recent years, as a technology for remarkably improving characteristics of an image sensor, a configuration has been proposed in which a photoelectric converter is disposed outside a semiconductor substrate (for example, above the semiconductor substrate). With such a configuration, it is possible to greatly change photoelectric conversion characteristics determined by an existing semiconductor substrate material. For example, the configuration has a possibility of achieving an image sensor having high functionality and high performance, which have been difficult to achieve with an image sensor using a Si substrate for far infrared detection and the like.

However, in the image sensor having the above-described configuration, one charge (e.g., an electron) of an electron and a hole generated in the photoelectric converter is utilized as a signal, while the other charge (e.g., the hole) is discharged from an electrode and is not utilized as a signal. In contrast, for example, PTL 1 discloses an imaging device in which charge accumulation regions including p-type and n-type semiconductors are formed in a semiconductor substrate, and both charges, that is, an electron and a hole accumulated in each of the regions are detected as signal charges by a detection circuit.

CITATION LIST

Patent Literature

PTL 1: Japanese Unexamined Patent Application Publication No. 2011-166394

SUMMARY OF THE INVENTION

Incidentally, in an imaging apparatus, there is demand for improvement in sensitivity and miniaturization of elements.

It is desirable to provide an imaging element and an imaging apparatus that make it possible to be miniaturized while improving sensitivity.

An imaging element according to an embodiment of the present disclosure includes: a photoelectric conversion layer; a first electrode that collects a negative signal charge generated in the photoelectric conversion layer; and a second electrode that collects a positive signal charge generated in the photoelectric conversion layer. Each of the first electrode and the second electrode is provided on side opposite to a light incident surface of the photoelectric conversion layer.

An imaging apparatus according to an embodiment of the present disclosure includes, for each of a plurality of pixels, one or a plurality of imaging elements according to the embodiment of the present disclosure.

In the imaging element according to the embodiment of the present disclosure and the imaging apparatus according to the embodiment of the present disclosure, the first electrode and the second electrode are disposed on side opposite to the light incident surface of the photoelectric conversion layer. The first electrode collects the negative signal charge generated in the photoelectric conversion layer, and the second electrode collects the positive signal charge generated in the photoelectric conversion layer. This makes it possible to enlarge a photoelectric conversion region, as compared with a case where the photoelectric conversion layer is sandwiched between a pair of electrodes. Further, unlike a case described above, it is not necessary to provide a plurality of charge accumulation regions including p-type and n-type semiconductors in a semiconductor substrate.

According to the imaging element of the embodiment of the present disclosure and the imaging apparatus of the embodiment of the present disclosure, the first electrode and the second electrode, which respectively collect the negative signal charge and the positive signal charge generated in the photoelectric conversion layer, are disposed on side opposite to the light incident surface of the photoelectric conversion layer, which makes it possible to enlarge the photoelectric conversion region and improve sensitivity. In addition, unlike the case described above, it is not necessary to provide a plurality of p-type and n-type charge accumulation regions in the semiconductor substrate, which makes it possible to achieve miniaturization.

The effects described herein are not necessarily limited, and may be any of the effects described in the present disclosure.

BRIEF DESCRIPTION OF DRAWINGS

FIG. 9 is a cross-sectional view of a schematic configuration of an imaging element according to a second embodiment of the present disclosure.

MODES FOR CARRYING OUT THE INVENTION

Hereinafter, some embodiments of the present disclosure will be described in detail with reference to the drawings. The following description is given of specific examples of the present disclosure, and the present disclosure is not limited to the following embodiments. Moreover, the present disclosure is not limited to positions, dimensions, dimension ratios, etc. of respective components illustrated in the respective drawings. It is to be noted that description is given in the following order.

1. First Embodiment (an example in which a first electrode and a second electrode each collecting a positive charge or a negative charge are provided on side opposite to a light incident surface of a photoelectric conversion layer)
   1-1. Configuration of Imaging Element
   1-2. Method of Manufacturing Imaging Element
   1-3. Workings and Effects
2. Second Embodiment (an example in which the third electrode is provided on side of the light incident surface of the photoelectric conversion layer)
3. Third Embodiment (an example in which a fourth electrode is provided between the first electrode and the second electrode)
4. Modification Example 1 (Example in which the third electrode and the fourth electrode are provided on side of the light incident surface of the photoelectric conversion layer and on side opposite to the light incident surface)
5. Fourth Embodiment (an example in which an insulating layer is provided between the photoelectric conversion layer and the third electrode)
6. Fifth Embodiment (an example in which an opening is provided in the insulating layer between the photoelectric conversion layer and the third electrode)
7. Sixth Embodiment (an example in which the wall-shaped first electrode and the wall-shaped second electrode are provided and embedded in the photoelectric conversion layer)
8. Seventh Embodiment (an example in which a barrier layer is provided between the photoelectric conversion layer and each of the first electrode and the second electrode)
9. Eighth Embodiment (an example in which a voltage controller is provided to control a voltage of the second electrode)
10. Modification Example 2 (an example of controlling voltages of the first electrode and the second electrode using capacitive coupling)
11. Ninth Embodiment (an example in which each of the first electrode and the second electrode includes an accumulation electrode and a readout electrode)
12. Application Examples

1. FIRST EMBODIMENT

Figure 1:
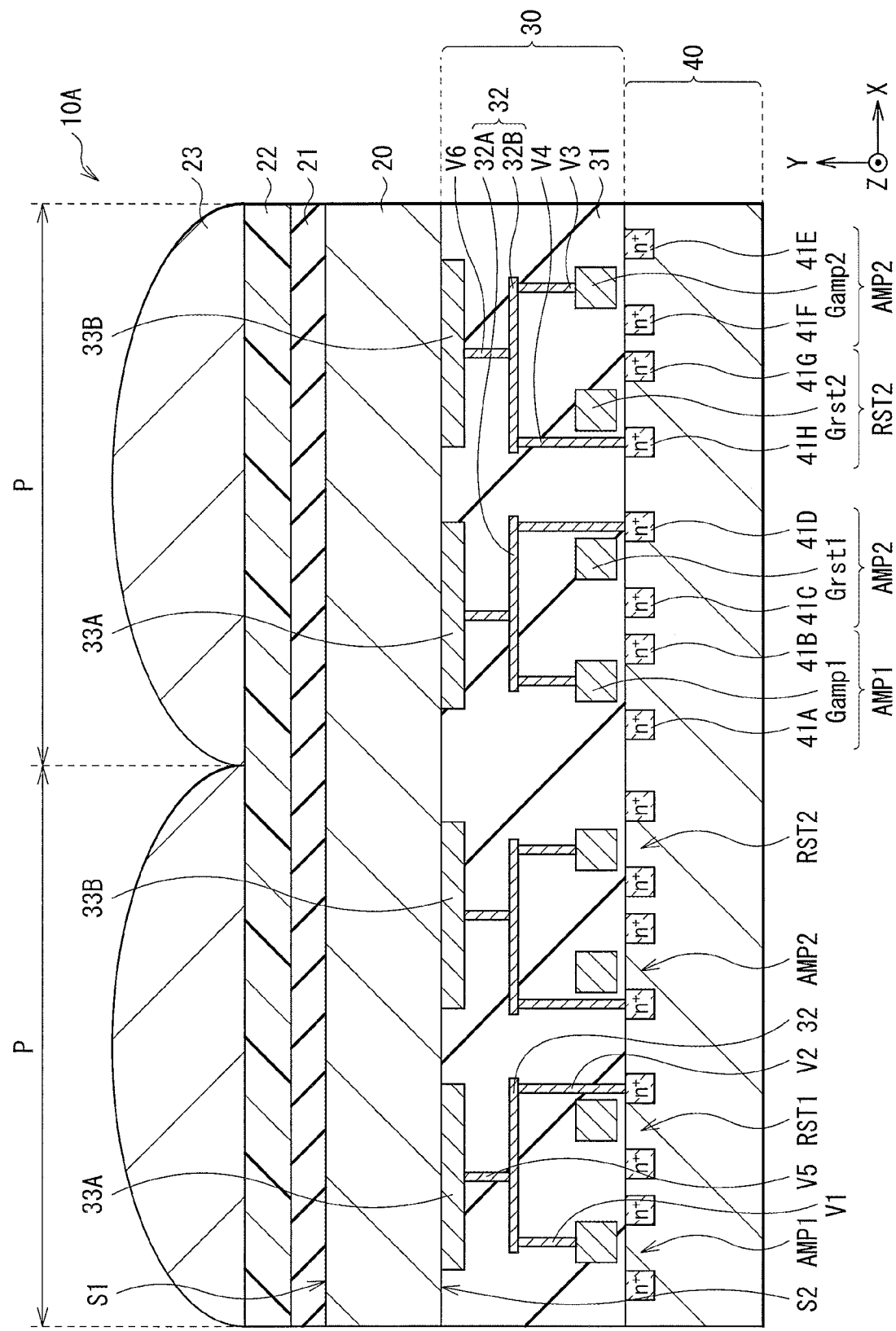
FIG. 1 is a cross-sectional view of a schematic configuration of an imaging element according to a first embodiment of the present disclosure.
Figure 2:
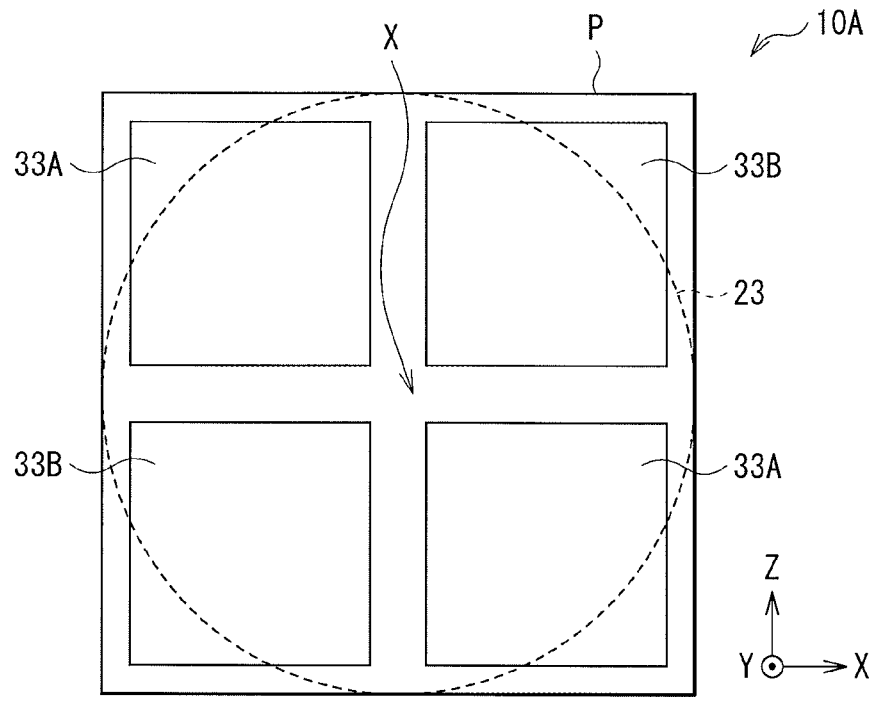
FIG. 2 is a schematic diagram illustrating an example of planar configurations of a first electrode and a second electrode of the imaging element illustrated in FIG. 1.
Figure 3:
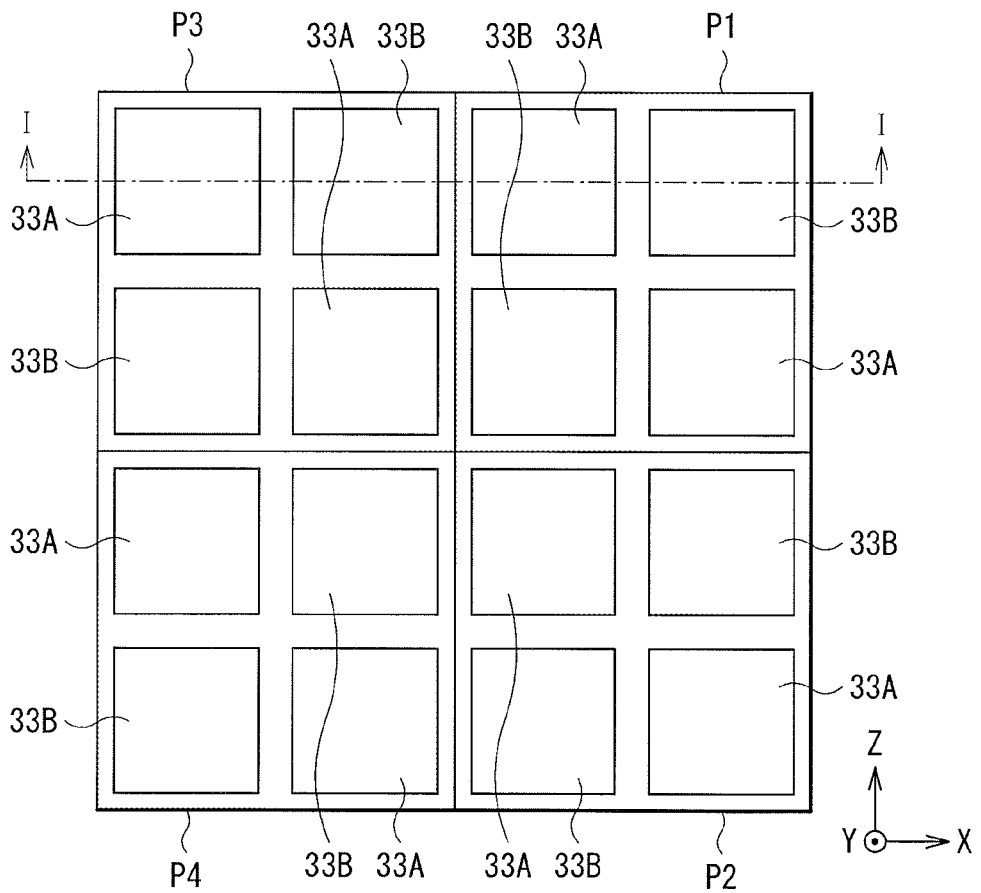
FIG. 3 is a schematic diagram illustrating a planar configuration in a case where a plurality of imaging elements having an electrode arrangement illustrated in FIG. 2 is combined.
Figure 4:
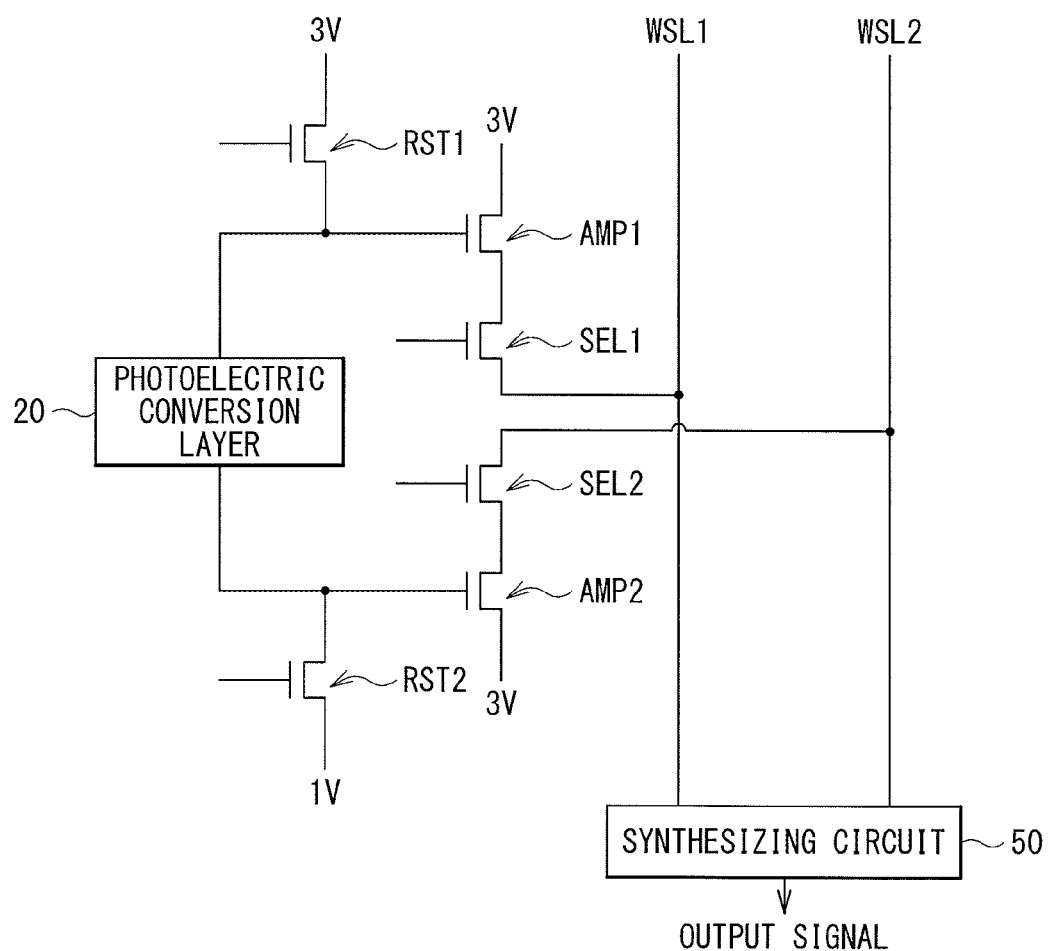
FIG. 4 is an equivalent circuit diagram of the imaging element illustrated in FIG. 1.

FIG. 1 illustrates a cross-sectional configuration of an imaging element (an imaging element 10A) according to a first embodiment of the present disclosure. FIG. 2 schematically illustrates a planar configuration of the imaging element 10A. FIG. 3 schematically illustrates a planar configuration in a case where a plurality of imaging elements 10A is combined, and FIG. 1 illustrates a cross-sectional configuration taken along a line 1-1 illustrated in FIG. 3. FIG. 4 is an equivalent circuit diagram of the image sensor 10A illustrated in FIG. 1. The imaging element 10A configures one pixel (a unit pixel P) in an imaging apparatus (an imaging apparatus 1; see FIG. 45) such as a CMOS image sensor used in an electronic apparatus such as a digital still camera and a video camera, for example.

1-1. Configuration of Imaging Element

The imaging element 10A includes a photoelectric converter outside a semiconductor substrate. Specifically, the imaging element 10A according to the present embodiment has a configuration that includes, for example, a photoelectric conversion layer 20 including an organic semiconductor material, a first electrode 33A, and a second electrode 33B. The first electrode and the second electrode collect charges having different polarities, and are provided on a surface (a surface S2) opposite to a light incident surface (a surface S1) of the photoelectric conversion layer 20. On side of the surface S1 of the photoelectric conversion layer 20, for example, a color filter 22 and an on-chip lens 23 are stacked in this order with an insulating layer 21 interposed therebetween. On side of the surface S2 of the photoelectric conversion layer 20, a wiring layer 30 including a wiring including the first electrode 33A and the second electrode 33B and a semiconductor substrate 40 are stacked in order from side of the surface S1.

The wiring layer 30 includes the first electrode 33A and the second electrode 33B on a surface, facing the photoelectric conversion layer 20, of an interlayer insulating layer 31, and includes a first amplifier transistor AMP1 and a second amplifier transistor AMP2 on side of the semiconductor substrate 40. Specifically, gate sections (Gamp1 and Gamp2) respectively configuring the first amplifier transistor AMP1 and the second amplifier transistor AMP2 are provided in the interlayer insulating layer 31 in the vicinity of the semiconductor substrate 40. Further, gate sections (Grst1 and Grst2) respectively configuring a first reset transistor RST1 and a second reset transistor RST2 are provided in the interlayer insulating layer 31 on side of the semiconductor substrate 40. The semiconductor substrate 40 includes n-type diffusion layers 41A, 41B, 41C, 41D, 41E, 41F, 41G, and 41H that configure, for example, source sections and drain sections of the first amplifier transistor AMP1, the second amplifier transistor AMP2, the first reset transistor RST1, and the second reset transistor RST2 on a surface facing the wiring layer 30.

In the figure, "+ (plus)" attached to "n" indicates that n-type impurity concentration is high.

The first electrode 33A is electrically coupled to the gate section Gamp1 of the first amplifier transistor AMP1 and the source section 41D of the first reset transistor RST1 through a wiring 32A provided in the wiring layer 30 and vias V1, V2, and V5. The second electrode 33B is electrically coupled to the gate section Gamp2 of the second amplifier transistor AMP2 and the source section 41H of the second reset transistor RST2 through a wiring 32B provided in the wiring layer 30 and vias V3, V4, and V6. Different voltages are applied to the source section 41D of the first reset transistor RST1 and the source section 41H of the second reset transistor RST2. Specifically, for example, a voltage of 3 V is applied to the source section 41D of the first reset transistors RST1. For example, a voltage of 1 V is applied to the source section 41H of the second reset transistors RST2. The semiconductor substrate 40 includes a p-type silicon substrate, and is held at 0 V, for example.

The imaging element 10A further includes a first select transistor SEL1 and a second select transistor SEL2. A drain section of the first select transistor SEL1 and a drain section of the second select transistor SEL2 are electrically coupled to the first electrode 33A and the second electrode 33B, respectively. A source section of the first select transistor SEL1 and a source section of the second select transistor SEL2 are electrically coupled to a signal line WSL1 and a signal line WSL2, respectively. The signal line WSL1 and the signal line WSL2 are coupled to a synthesizing circuit 50 that synthesizes a negative signal charge (an electron) and a positive signal charge (a hole) absorbed by the first electrode 33A and the second electrode 33B. In the synthesizing circuit 50, for example, a difference between a signal of the signal line WSL1 and a signal of the signal line WSL2 is output as an output signal to outside of the imaging apparatus 1. It is to be noted that the synthesizing circuits 50 may be provided for each of the pixels P, or may be provided for every two or more pixels (for example, each column) by sharing the signal lines WSL1 and WSL2. At least one or more synthesizing circuits 50 are provided for the shared signal lines WSL1 and WSL2.

Figure 5:
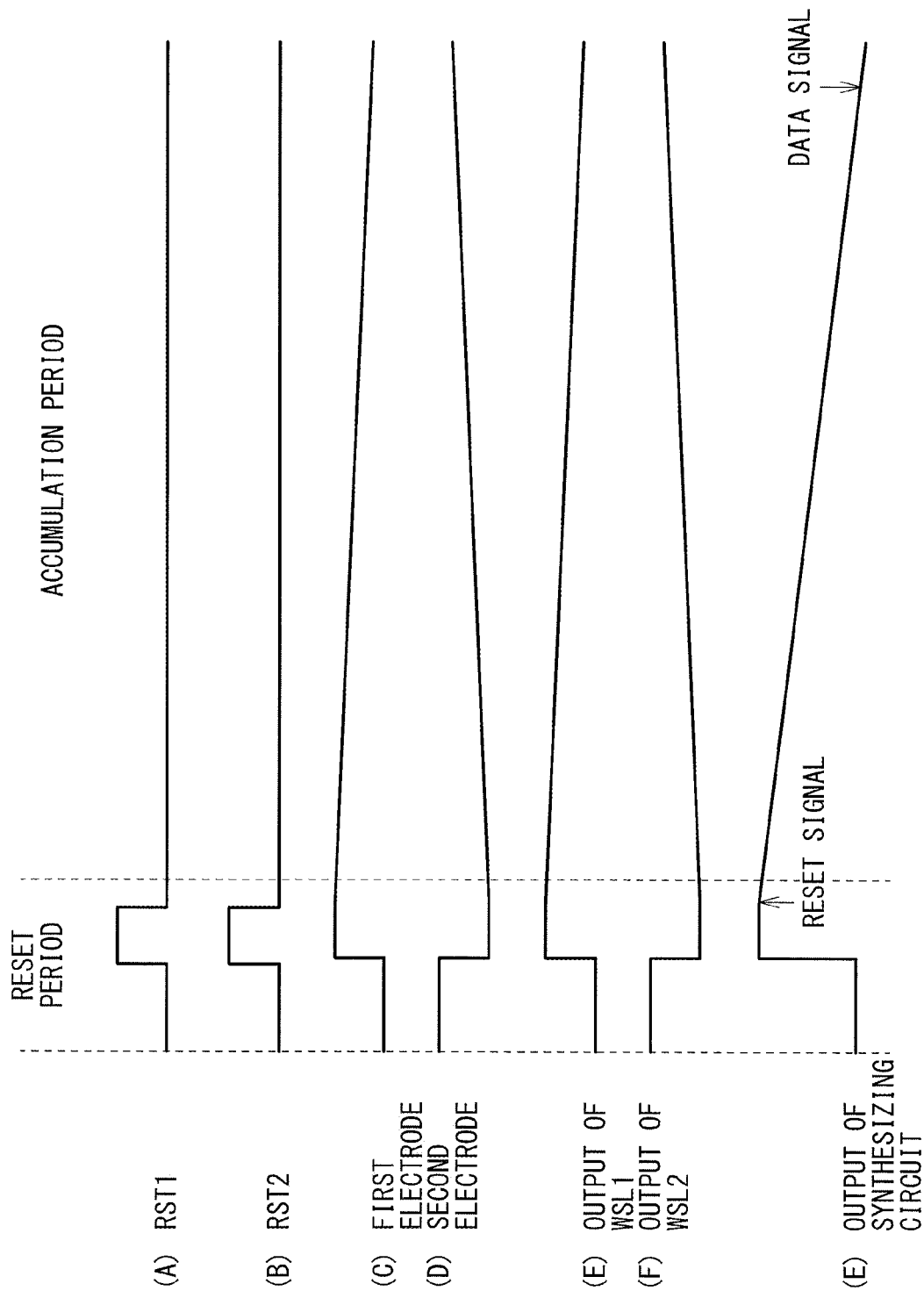
FIG. 5 is a potential transition diagram in an operation example of the imaging element illustrated in FIG. 1.

FIG. 5 illustrates potential transition in an operation example of the imaging element 10A, where (A) represents a potential of the first reset transistor RST1, (B) represents a potential of the second reset transistor RST2, (C) represents a potential of the first electrode 33A, (D) represents a potential of the second electrode 33B, (E) represents an output of the signal line WSL1, (F) represents an output of the signal line WSL2, and (G) represents an output of the synthesizing circuit 50.

In the imaging element 10A, a reset operation is performed before start of accumulation of signal charges. Specifically, the first reset transistor RST1 and the second reset transistor RST2 are turned on. As a result, voltages corresponding to a drain voltage of the first reset transistor RST1 and a drain voltage of the second reset transistor RST2 are applied to the first electrode 33A and the second electrode 33B, respectively. Subsequently, the first reset transistor RST1 and the second reset transistor RST2 are turned off, thereby determining reset potentials of the first electrode 33A and the second electrode 33B. The output of the synthesizing circuit 50 in this state is used as a reset signal and stored in a memory unit (not illustrated) provided outside the imaging apparatus 1 (a reset period).

In the imaging element 10A, a negative signal charge (an electron) and a positive signal charge (a hole) generated in the photoelectric conversion layer 20 in an accumulation period are respectively collected in corresponding electrodes (the first electrode 33A or the second electrode 33B) by an electric field formed between the first electrode 33A and the second electrode 33B. In the present embodiment, the first electrode 33A serves as an electron collecting section, and the second electrode 33B serves as a hole collecting section. The voltage of the first electrode 33A gradually decreases from an initial voltage by accumulation of electrons. In contrast, the voltage of the second electrode 33B gradually increases from the initial voltage by accumulation of holes. In the synthesizing circuit 50, an output after completion of a predetermined accumulation period is obtained as a data signal. In the imaging apparatus 1 according to the present embodiment, for example, a signal processor (not illustrated) provided outside calculates a difference between the data signal obtained in the synthesizing circuit 50 and the reset signal stored in the memory unit. As a result, a differential output of photoelectric conversion signals of electrons and holes is obtained.

The output of the synthesizing circuit 50 may be an analog signal or a digital signal. Synthesis of an electron signal and a hole signal to be performed in the synthesizing circuit 50 may be performed after AD conversion. Further, in the present embodiment, the reset signal is stored in the memory unit provided outside, but the present embodiment is not limited thereto, and for example, a memory unit may be provided inside the imaging element 10A or in each of the pixels P and the rest signal may be held therein. Alternatively, the reset signal may be held in the synthesizing circuit 50. In this case, the held reset signal may be a digital signal or an analog signal.

Hereinafter, a configuration, a material, and the like of each component of the imaging element 10A will be described.

The photoelectric conversion layer 20 converts light energy into electrical energy. The photoelectric conversion layer 20 includes, for example, an organic semiconductor material, i.e., a so-called dye material which photoelectrically converts light in a predetermined wavelength range and transmits light in another wavelength range. Examples of the organic semiconductor material include a quinazoline derivative and a quinacridone derivative.

The photoelectric conversion layer 20 may further include, for example, two or more kinds of organic semiconductor materials (p-type semiconductor materials or n-type semiconductor materials) functioning as a p-type semiconductor or an n-type semiconductor. As a result, a junction surface (a p/n junction surface) of the p-type semiconductor material and the n-type semiconductor material is formed in the photoelectric conversion layer 20. The p-type semiconductor functions relatively as an electron donor (a donor), and the n-type semiconductor functions relatively as an electron acceptor (an acceptor). The photoelectric conversion layer 20 provides a field in which excitons generated in absorption of light are separated into electrons and holes, and specifically, the excitons are separated into electrons and holes at an interface (the p/n junction surface) between the electron donor and the electron acceptor. A thickness of the photoelectric conversion layer 20 is, for example, from 50 nm to 500 nm.

It is to be noted that the organic semiconductor material included in the photoelectric conversion layer 20 is not particularly limited. In addition to the organic semiconductor materials described above, for example, any one kind of chlorinated boron subphthalocyanine, pentacene, benzothienobenzothiophene, fullerene, naphthalene, anthracene, phenanthrene, tetracene, pyrene, perylene, and fluoranthene or a derivative thereof is suitably used. Alternatively, a polymer such as phenylenevinylene, fluorene, carbazole, indole, pyrene, pyrrole, picoline, thiophene, acetylene, diacetylene, or a derivative thereof may be used. In addition, it is possible to preferably use a metal complex dye, a cyanine dye, a merocyanine dye, a phenylxanthene dye, a triphenylmethane dye, a rodacyanine dye, a xanthene dye, a macrocyclic azaannulene dye, an azulene dye, naphthoquinone, an anthraquinone dye, a chain compound in which a condensed polycyclic aromatic group such as anthracene and pyrene and an aromatic ring or a heterocyclic compound are condensed, a cyanine-like dye bonded by two nitrogen-containing hetero rings such as quinoline, benzothiazole, and benzoxazole that have a squarylium group and croconic methine group as a bonded chain, or by a squarylium group or a croconic methine group, etc. It is to be noted that as the above-described metal complex dye, a dithiol metal complex dye, a metallophthalocyanine dye, a metalloporphyrine dye, or a ruthenium complex dye is preferable, but the metal complex dye is not limited thereto.

The insulating layer 21 includes, for example, a single-layer film including one kind of silicon oxide, silicon nitride, silicon oxynitride (SiON) and the like, or a laminated film including two or more kinds thereof. A thickness of the insulating layer 21 is, for example, from 3 nm to 500 nm.

The color filter 22 is provided on the insulating layer 21, and for example, any one of a red filter, a green filter, and a blue filter is provided for each of the pixels P. These color filters 22 are provided in a regular color arrangement (e.g., a Bayer arrangement). Providing such a color filter 22 causes each of the imaging elements 10A to obtain light reception data of a wavelength corresponding to the color arrangement.

The on-chip lens 23 has a function of converging light toward the photoelectric conversion layer 20. Examples of a lens material include an organic material, a silicon oxide film ($SiO_2$), and the like.

The wiring layer 30 includes, in the interlayer insulating layer 31, the gate sections (Gamp1, Gamp2, Grst1, Grst2, etc.) of transistors disposed in the respective pixels P, such as the first amplifier transistor AMP1, the second amplifier transistor AMP2, the first reset transistor RST1, and the second reset transistor RST2, the first electrode 33A and the second electrode 33B, and wirings (the wiring 32 and the vias V1, V2, V3, V4, V5, V6, etc.) electrically coupling the respective transistors to the first electrode 33A or the second electrode 33B.

The interlayer insulating layer 31 includes, for example, a single-layer film including one kind of silicon oxide ($SiO_x$), silicon nitride ($SiN_x$), silicon oxynitride (SiON), and the like, or a laminated film including two or more kinds thereof.

The gale sections of the transistors (Gamp1, Gamp2, Grst1, Grst2, etc.) include, for example, polycrystalline silicon or the like.

The first electrode 33A collects and accumulates negative signal charges (electrons) among charges generated in the photoelectric conversion layer 20, and inputs the accumulated negative signal charges to the gale section Gamp1 of the first amplifier transistor AMP1. For example, the second electrode 33B collects and accumulates positive signal charges (holes) among the charges generated in the photoelectric conversion layer 20, and inputs the accumulated positive signal charges to the gate section Gamp2 of the second amplifier transistor AMP2.

The first electrode 33A and the second electrode 33B are spaced apart from each other on the surface of the interlayer insulating layer 31 facing the surface S2 of the photoelectric conversion layer 20, and each are in contact with the photoelectric conversion layer 20. Different voltages are applied to the first electrode 33A and the second electrode 33B. Specifically, for example, a voltage of 3 V applied to the source section 41D of the first reset transistor RST1 is applied to the first electrode 33A through the via V2, the wiring 32, and the via V5. For example, a voltage of 1 V applied to the source sections 41H of the second reset transistor RST2 is applied to the second electrodes 33B through the via V4, the wiring 32, and the via V6. As a result, electrons and holes generated in the photoelectric conversion layer 20 are attracted to the first electrode 33A and the second electrode 33B, respectively.

An electric field formed in the photoelectric conversion layer 20 is strongest at a boundary portion between the first electrode 33A and the second electrode 33B. Therefore, the first electrode 33A and the second electrode 33B are preferably disposed to cause an optical center X of the pixel P (a center of the on-chip lens 23) to coincide with the boundary portion between the first electrode 33A and the second electrode 33B. Further, the first electrode 33A and the second electrode 33B are divided into a plurality of portions, and the portions of the first electrode 33A and the portions of the second electrode 33B are arranged alternately, for example, in a checkered pattern as illustrated in, for example, FIGS. 2 and 3, which increases the boundary portion between the first electrode 33A and the second electrode 33B. This makes it possible efficiently collect electrons and holes generated in the pixel P.

Figure 6:
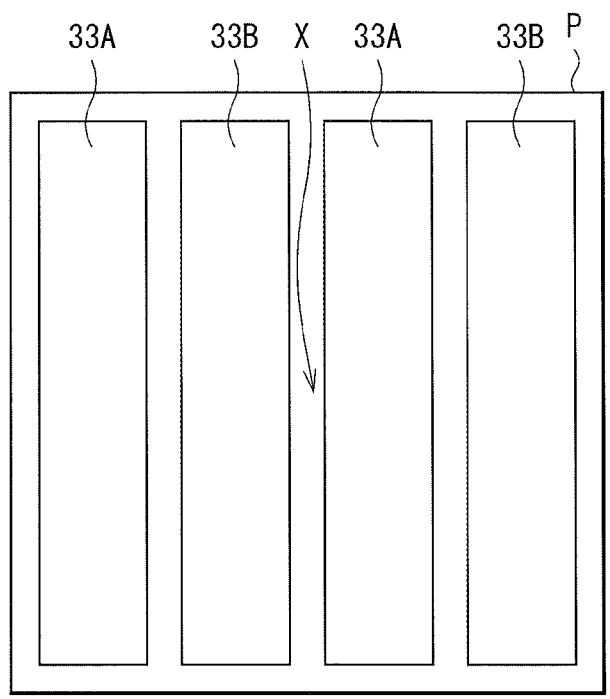
FIG. 6 is a schematic diagram illustrating another example of the planar configurations of the first electrode and the second electrode of the imaging element illustrated in FIG. 1.
Figure 7:
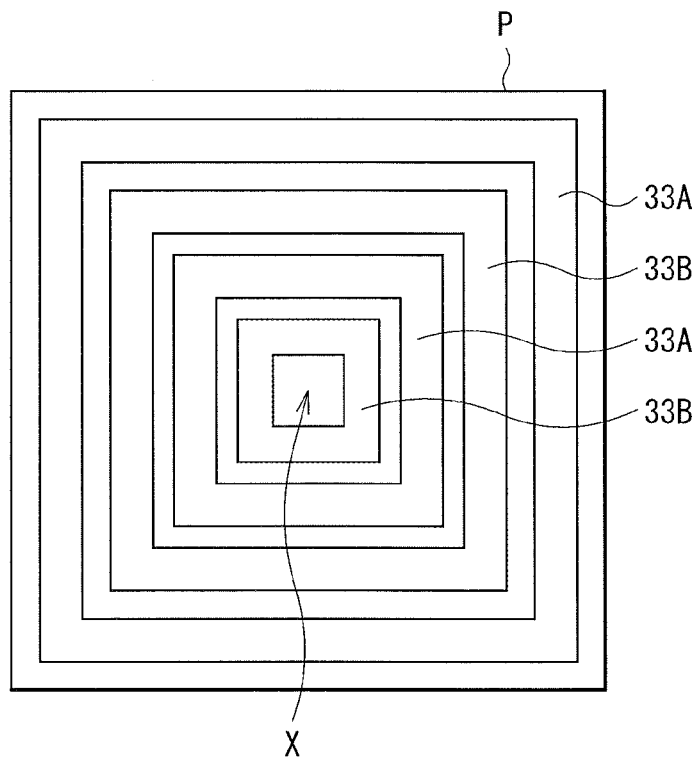
FIG. 7 is a schematic diagram illustrating another example of the planar configurations of the first electrode and the second electrode of the imaging element illustrated in FIG. 1.

Note that a distance between the first electrode 33A and the second electrode 33B may be sufficient as long as light having passed through the on-chip lens is applied to between the electrodes, and the distance is 50 nm or more, for example. In FIGS. 2 and 3, an example in which the first electrode 33A and the second electrode 33B are arranged in a checkered pattern is illustrated, but the present embodiment is not limited thereto. For example, as illustrated in FIG. 6, the first electrode 33A and the second electrode 33B may be formed in a strip shape, and the first electrode 33A and the second electrode 33B may be alternately arranged. Alternatively, as illustrated in FIG. 7, for example, the first electrode 33A and the second electrode 33B may be alternately arranged from the center toward a periphery of the pixel P.

The first electrode 33A and the second electrode 33B include, for example, a conductive film having light transmittance, and include, for example, ITO (indium tin oxide). However, other than ITO, a tin oxide ($SnO_2$) material to which a dopant is added or a zinc oxide material obtained by adding a dopant to aluminum zinc oxide (ZnO) may be used as constituent materials of the first electrode 33A and the second electrode 33B. Examples of the zinc oxide material include aluminum zinc oxide (AZO) to which aluminum (Al) is added as a dopant, gallium zinc oxide (GZO) to which gallium (Ga) is added, and indium zinc oxide (IZO) to which indium (In) is added. In addition, CuI, $InSbO_4$, ZnMgO, $CuInO_2$, $MgIN_2O_4$, CdO, $ZnSnO_3$, or the like may be used. The first electrode 33A and the second electrode 33B do not necessarily have light transmittance, and may use, for example, a metal film including aluminum (Al), tungsten (W), titanium (Ti), molybdenum (Mo), tantalum (Ta), copper (Cu), cobalt (Co), nickel (Ni), or the like, an alloy film thereof, or the metal film containing silicon or oxygen.

Each wiring (such as the wiring 32 and the vias V1, V2, V3, V4, V5, V6) includes, for example, a doped silicon material such as PDAS (Phosphorus Doped Amorphous Silicon), or a metal materials such as aluminum (Al), tungsten (W), titanium (Ti), cobalt (Co), hafnium (Hf), and tantalum (Ta).

The semiconductor substrate 40 includes, for example, a p-type silicon (Si) substrate, and includes n-type diffusion layers 41A, 41B, 41C, 41D, 41E, 41P, 41G, and 41H containing an n-type impurity are provided in predetermined regions facing the wiring layer 30. The n-type diffusion layers 41A, 41B, 41C, 41D, 41E, 41F, 41G, and 41H form the source sections and the drain sections of the first amplifier transistor AMP1, the second amplifier transistor AMP2, the first reset transistor RST1, and the second reset transistor RST2, as described above.

1-2. Method of Manufacturing Imaging Element

It is possible to manufacture the imaging element 10A according to the present embodiment as follows, for example.

Figure 8A:
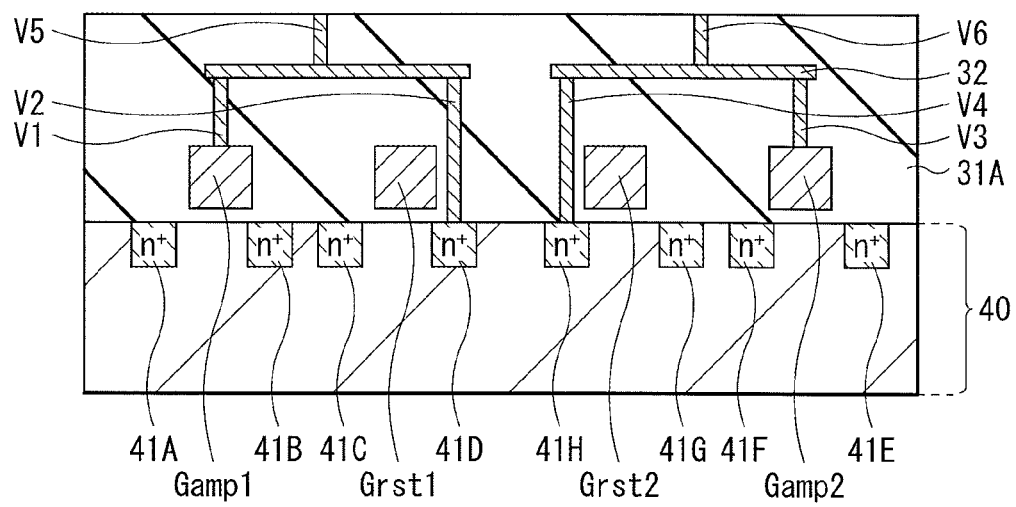
FIG. 8A is a cross-sectional view for description of a method of manufacturing the imaging element illustrated in FIG. 1.

FIGS. 8A to 8F illustrate the method of manufacturing the imaging element 10A in process order. First as illustrated in FIG. 8A, the n-type diffusion layers 41A, 41B, 41C, 41D, 41E, 41F, 41G, and 41H are formed in the semiconductor substrate 40, and then the gate sections (Gamp1, Gamp2, Grst1, and Grst2), the wiring 32, and the vias V1, V2, V3, V4, V5, and V6 are formed in the interlayer insulation layer 31A. It is possible to perform the above processes by a technology used in a typical CMOS process such as ion implantation and CVD (Chemical Vapor Deposition), for example.

Figure 8B:
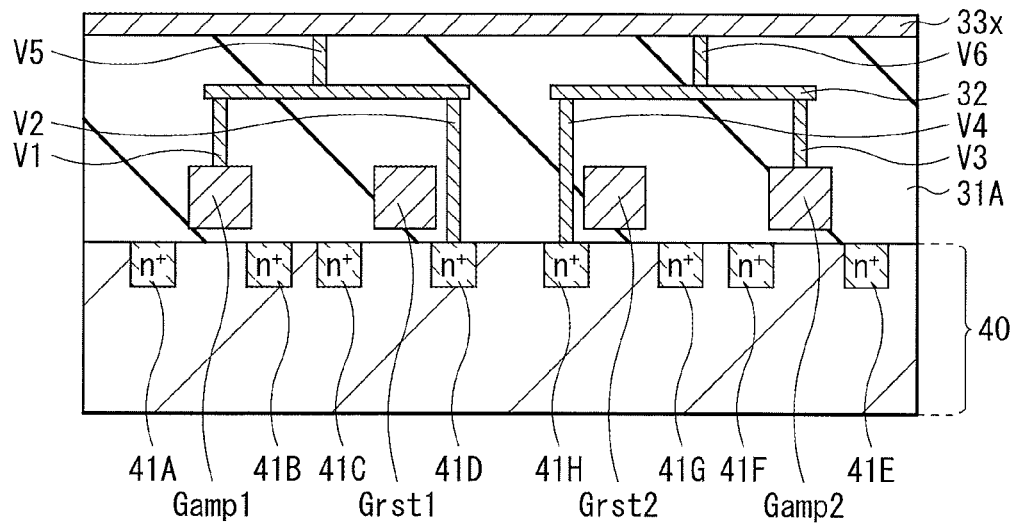
FIG. 8B is a cross-sectional view of a process subsequent to FIG. 8A.
Figure 8C:
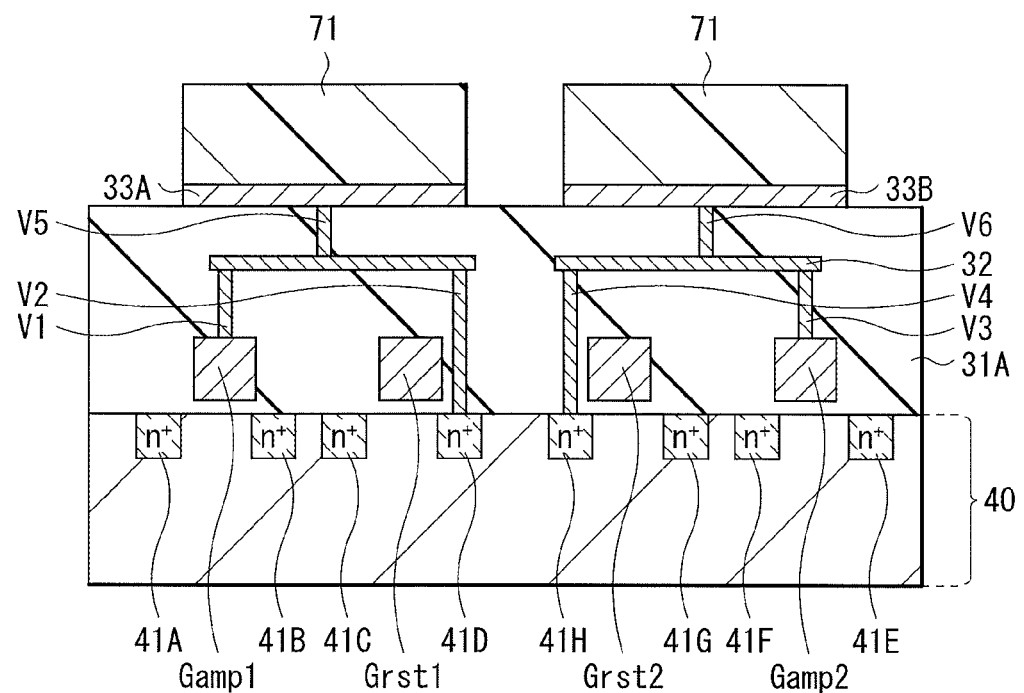
FIG. 8C is a cross-sectional view of a process subsequent to FIG. 8B.

Next, as illustrated in FIG. 8B, a conductive film 33x is formed on the interlayer insulating layer 31A. Next, as illustrated in FIG. 8C, a resist film 71 is formed at a predetermined position of the conductive film 33x, the conductive film 33x is patterned, and the conductive film 33x is separated by etch-back. Thus, the first electrode 33A and the second electrode 33B are formed.

Figure 8D:
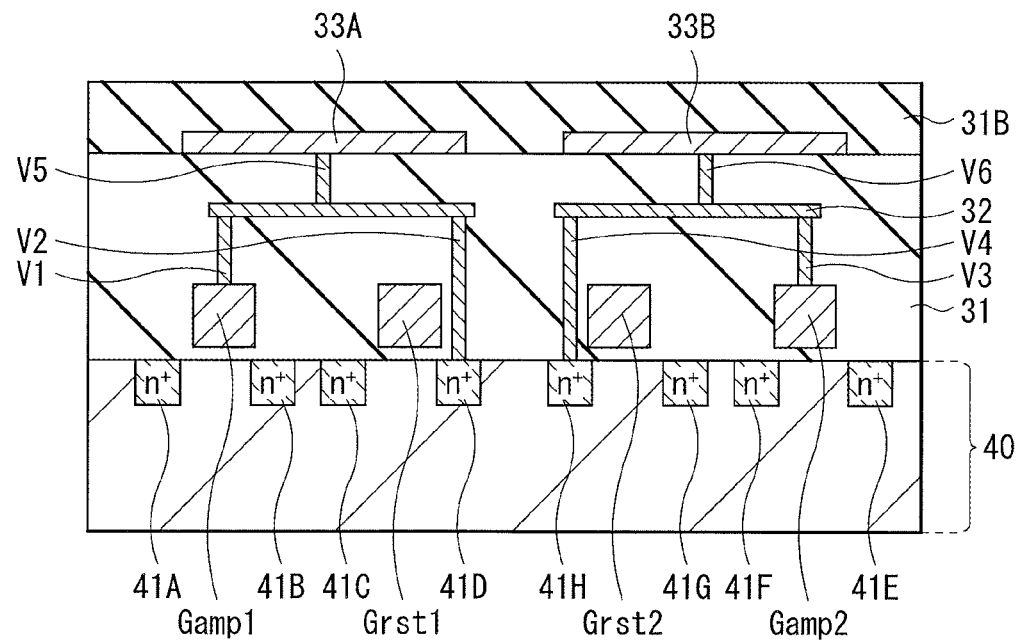
FIG. 8D is a cross-sectional view of a process subsequent to FIG. 8C.
Figure 8E:
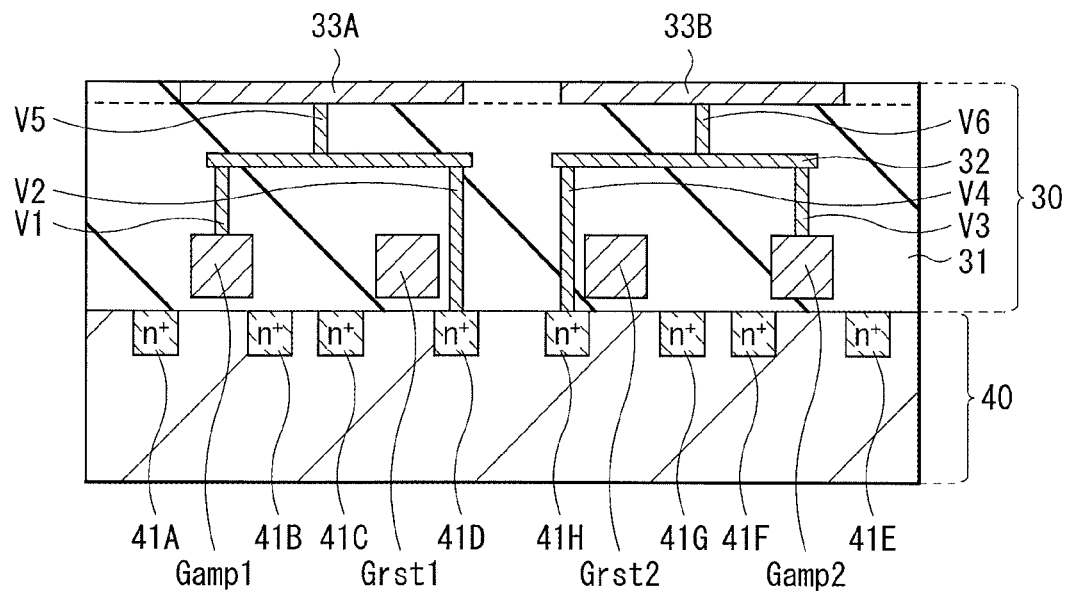
FIG. 8E is a cross-sectional view of a process subsequent to FIG. 8D.

Subsequently, as illustrated in FIG. 8D, after the resist film 71 is removed, the insulating film 31B covering the first electrode 33A and the second electrode 33B is formed. Next, as illustrated in FIG. 8E, the insulating film 31B on the first electrode 33A and the second electrode 33B is removed by, for example, a CMP (Chemical Mechanical Polishing) method. As a result, the wiring layer 30 illustrated in FIG. 1 is formed.

Figure 8F:
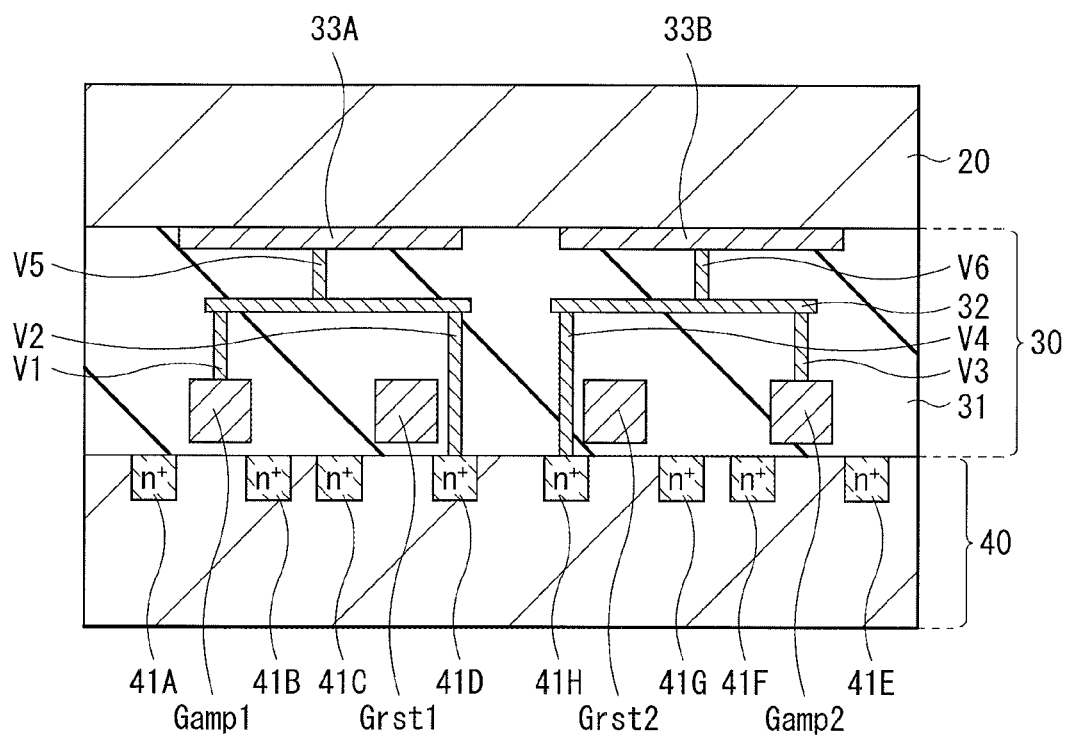
FIG. 8F is a cross-sectional view of a process subsequent to FIG. 8E.

Subsequently, as illustrated in FIG. 8F, the photoelectric converting layer 20 is formed on the wiring layer 30. Thereafter, the insulating layer 21, the color filter 22, and the on-chip lens 23 are formed in this order, thereby completing the imaging element 10A illustrated in FIG. 1.

1-3. Workings and Effects

As described above, as a technology for remarkably improving characteristics of an image sensor, an imaging device has been developed in which charge accumulation regions including p-type and n-type semiconductors are formed in a semiconductor substrate, and both charges, that is, an electron and a hole accumulated in each region are detected as signal charges. This imaging device has a configuration in which photoelectric conversion films each of which photoelectrically converts a corresponding one of red light, green light, and blue light are each sandwiched by a pair of electrodes.

However, in an imaging element, including the above-described imaging device, in which the photoelectric conversion film is vertically sandwiched between a pair of electrodes (an upper electrode and a lower electrode), it is necessary to form a plurality of semiconductor regions having different polarities in the semiconductor substrate, and there is an issue that a device size becomes large. Moreover, in the above-described imaging device, characteristics (e.g., sensitivity) of the image sensor are improved by obtaining the charges including both electrons and holes as signal charges, but a method of transmitting a signal obtained front the upper electrode to an output circuit portion is not clearly described.

Actually, in a case where a configuration of the above-described imaging device is employed, a wiring used to transmit the charges collected in the upper electrode to the semiconductor substrate is necessary for each pixel. The wiring is configured to penetrate through a photoelectric converter, which causes a possibility that a light-receiving region of the photoelectric converter is reduced to lower sensitivity. In addition, the upper electrode is divided for each pixel, and a wiring penetrating the photoelectric converter is formed, which increases a plurality of processes, thereby causing an issue that manufacturing cost is increased. Further, as described above, the pair of electrodes accumulating electrons and holes are provided in a parallel plate shape; therefore, coupling capacitance between the electrodes becomes large. Voltages of the pair of electrodes vary in opposite directions by collection of electrons and holes generated by photoelectric conversion. For this reason, if the coupling capacitance between the pair of electrodes is large, variations of the voltages by the signal charges cancel each other, and a charge-voltage variation rate of the signal charges is decreased, resulting in an issue that sensitivity is decreased.

In contrast, in the imaging element 10A according to the present embodiment, the first electrode 33A and the second electrode 33B, which respectively collect electrons and holes generated in the photoelectric conversion layer 20 as signal charges, are provided on the surface of the photoelectric conversion layer 20 on side opposite to the light incident surface S1. This eliminates need for a wiring penetrating the photoelectric conversion layer 20, which makes it possible to enlarge the photoelectric conversion region, as compared with, for example, the above-described imaging device in which one of an electron and a hole is collected as a signal charge from side of the light incident surface S1 of the photoelectric conversion layer 20. In addition, collection of the signal charges is performed outside the semiconductor substrate 40, and it is therefore unnecessary to provide a plurality of charge accumulation regions including p-type and n-type semiconductors in the semiconductor substrate as with the above-described imaging element that performs photoelectric conversion in, for example, a Si substrate and collects the signal charges.

As described above, in the imaging element 10A according to the present embodiment, the first electrode 33A and the second electrode 33B are provided on the surface on side opposite to the light incident surface S1 of the photoelectric conversion layer 20 and respectively collect electrons and holes as signal charges, which makes it possible to enlarge the photoelectric conversion region and improve sensitivity. In addition, it is not necessary to provide a plurality of charge accumulation regions including p-type and n-type semiconductors in the semiconductor substrate, which makes it possible to achieve miniaturization.

In addition, the first electrode 33A and the second electrode 33B that respectively collect electrons and holes as signal charges are disposed on the surface on side opposite to the light incident surface S1 of the photoelectric conversion layer 20, which makes it possible to reduce the manufacturing processes, as compared with the above-described imaging device that collects electrons and holes from a pair of electrodes opposed to each other with the photoelectric conversion layer interposed therebetween. In addition, it is possible to reduce manufacturing cost.

Further, the first electrode 33A and the second electrode 33B are provided side by side, which makes it possible to reduce the coupling capacitance between the first electrode 33A and the second electrode 338. Accordingly, it is possible to improve the charge-voltage conversion efficiency of the signal charges and to further improve sensitivity of the imaging element 10A.

Furthermore, in the present embodiment, the first electrode 33A and the second electrode 33B are divided into a plurality of portions in the pixel P, and these portions are arranged alternately in a checkered pattern, for example. This makes it possible to efficiently collect, in the first electrode 33A and the second electrode 33B, electrons and holes generated in the photoelectric conversion layer 20, and to further improve sensitivity.

Next, second to ninth embodiments and modification examples 1 and 2 will be described. Hereinafter, components similar to those in the above-described first embodiment are denoted by same reference numerals, and description thereof is omitted where appropriate.

2. SECOND EMBODIMENT

FIG. 9 illustrates a cross-sectional configuration of an imaging element 10B according to the second embodiment of the present disclosure. As with the imaging element 10A, the imaging element 10B configures one pixel (the unit pixel P) in an imaging apparatus (the imaging apparatus 1; see FIG. 45) such as a CMOS image sensor used in an electronic apparatus such as a digital still camera or a video camera, for example. The imaging element 10B according to the present embodiment is different from the imaging element 10A according to the above-described first embodiment in that a third electrode 24 is provided on the light incident surface S1 of the photoelectric conversion layer 20.

The third electrode 24 is provided on the photoelectric conversion layer 20 as a continuous film common to the respective pixels P, and collects excess electrons and excess holes generated at a position away from the boundary portion between the first electrode 33A and the second electrode 33B. The third electrode 24 is set to, for example, an intermediate potential between the first electrode 33A and the second electrode 33B. For example, as described above, in a case where the first electrode 33A collects negative signal charges (electrons) and the second electrode 33B collects positive signal charges (holes), a voltage lower than the voltage applied to the first electrode 33A and higher than the voltage applied to the second electrode 33B is applied to the third electrode 24.

The third electrode 24 includes, for example, a conductive film having light transmittance, and includes, for example, ITO (indium tin oxide). However, other than ITO, a tin oxide ($SnO_2$) material to which a dopant is added or a zinc oxide material obtained by adding a dopant to aluminum zinc oxide (ZnO) may be used as the constituent materials of the first electrode 33A and the second electrode 33B. Examples of the zinc oxide material include aluminum zinc oxide (AZO) to which aluminum (Al) is added as a dopant, gallium zinc oxide (GZO) to which gallium (Ga) is added, and indium zinc oxide (IZO) to which indium (In) is added. In addition, CuI, $InSbO_4$, ZnMgO, $CuInO_2$, $MgIN_2O_4$, CdO, $ZnSnCO_3$, or the like may be used.

Figure 10:
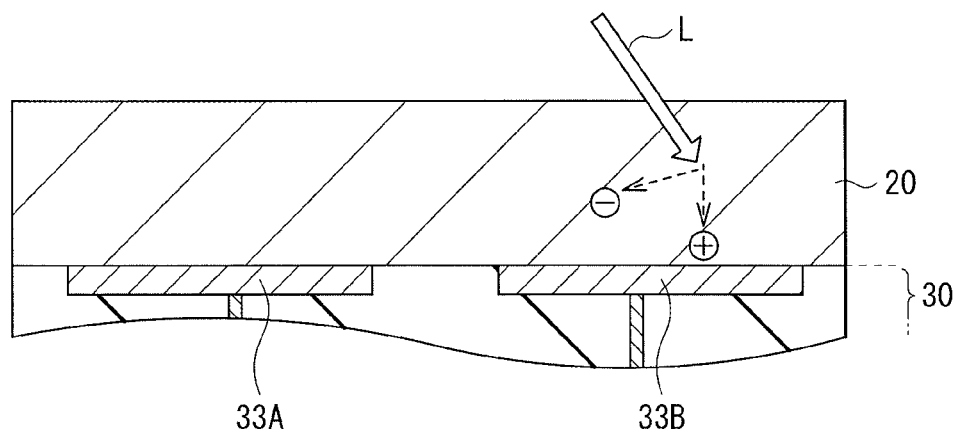
FIG. 10 is a schematic diagram for description of movement of charges in the imaging element illustrated in FIG. 1.
Figure 11:
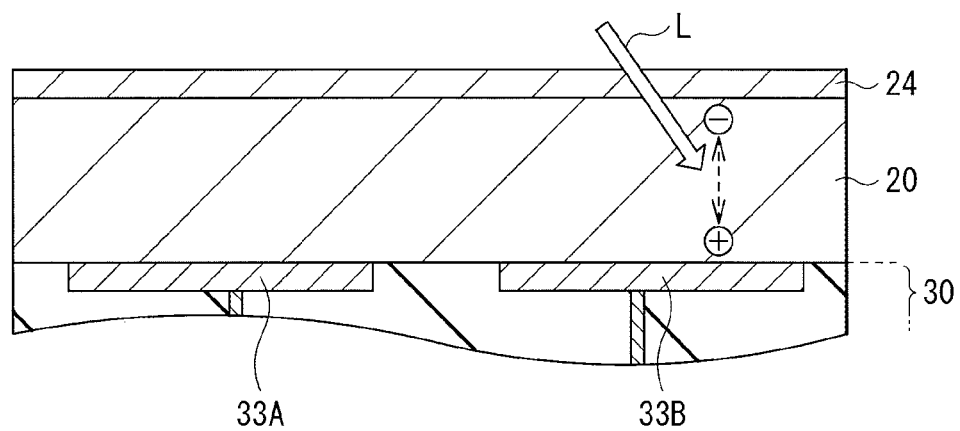
FIG. 11 is a schematic diagram for description of movement of charges in the imaging element illustrated in FIG. 9.

FIG. 10 schematically illustrates movement of charges in the imaging element 10A according to the first embodiment, and FIG. 11 schematically illustrates movement of charges in the imaging element 10B according to the present embodiment. In the imaging element 10A, an electric field is formed in the photoelectric conversion layer 20 by the first electrode 33A and the second electrode 33B. For example, charges (electrons and holes) generated at a position away from the boundary portion between the first electrode 33A and the second electrode 33B are collected by the electric field. For example, electrons are collected in the first electrode 33A and holes are collected in the second electrode 33B. Note that the electric field formed in the photoelectric conversion layer 20 is strongest at the boundary portion between the first electrode 33A and the second electrode 33B, and weakens with increasing distance from the boundary portion. Accordingly, as illustrated in FIG. 10, a drift of the charges generated far from the boundary portion is not accelerated by the electric field, and specifically, it takes time for the holes to reach the first electrode 33A.

In contrast, in the imaging element 10B, the third electrode 24 is provided above the photoelectric conversion layer 20, and a potential of the third electrode 24 is set to an intermediate potential between the first electrode 33A and the second electrode 33B. As illustrated in FIG. 11, this causes excess charges generated at a position away from the boundary portion between the first electrode 33A and the second electrode 33B of the photoelectric conversion layer 20 to be collected by the third electrode 24.

As described above, in the imaging element 10B according to the present embodiment, the third electrode 24 to which a voltage lower than that of the first electrode 33A and higher than that of the second electrode 33B is applied is provided on the photoelectric conversion layer 20, which causes excess charges generated at a position away from the boundary portion between the first electrode 33A and the second electrode 33B of the photoelectric conversion layer 20 to be collected by the third electrode 24. This makes it possible to improve moving speed of the charges generated in the photoelectric conversion layer 20 and improve optical response speed of the imaging element 10B in addition to the effects in the above-described first embodiment.

3. THIRD EMBODIMENT

Figure 12:
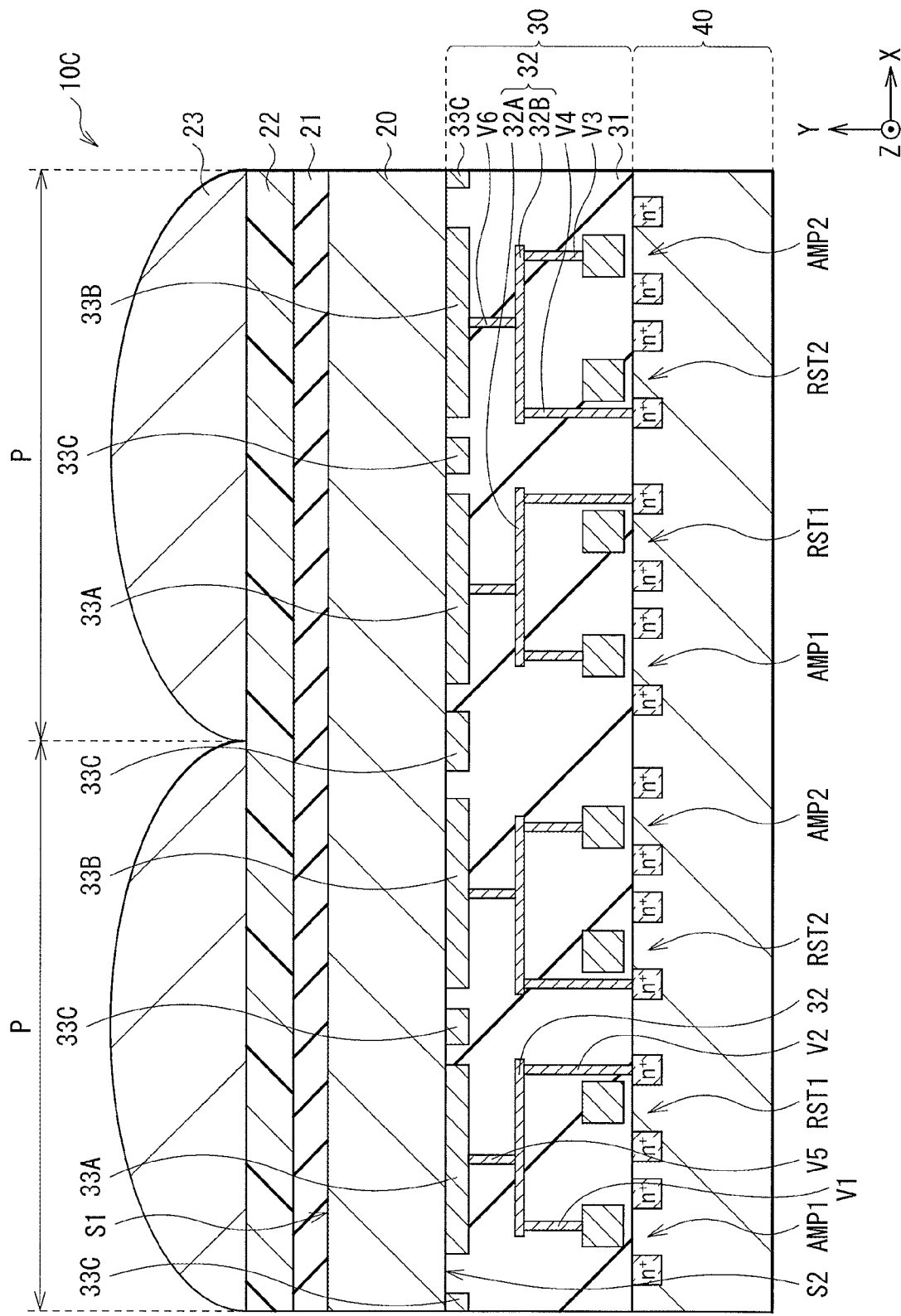
FIG. 12 is a cross-sectional view of a schematic configuration of an imaging element according to a third embodiment of the present disclosure.
Figure 13:
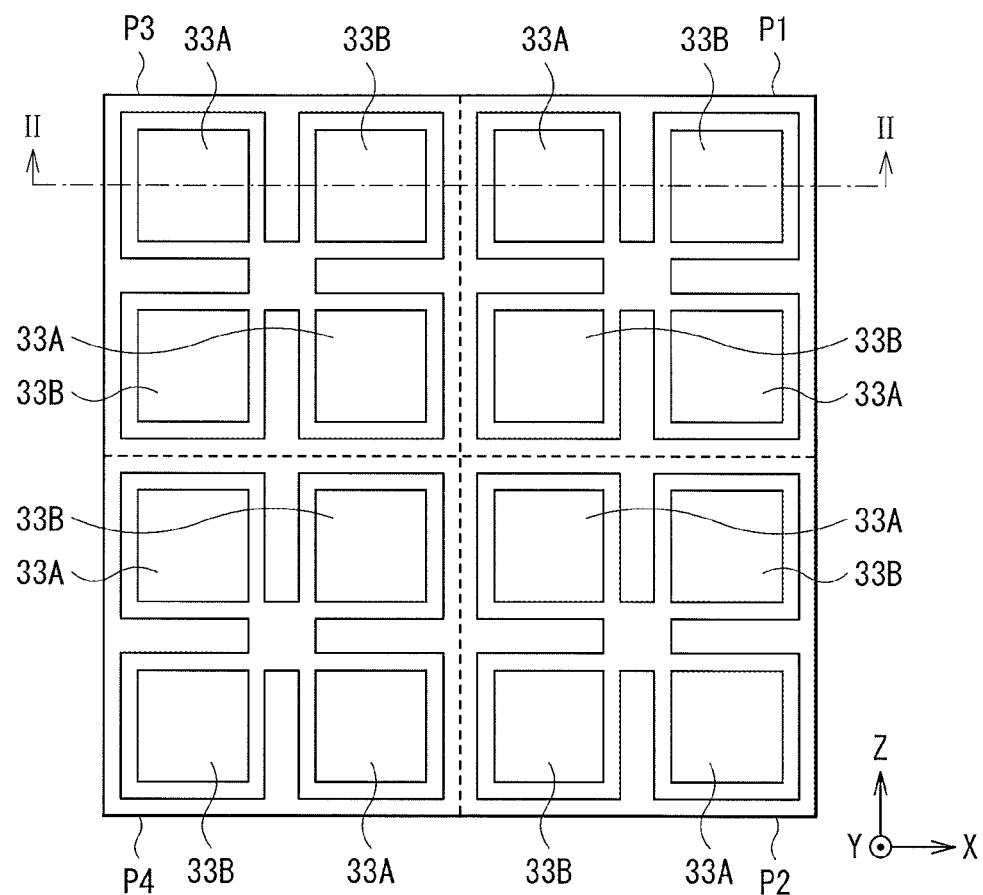
FIG. 13 is a schematic diagram illustrating a planar configuration in a case where a plurality of imaging elements illustrated in FIG. 12 is combined.

FIG. 12 illustrates a cross-sectional configuration of an imaging element 10C according to a third embodiment of the present disclosure. FIG. 13 schematically illustrates a planar configuration in a case where a plurality of imaging elements 10A is combined, and FIG. 12 illustrates a cross-sectional configuration taken along a line II-II illustrated in FIG. 13. As with the imaging element 10A and the like, the imaging element 10C configures one pixel (the unit pixel P) in an imaging apparatus (the imaging apparatus 1; see FIG. 45) such as a CMOS image sensor used in an electronic apparatus such as a digital still camera or a video camera, for example. The imaging element 10C according to the present embodiment differs from the imaging element 10A according to the above-described first embodiment in that a fourth electrode 33C is provided between the first electrode 33A and the second electrode 33B.

The fourth electrode 33C is provided between the first electrode 33A and the second electrode 33B inside the pixel P and between the pixels P. The fourth electrode 33C between the adjacent pixels P illustrated in FIG. 13 is continuously provided, for example. It is preferable that the fourth electrode 33C in the pixel P is not provided at the optical center X. As with the third electrode 24 in the second embodiment, for example, in a case where the first electrode 33A collects negative signal charges (electrons) and the second electrode 33B collects positive signal charges (holes), a voltage lower than the voltage applied to the first electrode 33A and higher than the voltage applied to the second electrode 33B is applied to the third electrode 24. That is, the fourth electrode 33C is set to, for example, an intermediate potential between the first electrode 33A and the second electrode 33B.

The fourth electrode 33C includes, for example, a conductive film having light transmittance, and includes, for example, ITO (indium tin oxide), similarly to the first electrode 33A and the second electrode 33B. However, other than ITO, a tin oxide ($SnO_2$) material to which a dopant is added or a zinc oxide material obtained by adding a dopant to aluminum zinc oxide (ZnO) may be used as the constituent materials of the first electrode 33A and the second electrode 33B. Examples of the zinc oxide material include aluminum zinc oxide (AZO) to which aluminum (Al) is added as a dopant, gallium zinc oxide (GZO) to which gallium (Ga) is added, and indium zinc oxide (IZO) to which indium (In) is added. In addition, CuI, $InSbO_4$, ZnMgO, $CuInO_2$, $MgIN_2O_4$, CdO, $ZnSnCO_3$, or the like may be used. The first electrode 33A and the second electrode 33B do not necessarily have light transmittance, and may use, for example, a metal film including aluminum (Al), tungsten (W), titanium (Ti), molybdenum (Mo), tantalum (Ta), copper (Cu), cobalt (Co), nickel (Ni), or the like, an alloy film thereof, or the metal film containing silicon or oxygen.

Figure 14:
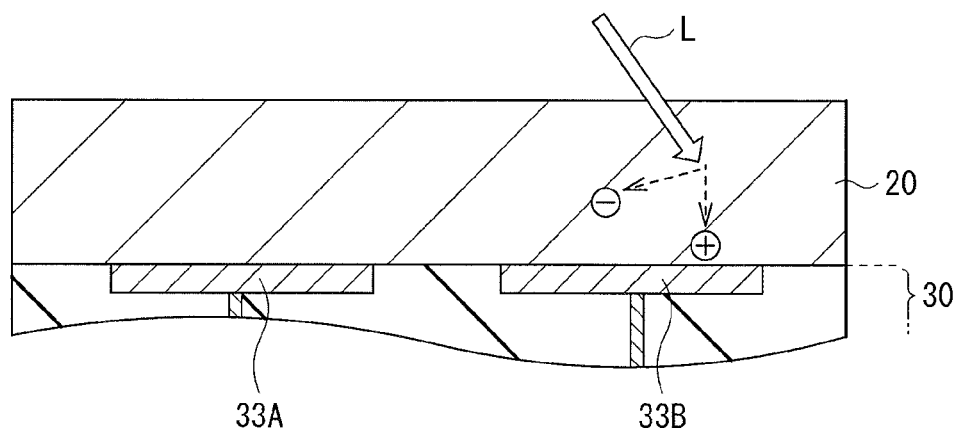
FIG. 14 is a schematic diagram for description of movement of charges in the imaging element illustrated in FIG. 1.
Figure 15:
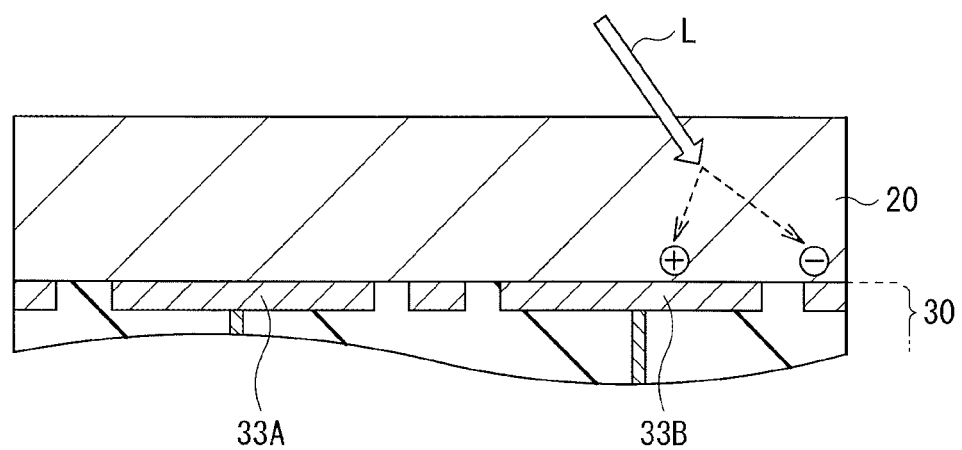
FIG. 15 is a schematic diagram for description of movement of charges in the imaging element illustrated in FIG. 12.

FIG. 14 schematically illustrates movement of charges in the imaging element 10A according to the first embodiment, and FIG. 15 schematically illustrates movement of charges in the imaging element 10C according to the present embodiment. For example, as illustrated in FIG. 2 and the like, the first electrode 33A and the second electrode 33B are divided into a plurality of portions in the pixel P and arranged alternately in a checkered manner, which increases intensity of the electric field formed in the photoelectric conversion layer 20. However, in such a configuration, coupling capacitance between the first electrode 33A and the second electrode 33B is increased. The potentials of the first electrode 33A and the second electrode 33 move in opposite directions by collection of the signal charges. For this reason, if the coupling capacitance between the first electrode 33A and the second electrode 33B is large, there is a possibility that charge-voltage conversion efficiency of the imaging element 10A is decreased to decrease sensitivity.

In contrast, in the imaging element 10C, the fourth electrode 33C is provided between the first electrode 33A and the second electrode 33B, and the potential of the fourth electrode 33C is set to an intermediate potential between the first electrode 33A and the second electrode 33B. As a result, the coupling capacitance between the first electrode 33A and the second electrode 33B is reduced while maintaining the electric field formed in the photoelectric conversion layer 20 by the first electrode 33A and the second electrode 33B.

As described above, in the imaging element 10C according to the present embodiment, the fourth electrode 33C to which a voltage lower than that of the first electrode 33A and higher than that of the second electrode 33B is applied is provided between the first electrode 33A and the second electrode 33B, which makes it possible to reduce the coupling capacitance between the first electrode 33A and the second electrode 33B and improve the charge-voltage conversion efficiency of the signal charge. This makes it possible to further improve sensitivity of the imaging element 10C in addition to the effects in the above-described first embodiment.

4. MODIFICATION EXAMPLE 1

Figure 16:
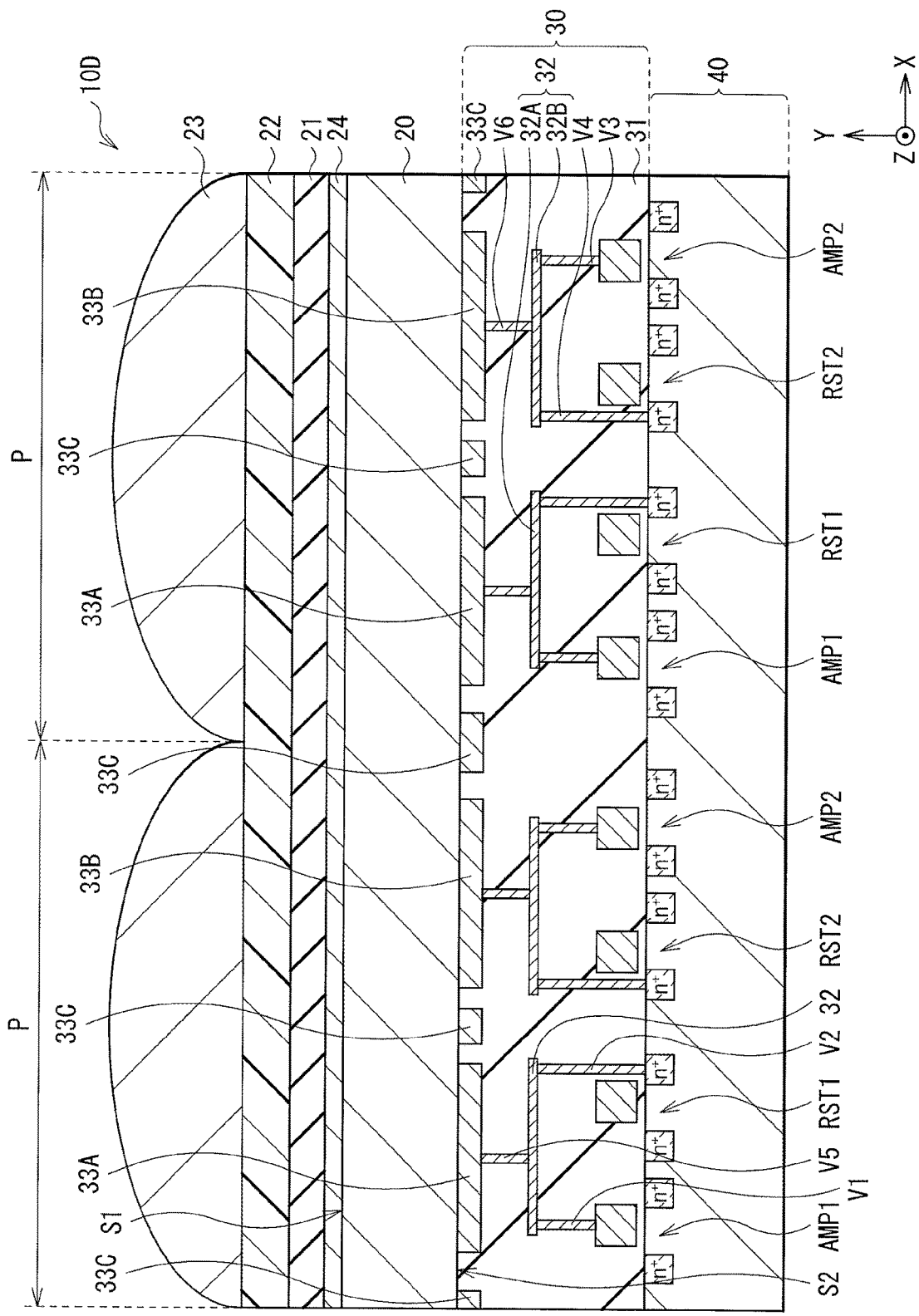
FIG. 16 is a cross-sectional view of a schematic configuration of an imaging element according to a first modification example of the present disclosure.

FIG. 16 illustrates a cross-sectional configuration of an imaging element (an imaging element 10D) according to a modification example (a modification example 1) of the present disclosure. The imaging element 10D is a combination of the imaging element 10B described in the second embodiment and the imaging dement 10C described in the third embodiment.

As with the present modification example, the third electrode 24 is provided on the photoelectric conversion layer 20 and the fourth electrode 33C is provided between the first electrode 33A and the second electrode 22B, which makes it possible for the imaging element 10D to improve optical response speed while further improving sensitivity in addition to the effects of the above-described first embodiment.

5. FOURTH EMBODIMENT

Figure 17:
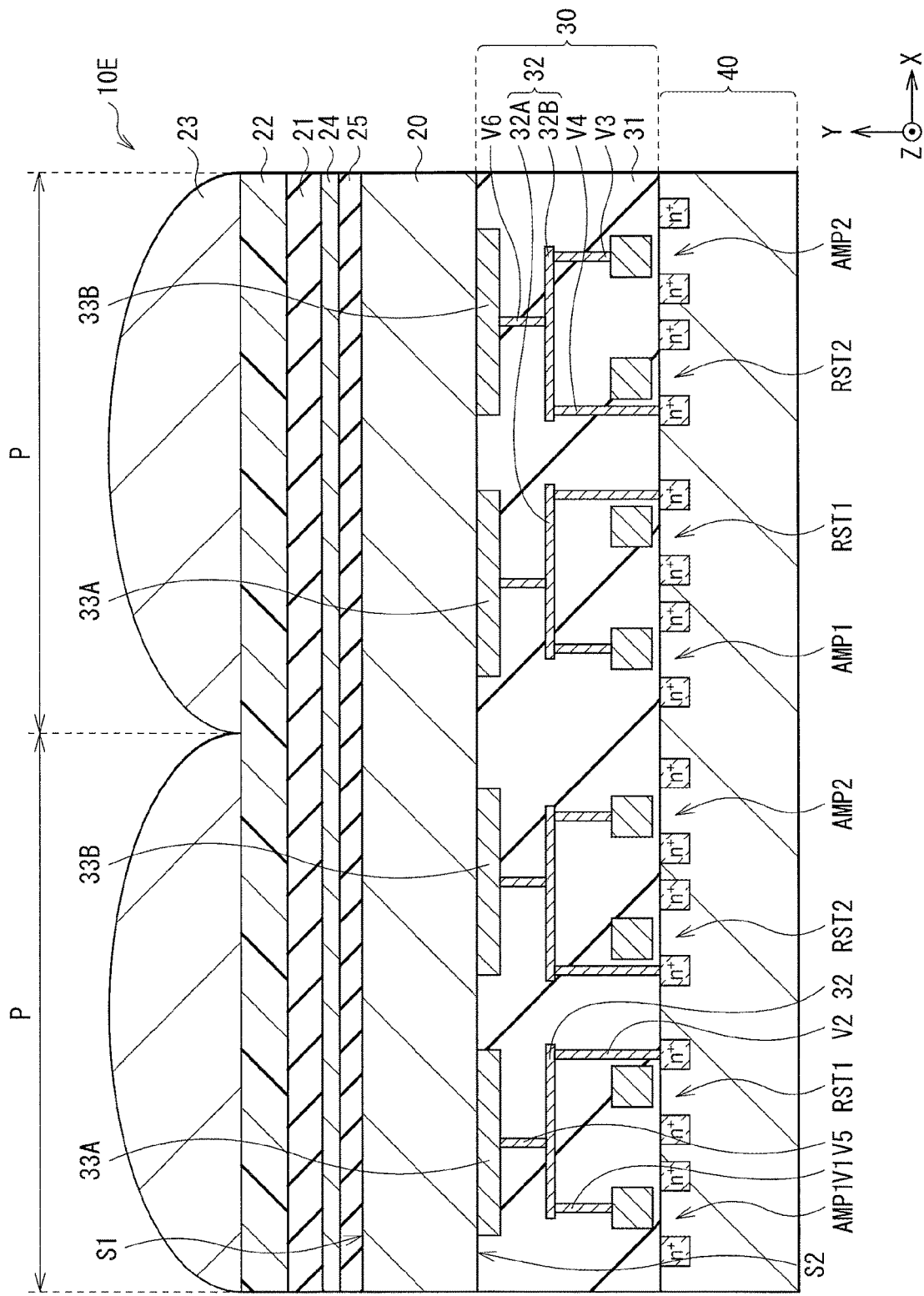
FIG. 17 is a cross-sectional view of a schematic configuration of an imaging element according to a fourth embodiment of the present disclosure.

FIG. 17 illustrates a cross-sectional configuration of an imaging element (an imaging element 10E) according to a fourth embodiment of the present disclosure. As with the imaging element 10A and the like, the imaging element 10E configures one pixel (the unit pixel P) in an imaging apparatus (the imaging apparatus 1; see FIG. 45) such as a CMOS image sensor used in an electronic apparatus such as a digital still camera or a video camera, for example. The imaging element 10E according to the present embodiment differs from the imaging element 10B according to the above-described second embodiment in that an insulating layer 25 is provided between the photoelectric conversion layer 20 and the third electrode 24. As with the second embodiment, the third electrode 24 is set to, for example, an intermediate potential between the first electrode 33A and the second electrode 33B.

As with the insulating layer 21, the insulating layer 25 includes, for example, a single-layer film including one kind of silicon oxide, silicon nitride, silicon oxynitride (SiON) and the like, or a laminated film including two or more kinds thereof. A thickness of the insulating layer 25 is, for example, from 3 nm to 500 nm.

Figure 18:
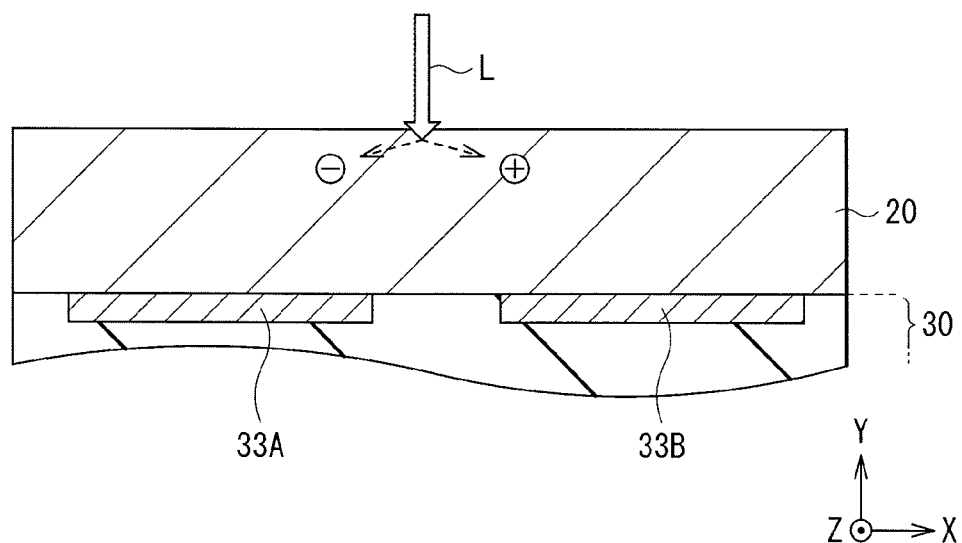
FIG. 18 is a schematic diagram for description of movement of charges in the imaging element illustrated in FIG. 1.
Figure 19:
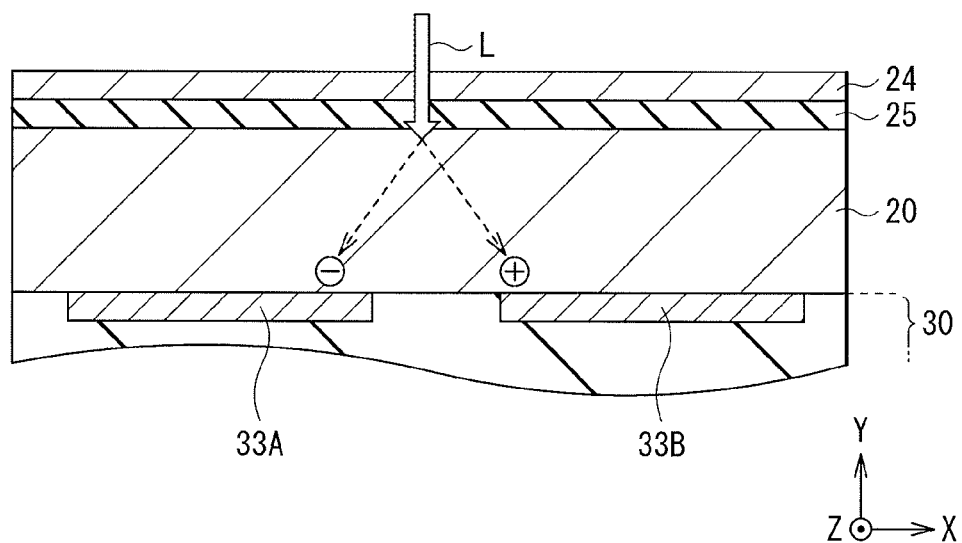
FIG. 19 is a schematic diagram for description of movement of charges in the imaging element illustrated in FIG. 17.

FIG. 18 schematically illustrates movement of charges in the imaging element 10A according to the first embodiment, and FIG. 19 schematically illustrates movement of charges in the imaging element 10E according to the present embodiment. In the imaging element 10A, while an electric field in a horizontal direction (an X-axis direction) of the photoelectric conversion layer 20 is strongly formed by the first electrode 33A and the second electrode 33B, an electric field in a vertical direction (a Y-axis direction) of the photoelectric conversion layer 20 is weak. Accordingly, as illustrated in FIG. 18, in a case where incident light L is photoelectrically converted in an upper portion of the photoelectric conversion layer 20, it takes time for electrons and holes generated in the portion to reach the first electrode 33A and the second electrode 33B.

In contrast, in the imaging element 10E, the third electrode 24 is provided above the photoelectric conversion layer 20 with the insulating layer 25 interposed therebetween, and the potential of the third electrode 24 is set to an intermediate potential between the first electrode 33A and the second electrode 33B. As a result, an electric field in the vertical direction is formed each between the first electrode 33A and the third electrode 24 and between the second electrode 33B and the third electrode 24. As illustrated in FIG. 19, the charges generated in the upper portion of the photoelectric conversion layer 20 are drifted by the electric field in the vertical direction, and the time it takes for the charges to reach the first electrode 33A and the second electrode 33B is shortened.

As described above, in the imaging element 10E according to the present embodiment, the third electrode 24 to which a voltage lower than that of the first electrode 33A and higher than that of the second electrode 33B is applied is provided on the photoelectric conversion layer 20 with the insulating layer 25 interposed therebetween. As a result, an electric field in the vertical direction is formed each between the first electrode 33A and the third electrode 24 and between the second electrode 33B and the third electrode 24 for the charges generated in the upper portion of the photoelectric conversion layer 20, which makes it possible shorten the time it takes for the charges generated in the upper portion of the photoelectric conversion layer 20 to roach the first electrode 33A and the second electrode 33B. This makes it possible to improve moving speed of the charges generated in the photoelectric conversion layer 20 and improve optical response speed of the imaging element 10E in addition to the effects in the above-described first embodiment,

6. FIFTH EMBODIMENT

Figure 20:
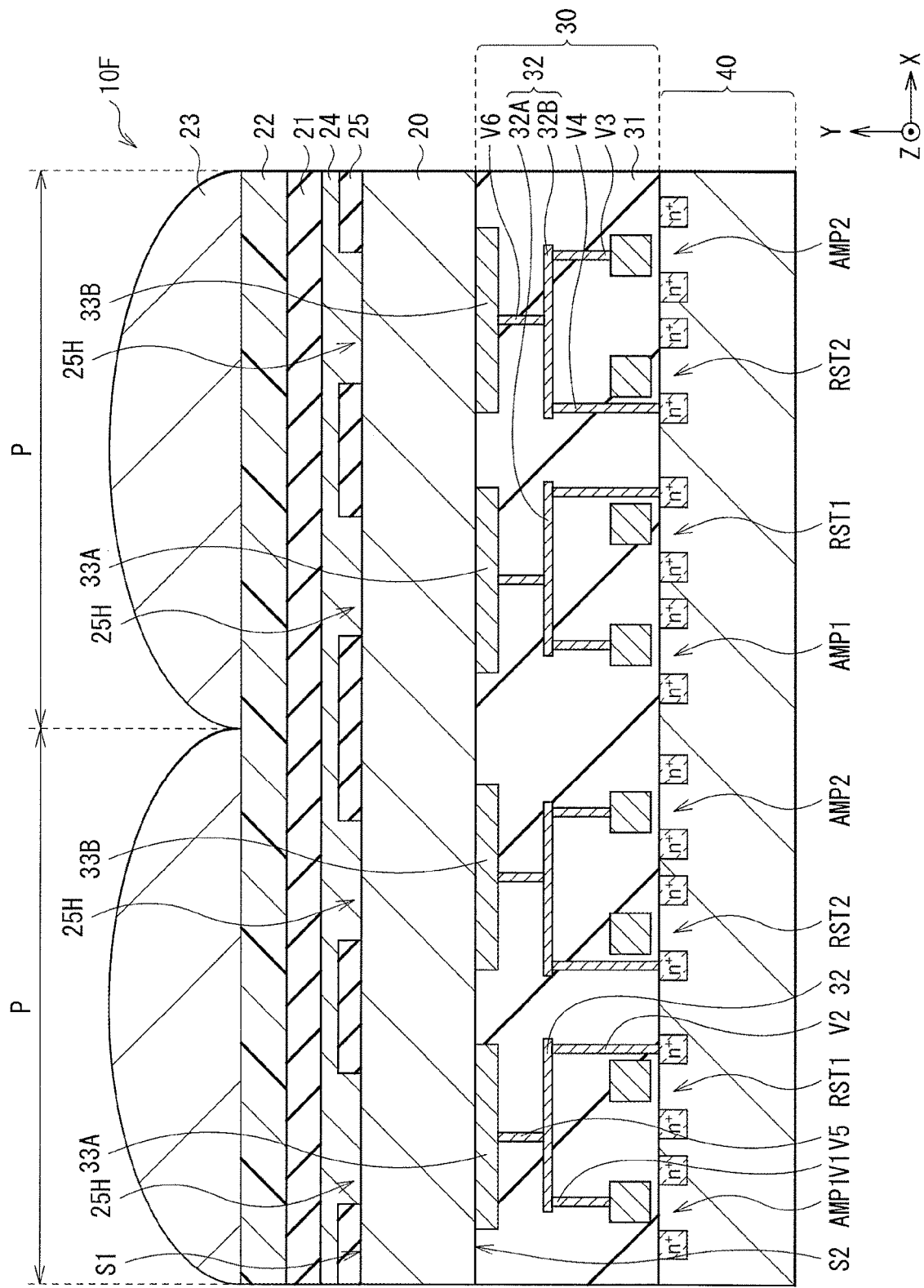
FIG. 20 is a cross-sectional view of a schematic configuration of an imaging element according to a fifth embodiment of the present disclosure.

FIG. 20 illustrates a cross-sectional configuration of an imaging element (an imaging element 10F) according to a fifth embodiment of the present disclosure. As with the imaging element 10A and the like, the imaging element 10F configures one pixel (the unit pixel P) in an imaging apparatus (the imaging apparatus 1; see FIG. 45) such as a CMOS image sensor used in an electronic apparatus such as a digital still camera or a video camera, for example. The imaging element 10F according to the present embodiment is different from the imaging element 10E according to the above-described fourth embodiment in that an opening 25H is provided at a position, corresponding to the first electrode 33A and the second electrode 33B, of the insulating layer 25 between the photoelectric conversion layer 20 and the third electrode 24. It is to be noted that the third electrode 24 is set to, for example, an intermediate potential between the first electrode 33A and the second electrode 33B, as with the second embodiment and the like.

Figure 21:
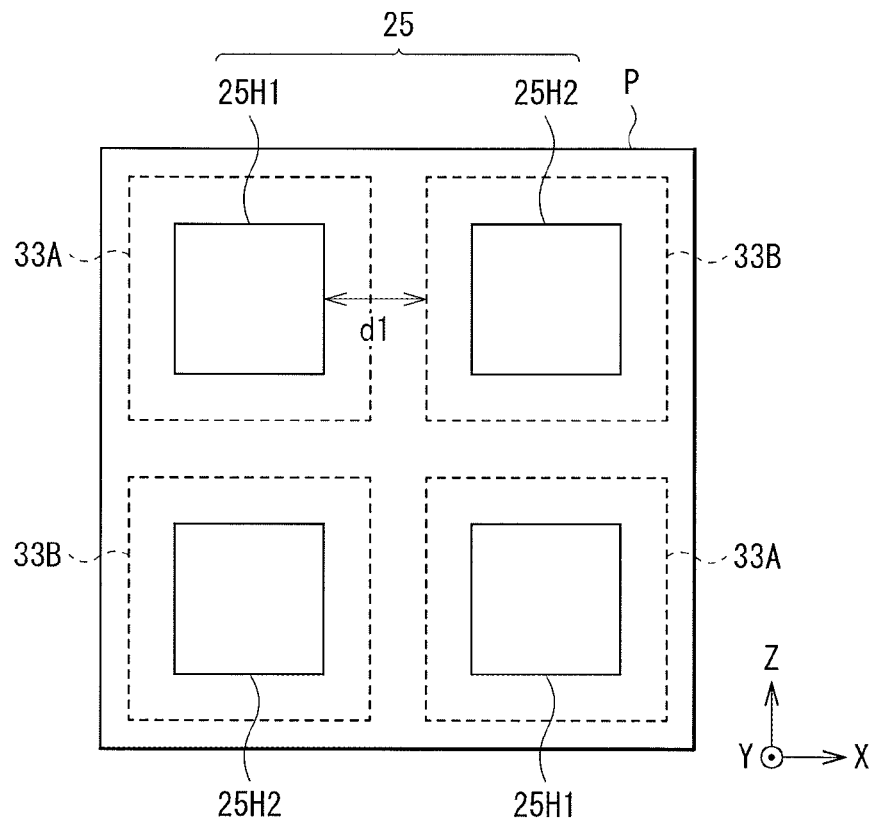
FIG. 21 is a schematic plan view of a positional relationship between a first electrode and a second electrode and openings in the imaging element illustrated in FIG. 20.
Figure 22:
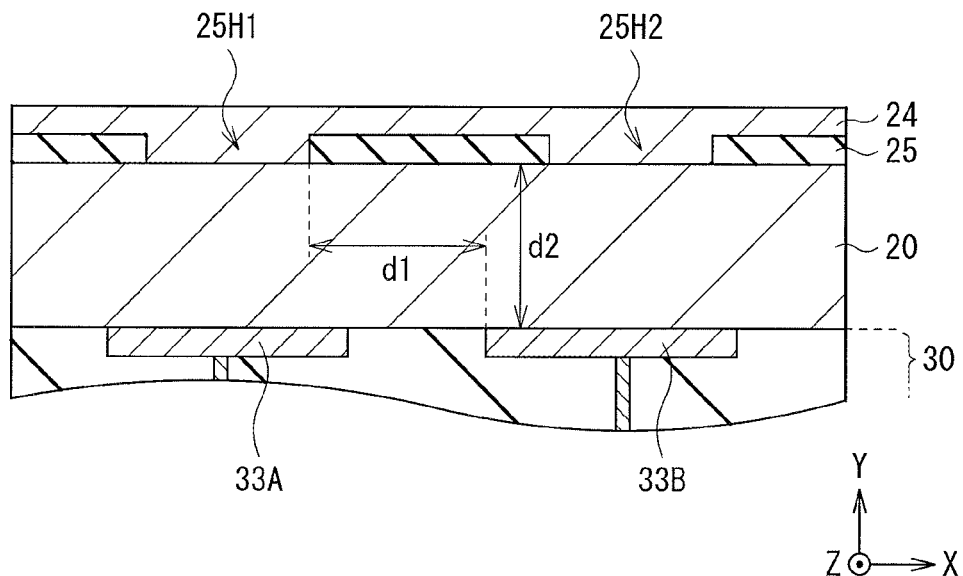
FIG. 22 is a schematic cross-sectional view of a positional relationship between the first electrode and the second electrode and the openings in the imaging element illustrated in FIG. 20.

FIG. 21 is a schematic plan view of a positional relationship between both the first electrode 33A and the second electrode 33B, and the opening 25H. FIG. 22 is a step surface diagram view schematically illustrating the positional relationship between both the first electrode 33A and the second electrode 33B and the opening 25H. The opening 25H is provided at a position opposed to each of the first electrode 33A and the second electrode 33B. As an opening area as a size of the opening 25H is smaller, the charges discharged from the third electrode 24 is reduced more, and more charges generated in the photoelectric conversion layer 20 are used as the signal charges, thereby improving sensitivity. Therefore, the size of the opening 25H is preferably minimized, and that the opening 25H is desirably provided inside an arrangement region of the first electrode 33A and the second electrode 33B. Specifically, in a plan view, for example, d1 desirably has a value equal to or higher than d2, where the shortest distance from an end surface of an opening 25H1 provided on the first electrode 33A to an end surface of the second electrode 33B is d1, and the thickness of the photoelectric conversion layer 20 in the Y-axis direction is d2.

Figure 23:
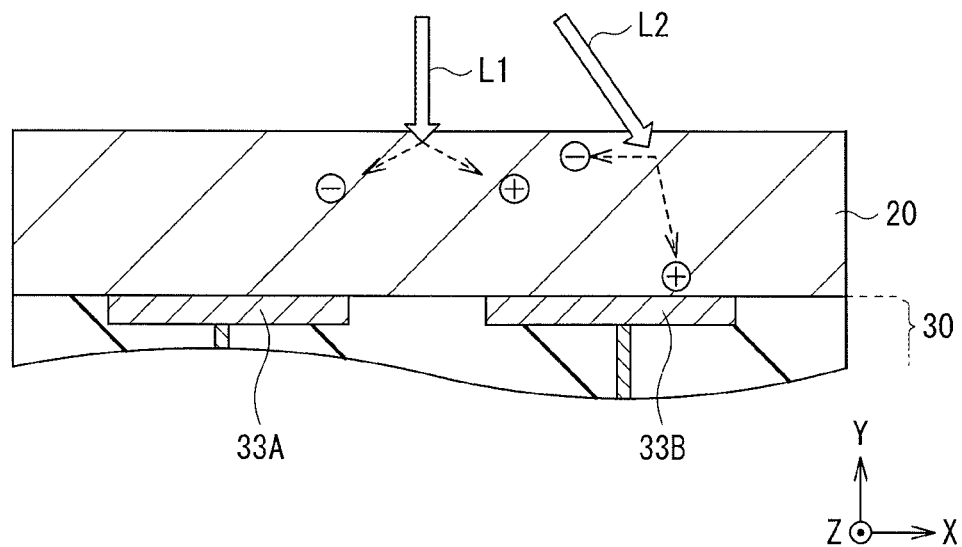
FIG. 23 is a schematic diagram for description of movement of charges in the imaging element illustrated in FIG. 1.
Figure 24:
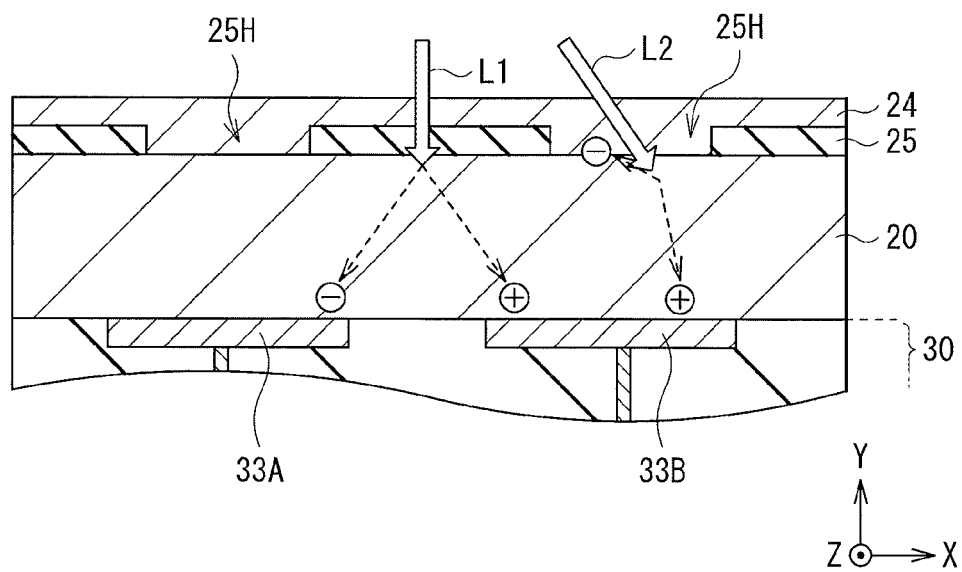
FIG. 24 is a schematic diagram for description of movement of charges in the imaging element illustrated in FIG. 20.

FIG. 23 schematically illustrates movement of charges in the imaging element 10A according to the first embodiment, and FIG. 24 schematically illustrates movement of charges in the imaging element 10F according to the present embodiment. In the imaging element 10A, in a case where the incident light L1 is photoelectrically converted in the upper portion of the photoelectric conversion layer 20, it takes time for electrons and holes generated in the portion to reach the first electrode 33A and the second electrode 33B, as illustrated in FIG. 23. Moreover, of charges generated by, for example, absorption of light L2 incident on the second electrode 33B at a position away from the boundary portion between the first electrode 33A and the second electrode 33B, holes are rapidly movable to the second electrode 33B, but it takes time for electrons to reach the first electrode 33A, as illustrated in FIG. 23.

In contrast, in the imaging element 10F, as illustrated in FIG. 24, the charges generated in the upper portion of the photoelectric conversion layer 20 are drifted by the electric field in the vertical direction formed between the first electrode 33A and the third electrode 24 and between the second electrode 33B and the third electrode 24, and the time it takes for the charges to reach the first electrode 33A and the second electrode 33B is shortened. In addition, of the charges generated by, for example, absorption of the light L2 incident on the second electrode 33B at a position away from the boundary portion between the first electrode 33A and the second electrode 33B, holes are drifted by the electric field in the vertical direction formed between the second electrode 33B and the third electrode 24, and quickly collected in the second electrode 33B, and electrons are collected in the third electrode 24 through the opening 25H, as illustrated in FIG. 24.

As described above, in the imaging element 10F according to the present embodiment, the openings 25H1 and 25H2 are respectively provided at positions, opposed to the first electrode 33A and the second electrode 33B, of the insulating layer between the photoelectric conversion layer 20 and the third electrode 24. As a result, transfer speed of charges generated in the photoelectric conversion layer 20 is further improved. This makes it possible to further improve optical response speed while suppressing a decrease in sensitivity of the imaging element 10F more than the imaging elements 10B to 10E according to the above-described second to fourth embodiments and the modified example 1, in addition to the effects in the above-described first embodiment.

7. SIXTH EMBODIMENT

Figure 25:
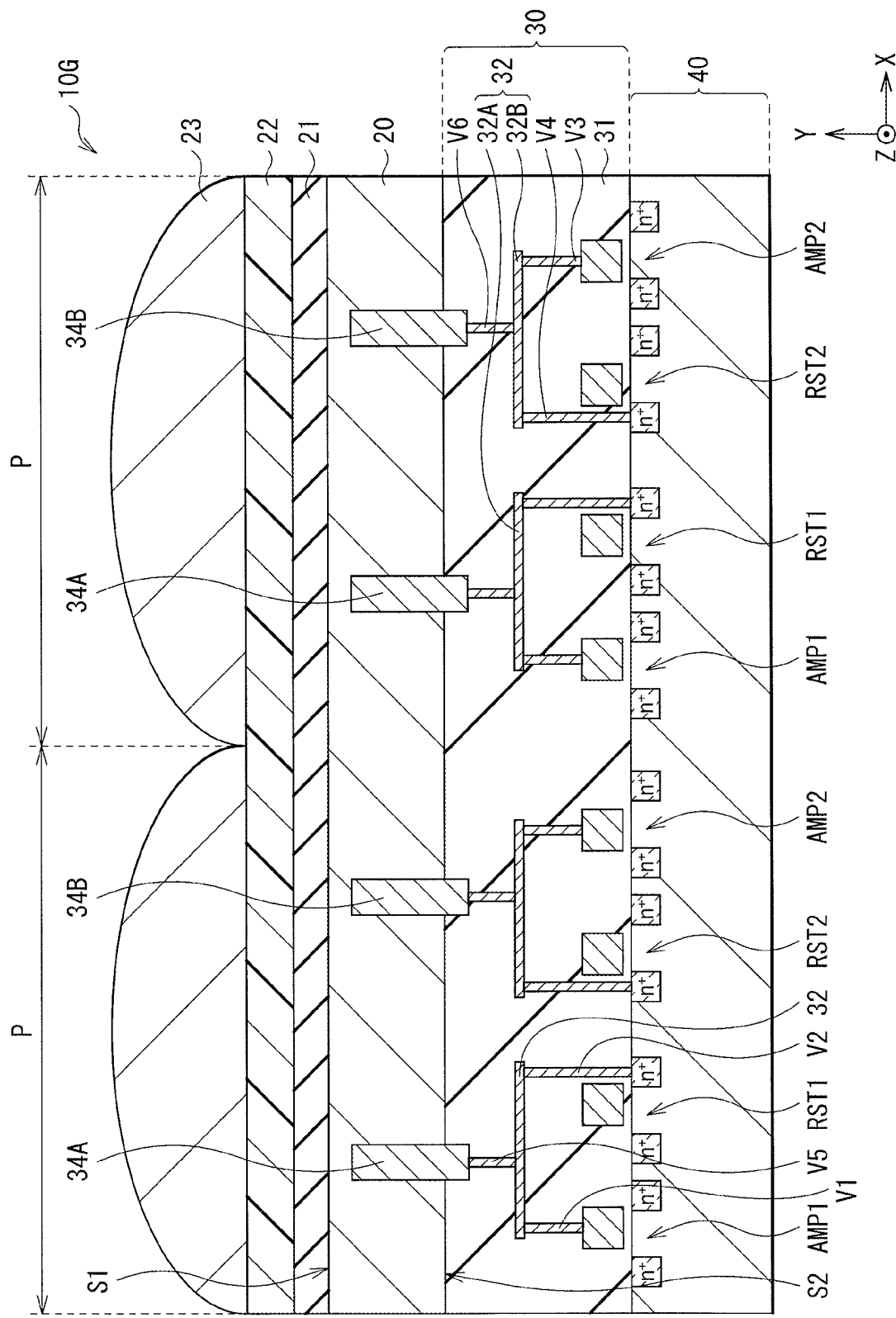
FIG. 25 is a cross-sectional view of an example of a schematic configuration of an imaging element according to a sixth embodiment of the present disclosure.
Figure 26:
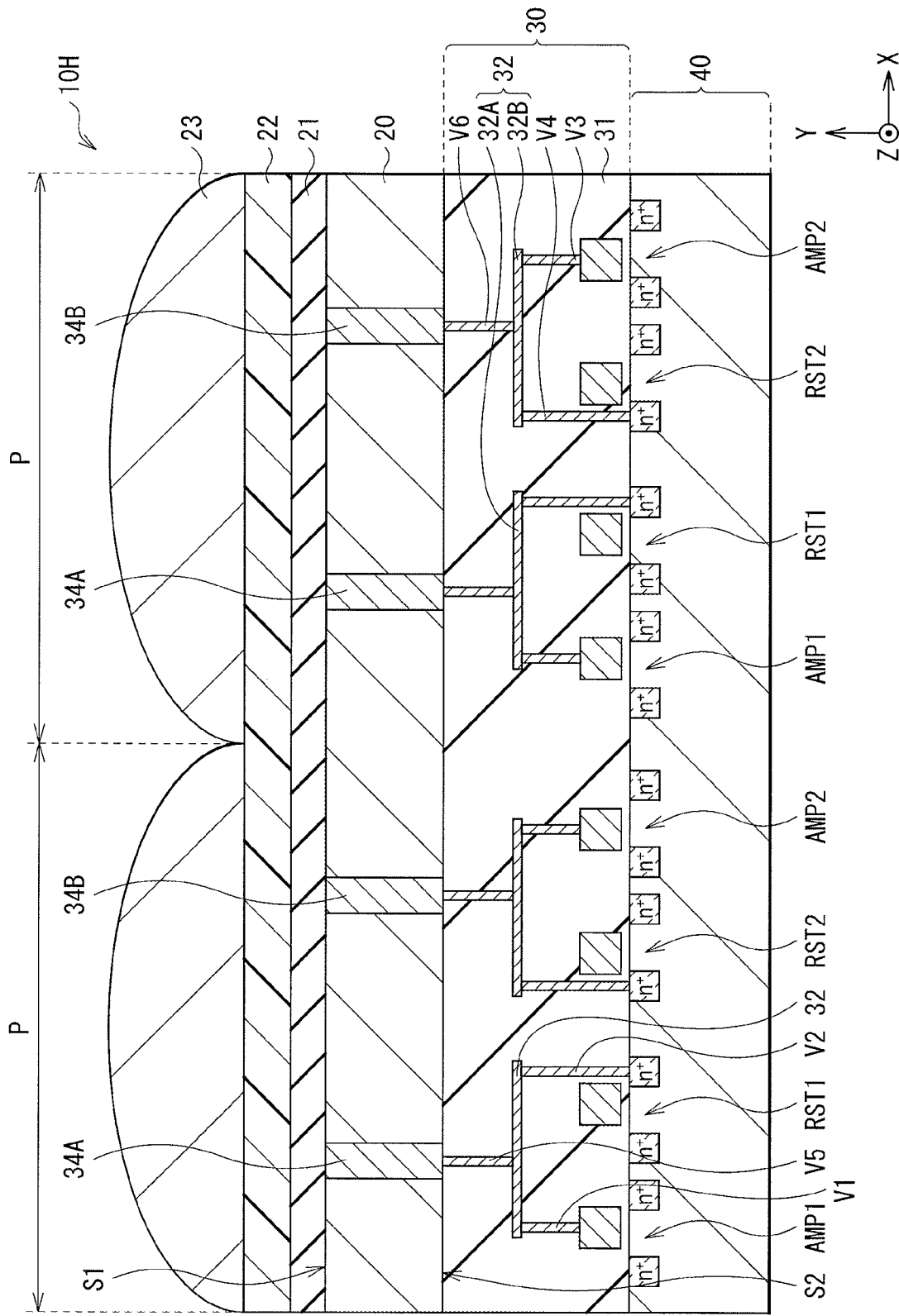
FIG. 26 is a cross-sectional view of another example of the schematic configuration of the imaging element according to the sixth embodiment of the present disclosure.
Figure 27:
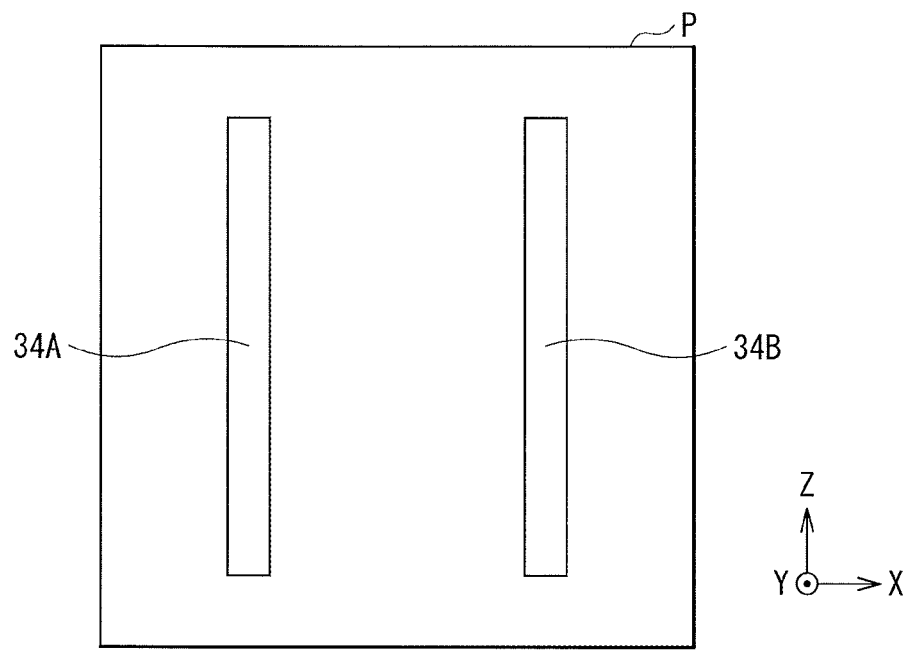
FIG. 27 is a schematic diagram illustrating planar configurations of a first electrode and a second electrode of the imaging element illustrated in FIG. 26.

FIG. 25 illustrates an example of a cross-sectional configuration of an imaging element (an imaging element 10G) according to a sixth embodiment of the present disclosure. FIG. 26 illustrates another example of the cross-sectional configuration of an imaging element (an imaging element 10H) according to the sixth embodiment of the present disclosure. FIG. 27 schematically illustrates a planar configuration of the imaging element 10G, for example. The imaging elements 10G and 10H each configure one pixel (the unit pixel P) in an imaging apparatus (the imaging apparatus 1; see FIG. 45) such as a CMOS image sensor used in an electronic apparatus such as a digital still camera or a video camera, for example, as with the imaging element 10A or the like. The imaging elements 10G and 10H according to the present embodiment are different from the above-described first embodiment and the like in that a first electrode 34A and a second electrode 34B have a wall shape provided upright in a stacking direction (the Y-axis direction) of respective members, and a portion (the imaging element 10G) or the entirety (the imaging element 10H) of each of the first electrode 34A and the second electrode 34B is embedded in the photoelectric conversion layer 20.

The first electrode 34A and the second electrode 34B of the present embodiment are provided upright in the stacking direction (the Y-axis direction) of the respective layers configuring the imaging elements 10G and 10H, for example, as illustrated in FIGS. 25 and 26, and have a shape extending in the Z-axis direction, for example, as illustrated in FIG. 27. The first electrode 34A and the second electrode 34B in the pixel P are embedded in the photoelectric conversion layer 20 to be opposed to each other in the horizontal direction (the X-axis direction). Moreover, the first electrode 34A and the second electrode 34B even between the pixels P are disposed to be opposed to each other in the horizontal direction (the X-axis direction). With such a configuration, in the imaging elements 10G and 10H, an electric field in the horizontal direction (the X-axis direction) in the photoelectric conversion layer 20 is enhanced.

A portion of each of the first electrode 34A and the second electrode 34B may be embedded in the photoelectric conversion layer 20 as illustrated in FIG. 25, or the entirety thereof may be embedded in the photoelectric conversion layer 20 as illustrated in FIG. 26. Moreover, FIG. 25 illustrates an example in which upper ends of the first electrode 34A and the second electrode 34B are present inside the photoelectric conversion layer 20, but the configuration is not limited to this, and as illustrated in FIG. 26, the upper ends of the first electrode 34A and the second electrode 34B may reach an upper surface of the photoelectric conversion layer 20.

It is possible to form the first electrode 34A and the second electrode 34B using the same materials as those of the first electrode 33A and the second electrode 33B of the above-described first embodiment and the like. Specifically, the first electrode 34A and the second electrode 34B include, for example, a conductive film having light transmittance, and include, for example, ITO (indium tin oxide). However, other than ITO, a tin oxide ($SnO_2$) material to which a dopant is added or a zinc oxide material obtained by adding a dopant to aluminum zinc oxide (ZnO) may be used as the constituent materials of the first electrode 33A and the second electrode 33B. Examples of the zinc oxide material include aluminum zinc oxide (AZO) to which aluminum (Al) is added as a dopant, gallium zinc oxide (GZO) to which gallium (Ga) is added, and indium zinc oxide (IZO) to which indium (In) is added. In addition, CuI, $InSbO_4$, ZnMgO, $CuInO_2$, $MgIN_2O_4$, CdO, $ZnSnO_3$, or the like may be used. The first electrode 34A and the second electrode 34B do not necessarily have light transmittance, and may use, for example, a metal film including aluminum (Al), tungsten (W), titanium (Ti), molybdenum (Mo), tantalum (Ta), copper (Cu), cobalt (Co), nickel (Ni), or the like, an alloy film thereof, or the metal film containing silicon or oxygen.

Figure 28:
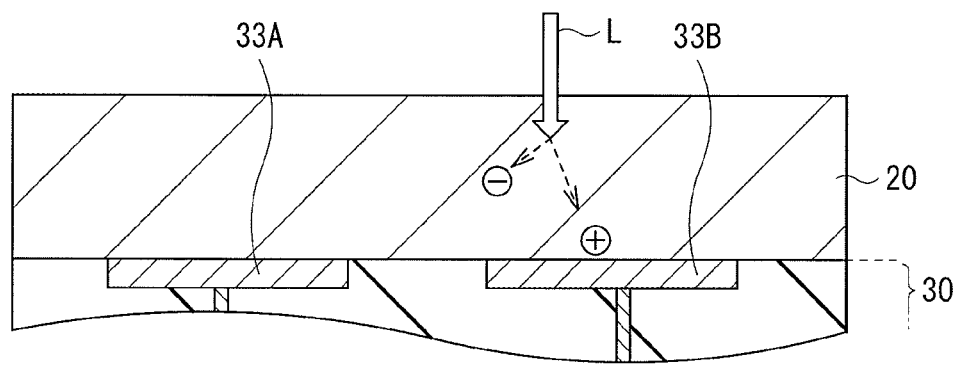
FIG. 28 is a schematic diagram for description of movement of charges in the imaging element illustrated in FIG. 1.
Figure 29:
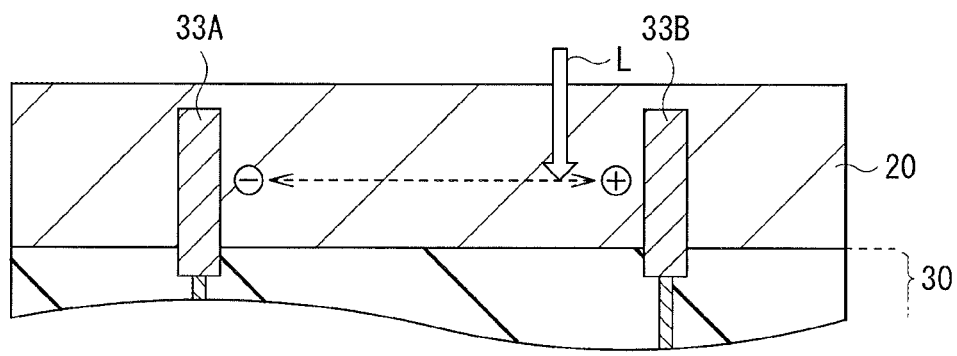
FIG. 29 is a schematic diagram for description of movement of charges in the imaging element illustrated in FIG. 26.

FIG. 28 schematically illustrates movement of charges in the imaging element 10A according to the first embodiment, and FIG. 29 schematically illustrates movement of charges in the imaging element 10G according to the present embodiment. In the imaging element 10A, as illustrated in FIG. 28, of charges generated at a position away from the boundary portion between the first electrode 33A and the second electrode 33B, for example, above the second electrode 33B, holes are quickly movable to the second electrode 33B, but it takes time for electrons to reach the first electrode 33A.

In contrast, in the imaging element 10G, as described above, the first electrode 34A and the second electrode 34B are disposed to be opposed to each other in the horizontal direction (the X-axis direction) in the photoelectric conversion layer 20, which enhance the electric field in the horizontal direction (the X-axis direction) in the photoelectric conversion layer 20. As a result, as illustrated in FIG. 29, the time it takes charges generated at a position away from the boundary between the first electrode 34A and the second electrode 34B (here, at a position closer to the second electrode 34B) to arrive at each electrode is shortened. The same applies to the imaging element 10H.

As described above, in the imaging elements 10G and 10H according to the present embodiment, the wall-shaped first electrode 34A and the wall-shaped second electrode 34B are provided upright in the stacking direction (the Y-axis direction) of the respective members, and a portion or the entirety of each of the first electrode 34A and the second electrode 34B is embedded in the photoelectric conversion layer 20. As a result, the electric field in the horizontal direction (the X-axis direction) in the photoelectric conversion layer 20 is enhanced, and moving speed of charges generated in the photoelectric conversion layer 20 is improved. This makes it possible to improve optical response speed in addition to the effects of the above-described first embodiment

8. SEVENTH EMBODIMENT

Figure 30:
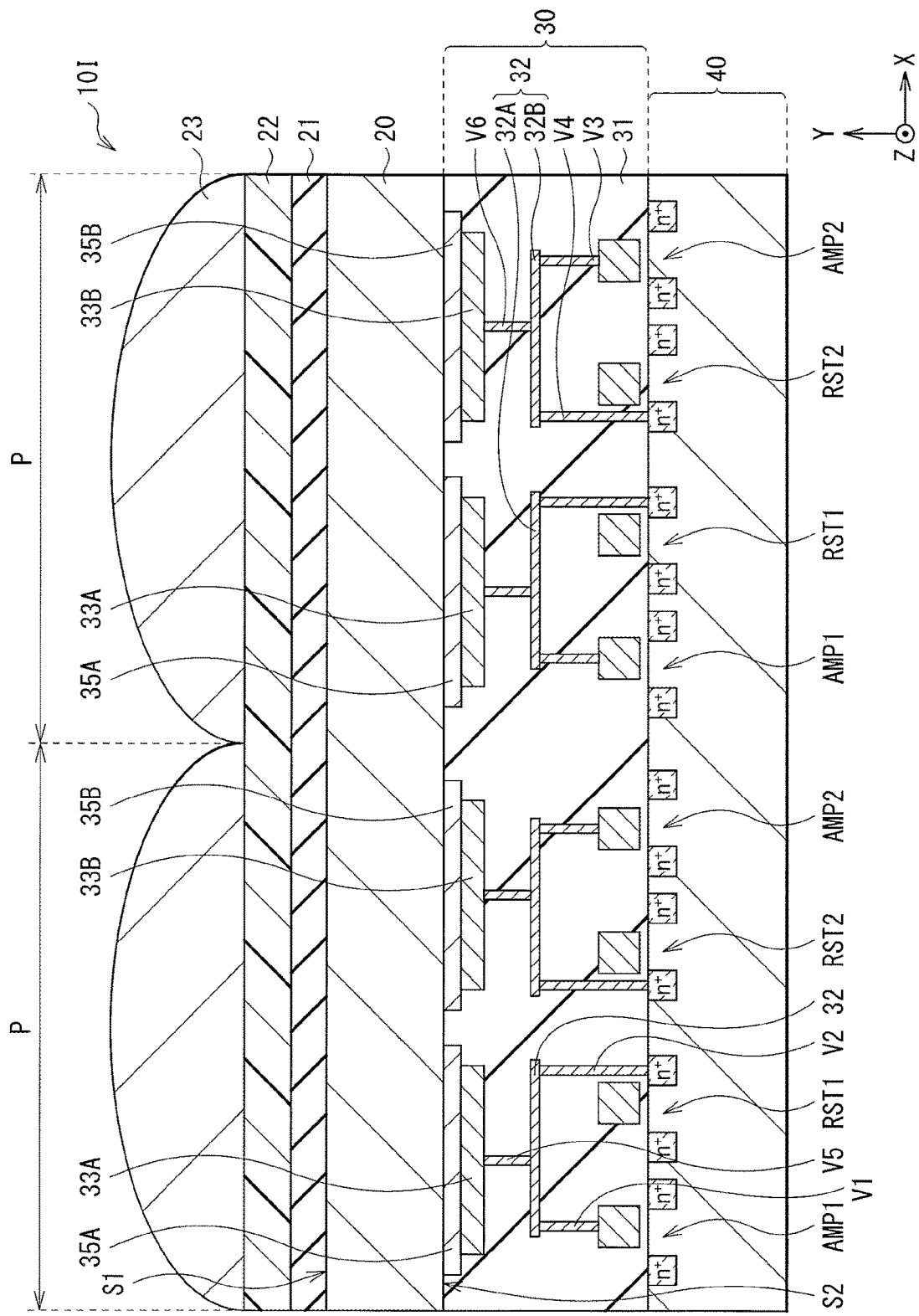
FIG. 30 is a cross-sectional view of a schematic configuration of an imaging element according to a seventh embodiment of the present disclosure.

FIG. 30 illustrates a cross-sectional configuration of an imagine element (an imaging element 10I) according to a seventh embodiment of the present disclosure. As with the imaging element 10A and the like, the imaging element 10I configures one pixel (the unit pixel P) in an imaging apparatus (the imaging apparatus 1; see FIG. 45) such as a CMOS image sensor used in an electronic apparatus such as a digital still camera or a video camera, for example. The imaging element 10I according to the present embodiment is different from the first embodiment and the like in that a barrier layer 35A and a barrier layer 35B are respectively provided between the first electrode 33A and the photoelectric conversion layer 20 and between the second electrode 33B and the photoelectric conversion layer 20.

The barrier layer 35A and the barrier layer 35B prevent injection of holes or electrons from each of the first electrode 33A and the second electrode 33B to the photoelectric conversion layer 20. Each of the barrier layer 35A and the barrier layer 35B includes a material serving as an injection barrier between the first electrode 33A and the photoelectric conversion layer 20 and between the second electrode 33B and the photoelectric conversion layer 20. Examples of the material of the barrier layer 35A include an organic semiconductor material and an oxide semiconductor material both having a high work function. Specific examples of the organic semiconductor material include a heterocyclic compound containing a nitrogen atom, an oxygen atom, a sulfur atom, and an organic molecule, an organic metal complex, or a subphthalocyanine derivative having, as a part of a molecular skeleton, for example, pyridine, pyrazine, pyrimidine, triazine, quinoline, quinoxaline, isoquinoline, acridine, phenazine, phenanthroline, telrazole, pyrazole, imidazole, thiazole, oxazole, imidazole, benzimidazole, benzotriazole, benzoxazole, benzoxazole, carbazole, benzofuran, dibenzofuran, and the like. Examples of the material of the barrier layer 35B include an organic semiconductor material and an oxide semiconductor material both having a shallow work function. Specific examples of the organic semiconductor material include a naphthalene derivative, an anthracene derivative, a phenanthrene derivative, a pyrene derivative, a perylene derivative, a tetracene derivative, a pentacene derivative, a quinacridone derivative, a perylene derivative, a picene derivative, a chrysene derivative, a fluoramhene derivative, a phthalocyanine derivative, a subphlhalocyanine derivative, a metal complex having a heterocyclic compound as a ligand, and the like.

Figure 31:
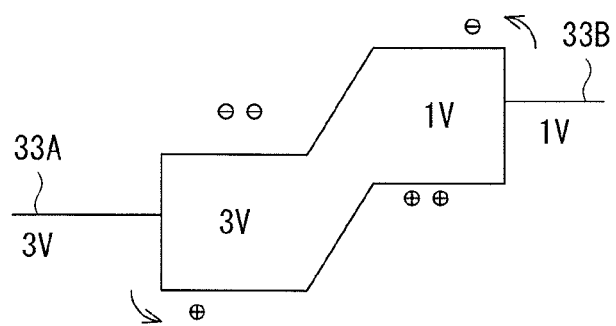
FIG. 31 is a diagram illustrating an energy level in the imaging element illustrated in FIG. 1.
Figure 32:
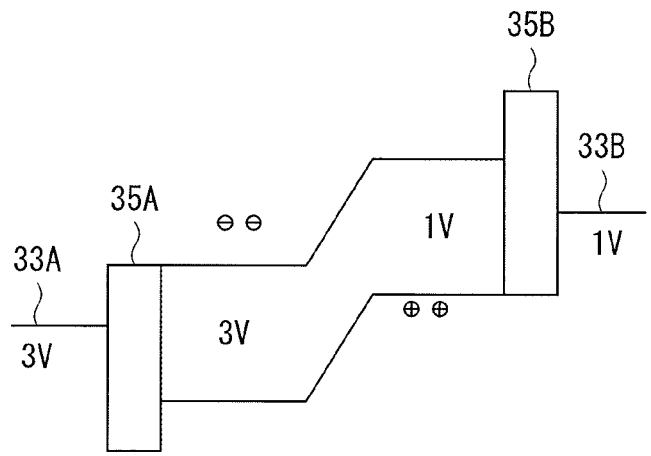
FIG. 32 is a diagram illustrating an energy level in the imaging element illustrated in FIG. 30.

FIG. 31 illustrates an energy level in the imaging element 10A, and FIG. 32 illustrates an energy level in the imaging element 10I. In the imaging element 10A, electrons and holes generated in the photoelectric conversion layer 20 are collected in the first electrode 33A to which a voltage of 3 V is applied, and the second electrode 33B to which a voltage of 1 V is applied, for example. Here, in a case where an energy difference between valence band levels (HOMO levels in a case of an organic semiconductor) of the first electrode 33A and the photoelectric conversion layer 20, or an energy difference between conduction band levels (LUMO levels in a case of an organic semiconductor) of the second electrode 33B and the photoelectric conversion layer 20 is small, charge is injected from the electrode into the photoelectric converter. Charges injected from the first electrode 33A and the second electrode 33B to the photoelectric conversion layer 20 become noise, which causes deterioration in image quality.

In contrast, in the imaging element 10I, as illustrated in FIG. 32, the barrier layer 35A having a valence band level (a HOMO level in a case of an organic semiconductor) lower than that of the photoelectric converter and the barrier layer 35B having a conduction band level (a LUMO level in a case of an organic semiconductor) higher than that of the photoelectric converter are respectively provided between the first electrode 33A and the photoelectric conversion layer 20 and between the second electrode 33B and the photoelectric conversion layer 20. As a result, injection of charges from the first electrode 33A and the second electrode 33B into the photoelectric conversion layer 20 is reduced, and mixing of noise into signal charges is reduced.

It is to be noted that injection of charges from the first electrode 33A and the second electrode 33B into the photoelectric conversion layer 20 depends on work functions of the first electrode 33A and the second electrode 33B, and energy levels of a conduction band and a valence band of the material included in the photoelectric conversion layer 20. In addition, in the present embodiment, an example in which the barrier layer 35A and the barrier layer 35B are respectively provided between the first electrode 33A and the photoelectric conversion layer 20 and between the second electrode 33B and the photoelectric conversion layer 20 is illustrated; however, only one of the barrier layer 35A and the barrier layer 35B may be formed.

As described above, in the imaging element 10I according to the present embodiment, the barrier layer 35A and the barrier layer 35B are respectively provided between the first electrode 33A and the second electrode 33B and the photoelectric conversion layer 20, which reduces injection of charges from the first electrode 33A and the second electrode 33B to the photoelectric conversion layer 20, and reduces mixing of noises into signal charges. This makes it possible to improve the image quality of the imaging element 10I in addition to the effect of the first embodiment.

9. EIGHTH EMBODIMENT

Figure 33:
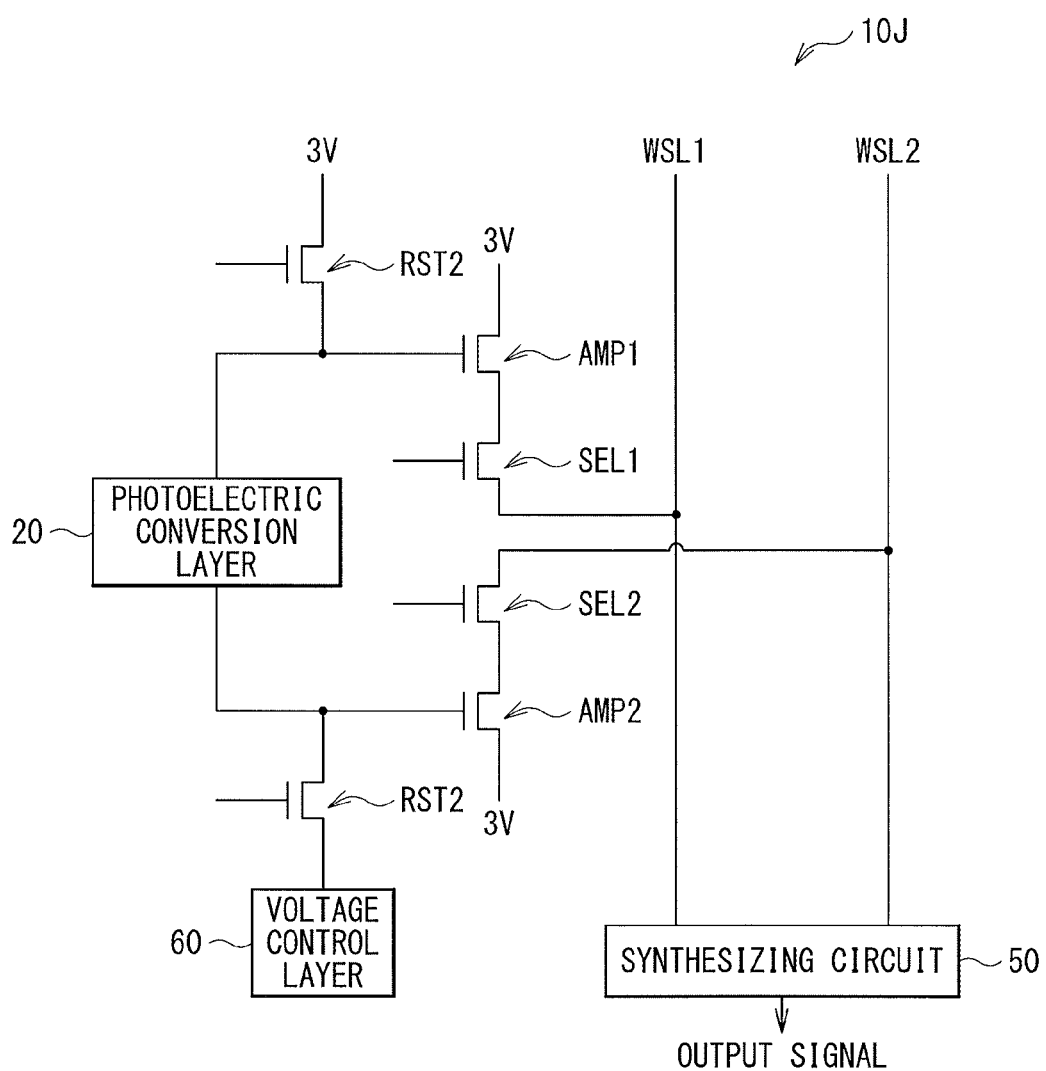
FIG. 33 is an equivalent circuit diagram of an imaging element according to an eighth embodiment of the present disclosure.

FIG. 33 illustrates an equivalent circuit of an imaging element (an imaging element 10J) according to an eighth embodiment of the present disclosure. As with the imaging element 10A and the like, the imaging element 10J configures one pixel (the unit pixel P) in an imaging apparatus (the imaging apparatus 1; see FIG. 45) such as a CMOS image sensor used in an electronic apparatus such as a digital still camera or a video camera, for example. The imaging element 10J according to the present embodiment differs from the above-described second embodiment in that, in a configuration in which the first electrode 33A and the second electrode 33B are provided at a distance from each other below the photoelectric conversion layer 20 and the third electrode 24 is provided above the photoelectric conversion layer 20, a voltage controller 60 is disposed at the drain section of the second reset transistor RST2, and a voltage applied to the second electrode 33B is variably controllable.

Figure 34:
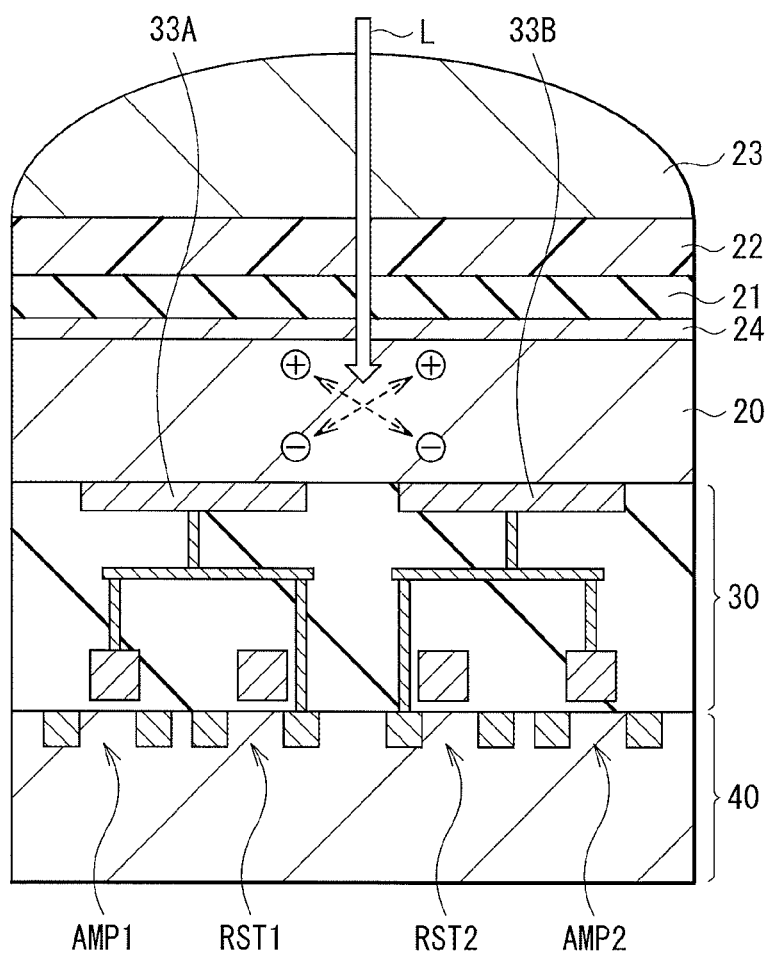
FIG. 34 is a schematic diagram for description of movement of charges in a first driving mode of the imaging element illustrated in FIG. 30.
Figure 35:
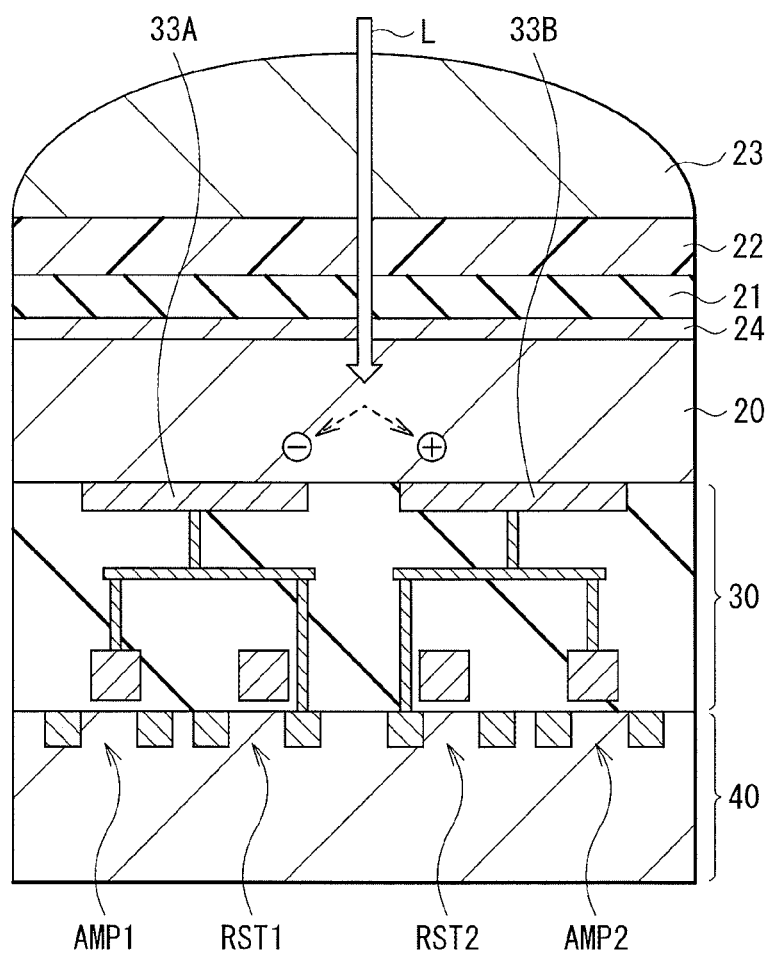
FIG. 35 is a schematic diagram for description of movement of charges in a second driving mode of the imaging element illustrated in FIG. 30.

The imaging element 10J according to the present embodiment has two driving modes, that is, a first driving mode and a second driving mode. FIG. 34 schematically illustrates movement of charges in the first driving mode of the imaging element 10J according to the present embodiment, and FIG. 35 schematically illustrates movement of charges in the second driving mode of the imaging element 10J according to the present embodiment.

First Driving Mode

In the first driving mode, for example, a voltage of 0 V is applied to the third electrode 24, and, for example, a voltage of 3 V is applied to the drain section of the first reset transistor RST1 coupled to the first electrode 33A and the drain section of the second reset transistor RST2 coupled to the second electrode 33B. With such a configuration, electrons of charges (electrons and holes) generated in the photoelectric conversion layer 20 by incidence of the light L are collected in the first electrode 33A and the second electrode 33B disposed below the photoelectric conversion layer 20, as illustrated in FIG. 34. The holes are collected in the third electrode 24 disposed above the photoelectric conversion layer 20 and discharged from the third electrode 24.

Second Driving Mode

In the second driving mode, for example, a voltage of 2 V is applied to the third electrodes 24. For example, a voltage of 3 V is applied to the drain section of the first reset transistor RST1 coupled to the first electrode 33A, and, for example, a voltage of 1 V is applied to the drain section of the second reset transistor RST2 coupled to the second electrode 33B. With such a configuration, electrons of charges (electrons and holes) generated in the photoelectric conversion layer 20 by the incident light L are collected in the first electrode 33A, and the holes are collected in the second electrode 33B, as illustrated in FIG. 35.

As described above, in the present embodiment, the voltage controller 60 is disposed at the drain section of the second reset transistor RST2 to make the voltage applied to the second electrodes 33B variably controllable. This makes it possible for the imaging element 10J to switch polarities of signal charges collected in the first electrode 33A and the second electrode 33B to the same polarity or different polarities. That is, it is possible for the imaging element 10J according to the present embodiment to freely select from between the two driving modes, that is, the first driving mode in which one (for example, only electrons) of charges (electrons and holes) generated in the photoelectric conversion layer 20 are collected, and the second driving mode in which both charges (electrons and holes) are collected. Therefore, it is possible to provide an imaging apparatus that is allowed to perform optional setting in accordance with an imaging state, such as selecting the second driving mode in a case where imaging with higher function, specifically high sensitivity is desired, and selecting the first driving mode in a case where imaging with low sensitivity is desired, for example.

In the present embodiment, an example in which the voltage controller 60 is provided at the drain section of the second reset transistor RST2 has been described, but the voltage controller 60 is not limited thereto, and may be provided at the drain section of the first reset transistor RST1, for example. Further, the voltage controller may be coupled to the drain sections of both the first reset transistor RST1 and the second reset transistor RST2. Coupling the voltage controller to the drain section of each of the first reset transistor RST1 and the second reset transistor RST2 makes it possible to freely interchange the voltages of the first electrode 33A and the second electrode 33B in the second driving mode. This makes it possible to interchange the electrode that accumulates electrons and the electrode that accumulates holes.

In addition, the first driving mode and the second driving mode may be separately used at different times, or the pixel P employing the first driving mode and the pixel P employing the second driving mode may be provided in a mixed manner in the imaging apparatus. The voltage controller 60 may be provided for each of the pixels P, or may be provided outside the pixels P.

10. MODIFICATION EXAMPLE 2

Figure 36:
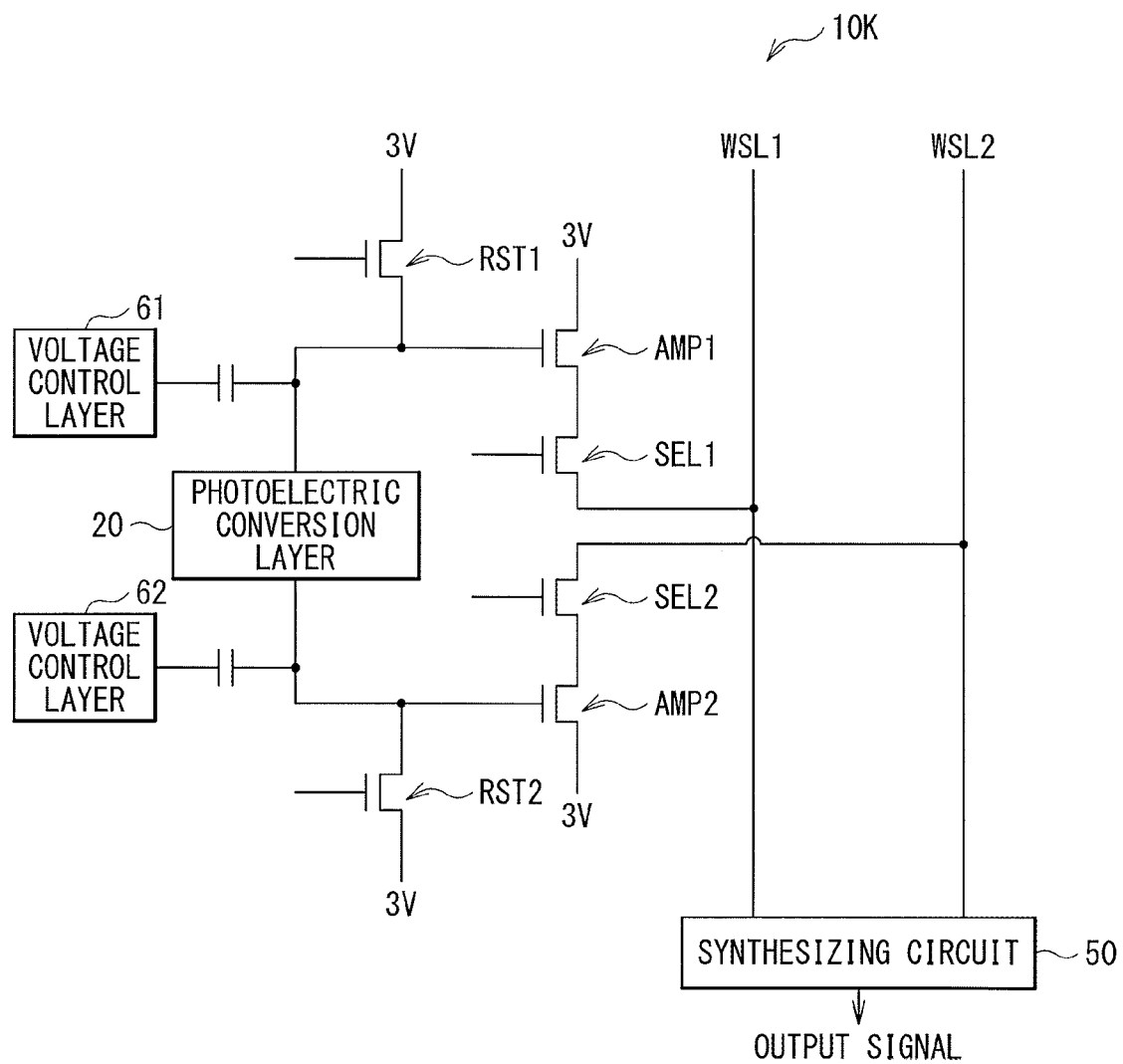
FIG. 36 is an equivalent circuit diagram of an imaging element according to a modification example 2 of the present disclosure.

FIG. 36 illustrates an equivalent circuit of an imaging element (an image element 10K) according to a modification example 1 of the present disclosure. As with the imaging element 10A and the like, the imaging element 10K configures one pixel (the unit pixel P) on an imaging apparatus (imaging apparatus 1; see FIG. 45) such as a CMOS image sensor used in an electronic apparatus such as a digital still camera or a video camera, for example. The imaging element 10K according to the present embodiment differs from the above-described eighth embodiment in that, in a configuration in which the first electrode 33A and the second electrode 33B are provided at a distance from each other below the photoelectric conversion layer 20 and the third electrode is provided above the photoelectric conversion layer 20, control of the voltages applied to the first electrode 33A and the second electrode 33B is performed using capacitive coupling with the respective electrodes 33A and 33B. Specifically, for example, wirings (not illustrated) opposed to the first electrode 33A and the second electrode 33B are provided in the wiring layer 30, and voltage controllers 61 and 62 is coupled to the respective wirings to appropriately control the voltages applied to the first electrode 33A and the second electrode 33B.

In a case where the voltages applied to the first electrode 33A and the second electrode 33B are controlled using capacitive coupling as with the present modification example, them is a possibility that charge-voltage conversion efficiency of the pixel P is decreased. For this reason, as described in the above-described eighth embodiment, it is preferable to perform control using the drain section of the first reset transistor RST1, the drain section of the second reset transistor RST2, or both.

11. NINTH EMBODIMENT

Figure 37:
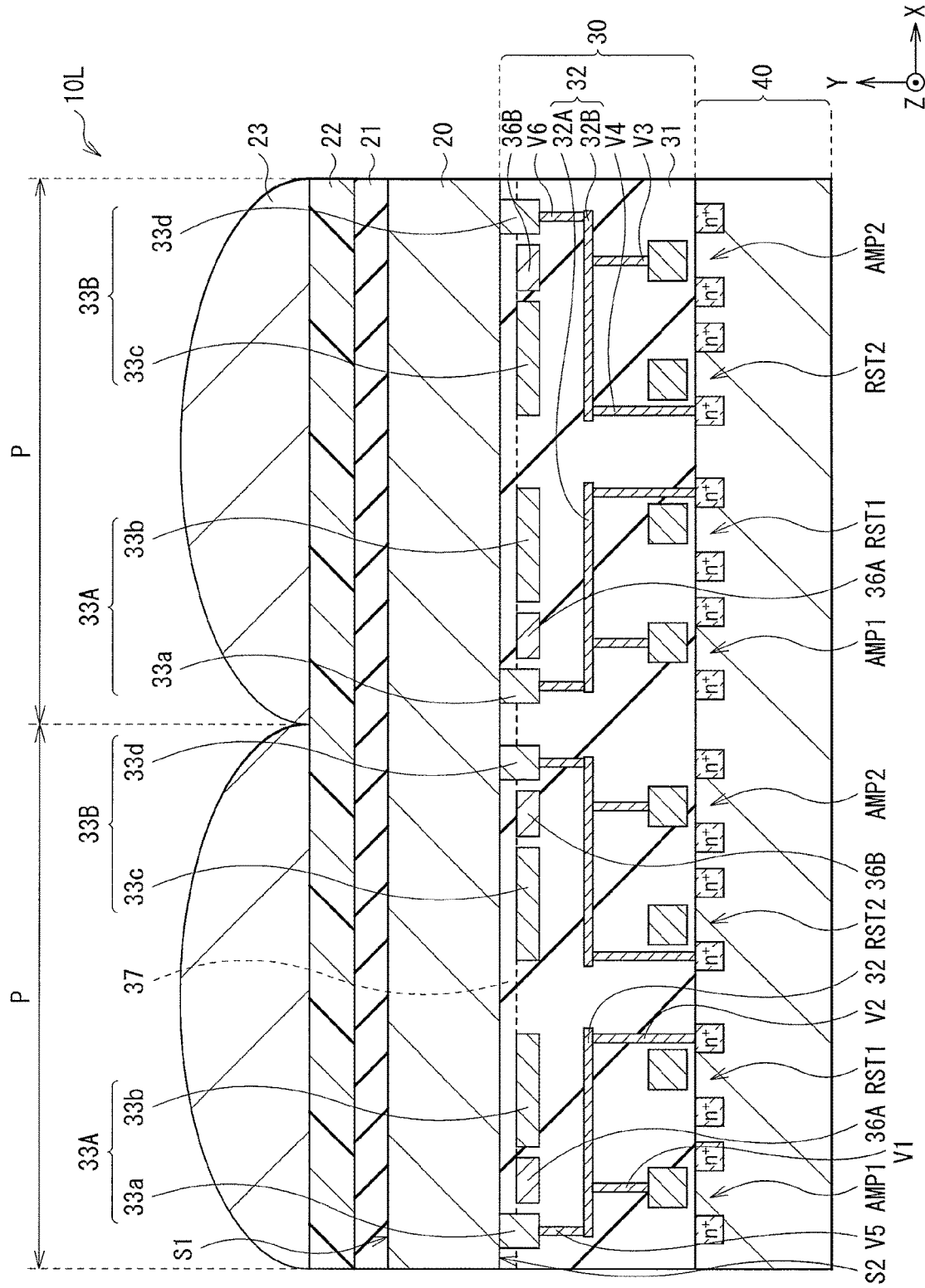
FIG. 37 is a cross-sectional view of a schematic configuration of an imaging element according to a ninth embodiment of the present disclosure.
Figure 38:
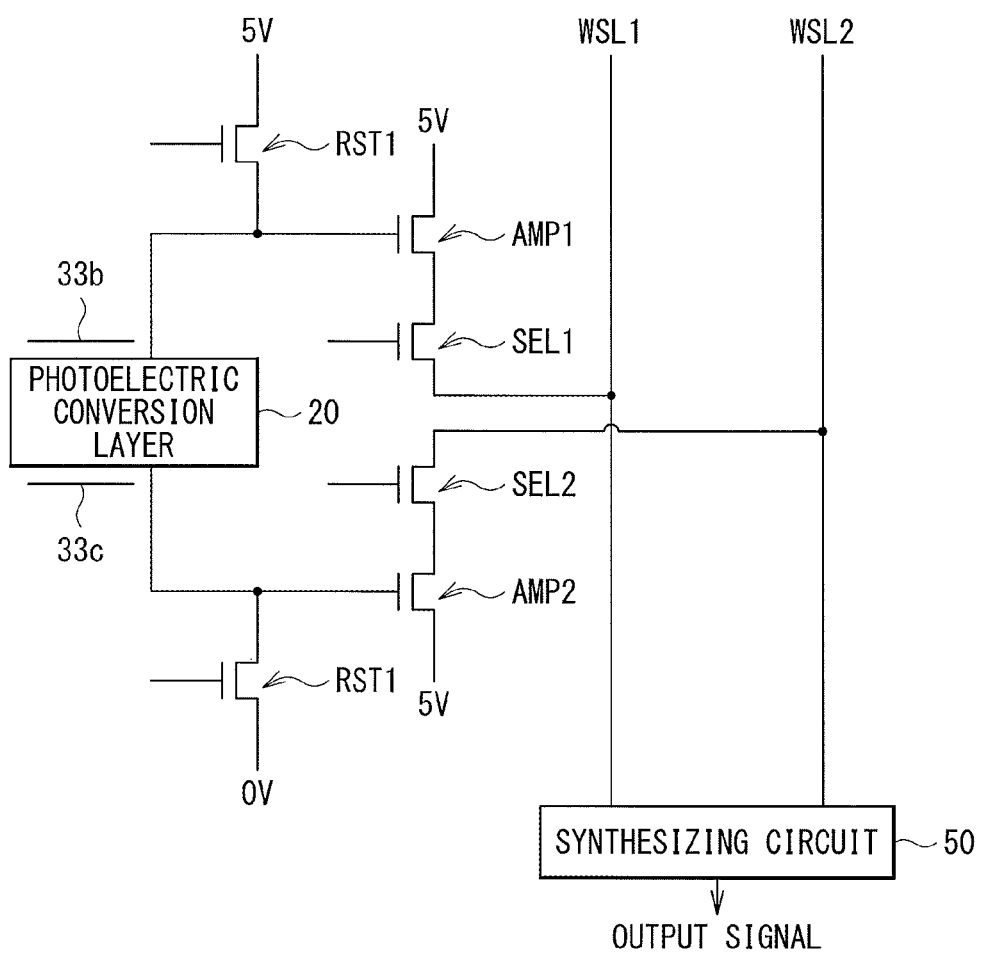
FIG. 38 is an equivalent circuit diagram of the imaging element illustrated in FIG. 37.

FIG. 37 illustrates an example of a cross-sectional configuration of an imaging element (an imaging element 10L) according to a ninth embodiment of the present disclosure. FIG. 38 illustrates an equivalent circuit of the imaging element 10L, As with the imaging element 10A and the like, the imaging element 10L configures one pixel (the unit pixel P) in an imaging apparatus (the imaging apparatus 1; see FIG. 45) such as a CMOS image sensor used in an electronic apparatus such as a digital still camera or a video camera, for example.

In the imaging element 10L according to the present embodiment, the first electrode 33A and the second electrode 33B are divided into readout electrodes 33a and 33d and accumulation electrodes 33b and 33c. A barrier electrode 36A and a barrier electrode 36B are respectively provided between the readout electrode 33a and the accumulation electrode 33b and between the accumulation electrode 33c and the readout electrode 33d, and the accumulation electrodes 33b and 33c and the barrier electrodes 36A and 36B are covered with an insulating layer 37.

It is possible to use the same materials as those of the first electrode 33A and the second electrode 33B for the readout electrodes 33a and 33d, the accumulation electrodes 33b and 33c, the barrier electrode 36A, and the barrier electrode 36B. Specifically, for example, these electrodes each include a conductive film having light transmittance, and include, for example, ITO (indium tin oxide). Moreover, in addition to ITO, a tin oxide ($SnO_2$) material to which a dopant is added or a zinc oxide material obtained by adding a dopant to aluminum zinc oxide (ZnO) may be used. Examples of the zinc oxide material include aluminum zinc oxide (AZO) to which aluminum (Al) is added as a dopant, gallium zinc oxide (GZO) to which gallium (Ga) is added, and indium zinc oxide (IZO) to which indium (In) is added. In addition, CuI, $InSbO_4$, ZnMgO, $CuInO_2$, $MgIN_2O_4$, CdO, $ZnSnO_3$, or the like may be used. The first electrode 33A and the second electrode 33B do not necessarily have light transmittance, and may use, for example, a metal film including aluminum (Al), tungsten (W), titanium (Ti), molybdenum (Mo), tantalum (Ta), copper (Cu), cobalt (Co), nickel (Ni), or the like, an alloy film thereof, or the metal film containing silicon or oxygen.

Figure 39:
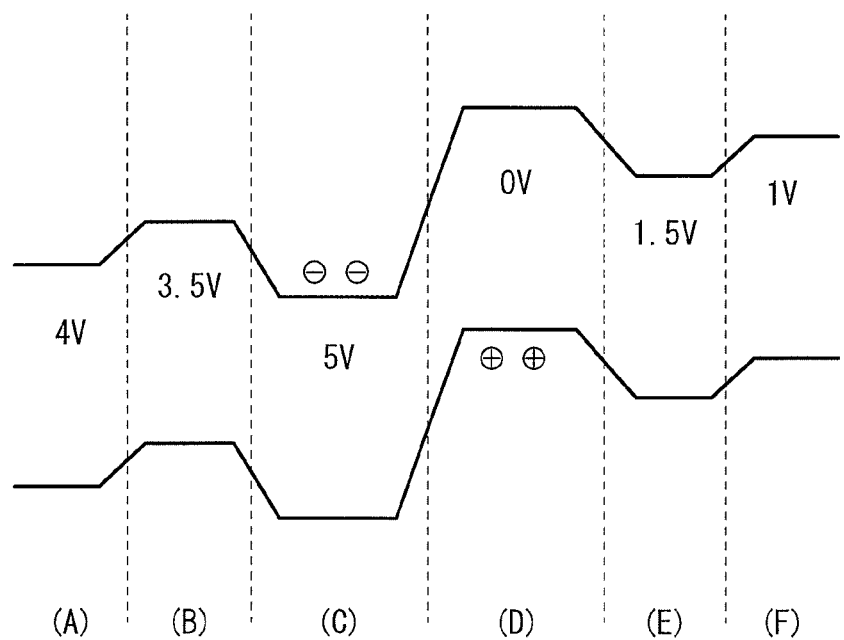
FIG. 39 is a diagram illustrating a potential of a photoelectric conversion layer during charge accumulation in the imaging element illustrated in FIG. 37.
Figure 40:
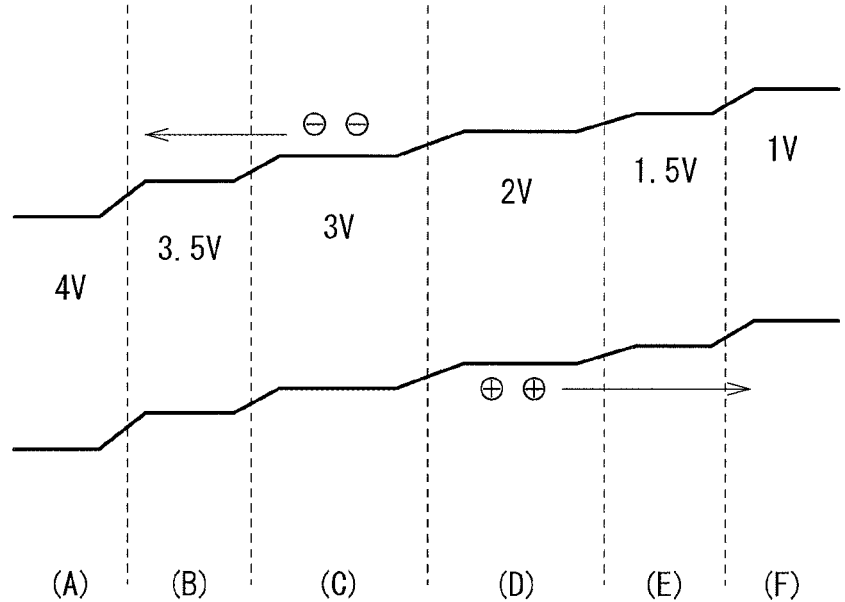
FIG. 40 is a diagram illustrating the potential of the photoelectric conversion layer during charge transfer in the imaging element illustrated in FIG. 37.

An operation of the imaging element 10L will be described with reference to FIGS. 39 and 40. In FIGS. 39 and 40, each of (A) to (F) represents a position of the photoelectric conversion layer 20 on a corresponding one of the electrodes 33a, 33b, 33c, 33d, 36A, and 36B. Specifically, (A) corresponds to a position on the readout electrode 33a, (B) corresponds to a position on the barrier electrode 36A, (C) corresponds to a position on the accumulation electrode 33b, (D) corresponds to a position on the accumulation electrode 33c, (E) corresponds to a position on the barrier electrode 36B, and (F) corresponds to a position on the readout electrode 33d.

FIG. 39 illustrates potentials of the photoelectric conversion layer at respective positions (A) to (F) during charge accumulation in the imaging element 10L. During charge accumulation, a first voltage is applied to the accumulation electrode 33b, and a second voltage lower than that of the accumulation electrode 33b is applied to the accumulation electrode 33c. In the present embodiment, as an example, the first voltage is 5 V and the second voltage is 0 V. A third voltage and a fourth voltage are respectively applied to the barrier electrode 36A and the barrier electrode 36 B. In the present embodiment, the third voltage is 3.5 V and the fourth voltage is 1.5 V. A fifth voltage is applied to the readout electrode 33a, and a sixth voltage is applied to the readout electrode 33d. In the present embodiment, the fifth voltage is 4 V and the sixth voltage is 1 V.

In the imaging element 10L during charge accumulation, electrons and holes of charges generated in the photoelectric conversion layer 20 are respectively attracted toward the accumulation electrode 33b and the accumulation electrode 33c by an electric field formed by the accumulation electrode 33b and the accumulation electrode 33c. However, the insulating layer 37 is provided between the photoelectric conversion layer 20 and each of the accumulation electrodes 33b and 33c, which causes electrons and holes to be accumulated in regions, opposed to the corresponding accumulation electrodes 33b and 33c, of the photoelectric conversion layer 20.

FIG. 40 illustrates potentials of the photoelectric conversion layer at the positions (A) to (F) during charge transfer in the imaging element 10L. During charge transfer, a seventh voltage lower than the third voltage is applied to the accumulation electrode 33b, and an eighth voltage higher than the fourth voltage is applied to the accumulation electrode 33c. In the present embodiment, the seventh voltage is 3 V and the second voltage is 2 V. As a result, electrons and holes accumulated in the photoelectric conversion layer 20 are respectively transferred to the readout electrode 33A and the readout electrode 33d.

As described above, in the imaging element 10L according to the present embodiment, the first electrode 33A and the second electrode 33B are divided into the readout electrodes 33a and 33d and the accumulation electrodes 33b and 33c, and the insulating layer 37 is provided on the accumulation electrodes 33b and 33c. In the present embodiment, controlling the voltage applied to each of the electrodes 33a, 33b, 33c, and 33d causes negative signal charges (electrons) to be accumulated in a region opposed to the accumulation electrode 33b of the photoelectric convention layer 20, and then transferred to the readout electrode 33a. Moreover, positive signal charges (holes) are accumulated in a region opposed to the accumulation electrode 33c of the photoelectric conversion layer 20, and then transferred to the readout electrode 33d. As described above, accumulation of the signal charges (electrons and holes) is performed in the photoelectric conversion layer 20, which makes it possible to prevent a decrease in the charge-voltage conversion efficiency of the signal charges even in a case where coupling capacitance between the first electrode 33A and the second electrode 33B is increased. This makes it possible to improve sensitivity of the imaging element 10L, in addition to the effects of the above-described first embodiment.

In the imaging element 10L according to the present embodiment, the barrier electrode 36A and the barrier electrode 36B are respectively provided between the readout electrode 33a and the accumulation electrode 33b and between the accumulation electrode 33c and the readout electrode 33d, and a voltage of the barrier electrode 36A is set to be higher than the voltage of the accumulation electrode 33c during charge accumulation. A voltage of the barrier electrode 36B is set to be lower than the voltage of the accumulation electrode 33b during charge accumulation. Moreover, the voltage of the barrier electrode 36A is set to be higher than the voltage of the barrier electrode 36B. As a result, excess charges generated in the photoelectric conversion layer 20 flow to the readout electrodes 33a and 33d. Further, a constant potential difference is maintained between the accumulation electrode 33b (C) and the accumulation electrode 33c (D) even in a charge accumulation state, which suppresses recombination of electrons and holes in the charge accumulation region. This makes it possible to improve the saturation charge amount of the imaging element 10L.

The accumulation electrodes 33b and 33c of the present embodiment may be divided into a plurality of portions as with the first electrode 33A and the second electrode 33B of the first embodiment, and may be arranged in a checkered pattern, for example. This makes it possible to efficiently collect charges generated in the photoelectric conversion layer 20 on the accumulation electrodes 33b and 33c, and to further improve sensitivity of the imaging element 10L.

Moreover, in the imaging element 10L according to the present embodiment, the third electrode 24 may be provided on the light incident surface S2 of the photoelectric conversion layer 20, as with the imaging element 10B according to the above-described second embodiment. This makes it possible to improve moving speed of the charges generated in the photoelectric conversion layer 20 improve optical response speed of the imaging element 10L.

Further, in the imaging element 10L according to the present embodiment, the fourth electrode 33C may be provided between the readout electrode 33a of the first electrode 33A and the readout electrode 33d of the second electrode 33B, as with the imaging element 10C according to the above-described third embodiment. This makes it possible to improve charge-voltage conversion efficiency of the signal charges, and to further improve sensitivity of the imaging element 10L.

Furthermore, in the imaging element 10L according to the present embodiment, the third electrode 24 may be provided on the photoelectric conversion layer 20 with the insulating layer 25 interposed therebetween, as with the imaging element 10E according to the above-described fourth embodiment. This makes it possible to improve moving speed of the charges generated in the photoelectric conversion layer 20 and improve optical response speed of the imaging element 10L.

Moreover, the imaging element 10L according to the present embodiment may have a configuration in which the third electrode 24 is provided on the photoelectric conversion layer 20 with the insulating layer 25 interposed therebetween, and the opening 25H is provided at a position, corresponding to the accumulation electrodes 33b and 33c, of the insulating layer 25, as with the imaging element 10F according to the above-described fifth embodiment. This makes it possible to improve photoresponsiveness while suppressing a decrease in sensitivity of the imaging element 10L.

Further, the imaging element 10L according to the present embodiment may have a configuration in which a portion or the entirety of each of the accumulation electrodes 33b and 33c is embedded in the photoelectric conversion layer 20, as with the imaging elements 10G and 10H according to the above-described sixth embodiment. This makes it possible to improve optical response speed of the imaging element 10L.

Figure 41:
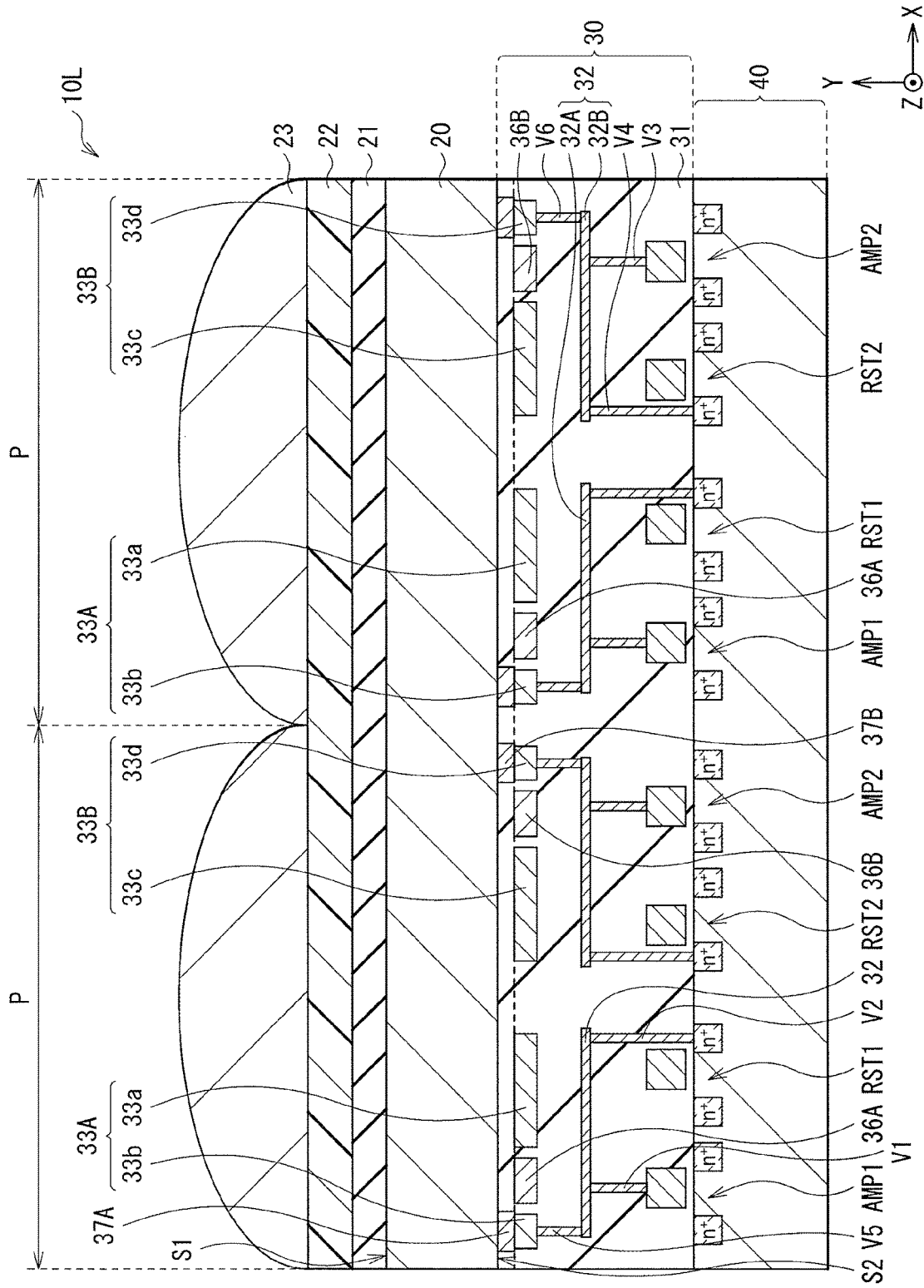
FIG. 41 is a cross-sectional view of a schematic configuration of an imaging element according to a tenth embodiment of the present disclosure.
Figure 42:
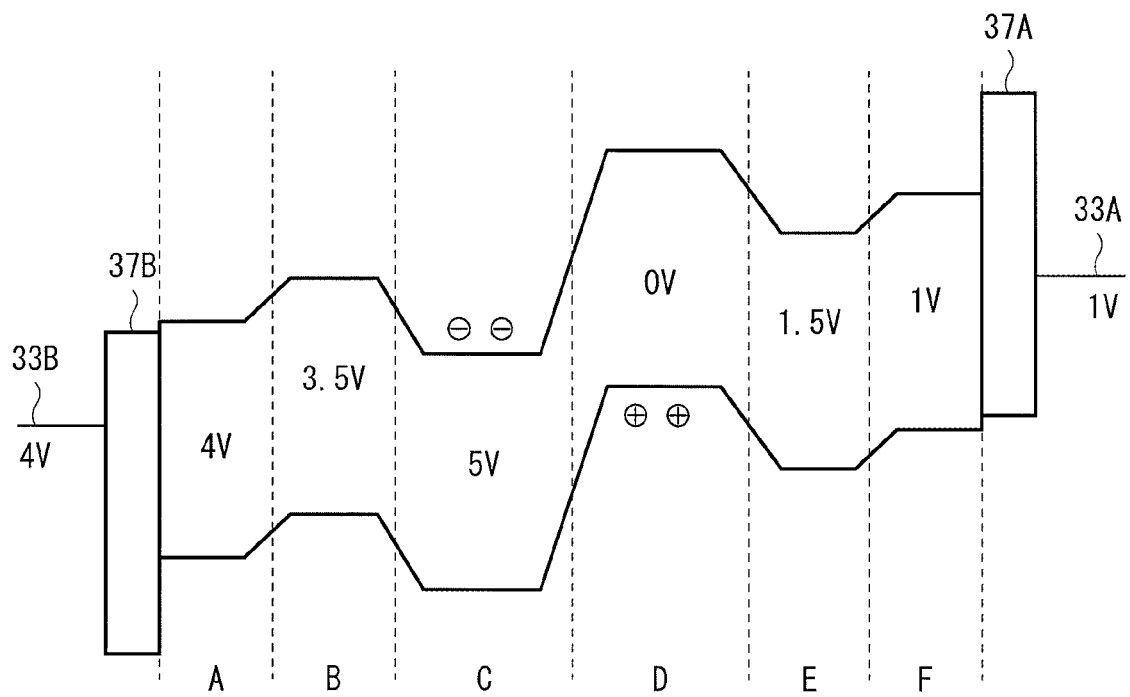
FIG. 42 is a diagram illustrating a potential of a photoelectric conversion layer during charge accumulation in the imaging element illustrated in FIG. 41.
Figure 43:
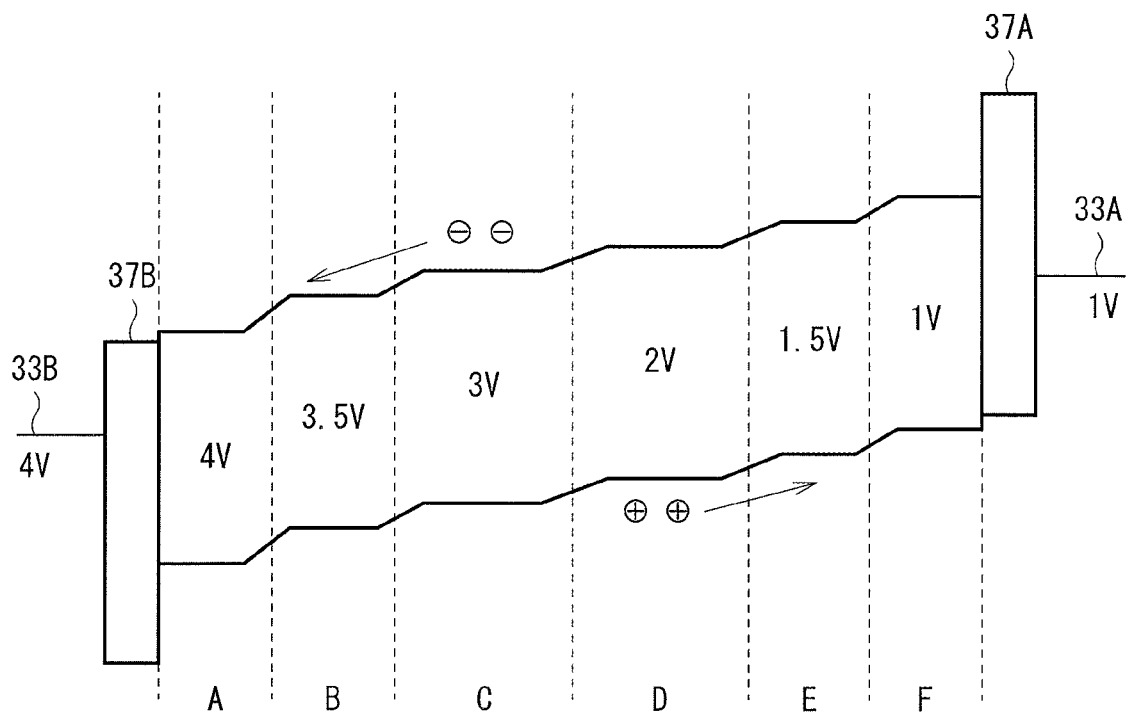
FIG. 43 is a diagram illustrating the potential of the photoelectric conversion layer during charge transfer in the imaging element illustrated in FIG. 41.

Furthermore, as illustrated in FIG. 41, in the imaging element 10L according to the present embodiment, barrier layers 37A and 37B formed in the imaging element 10I according to the seventh embodiment may be provided between the readout electrode 33a and the photoelectric conversion layer 20 and the readout electrode 33d and the photoelectric conversion layer 20. FIG. 42 illustrates the potentials of the photoelectric conversion layer at the position (A) to (F) during charge accumulation in the imaging element 10L. FIG. 43 illustrates the potentials of the photoelectric conversion layer at the positions (A) to (F) during charge transfer in the imaging element 10L. As described above, providing the barrier layers 37 A and 37 B between the readout electrode 33a and the photoelectric conversion layer 20 and between the readout electrode 33d and the photoelectric conversion layer 20, mixing of noise into signal charges is reduced. This makes it possible to improve image quality of the imaging element 10L.

Figure 44:
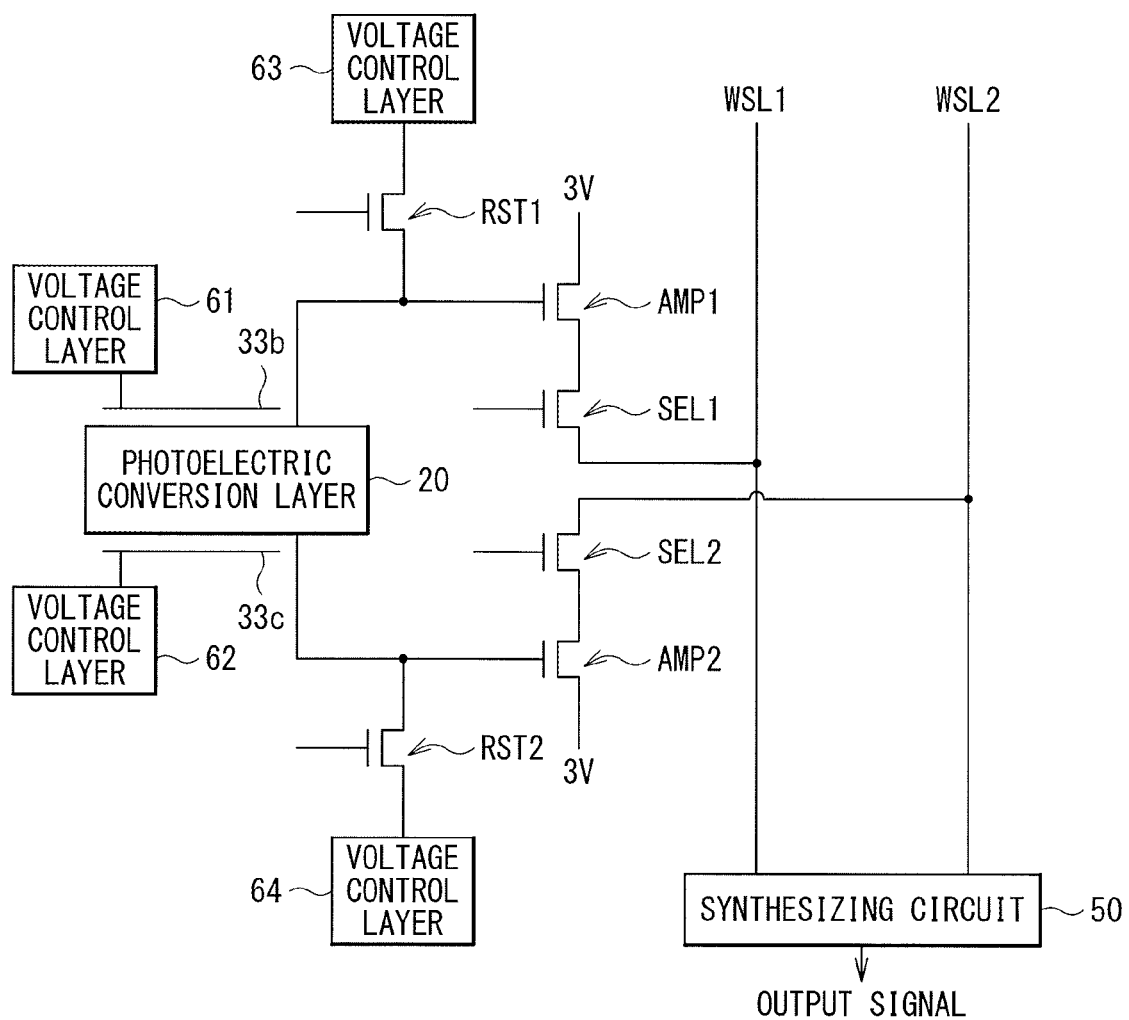
FIG. 44 is an equivalent circuit diagram of the imaging element illustrated in FIG. 41.

Moreover, as illustrated in FIG. 44, the imaging element 10L according to the present embodiment may be provided with voltage controllers 61, 62, 63, and 64 that control voltages (potentials) applied to the accumulation electrodes 33b and 33c as appropriate. This makes it possible to freely select from between the first driving mode in which one of electrons and holes is used as the signal charge and the second driving mode in which both electrons and holes are used as the signal charge. This makes it possible to improve functions of the imaging apparatus including the imaging element 10L.

12. APPLICATION EXAMPLES

Application Example 1

Figure 45:
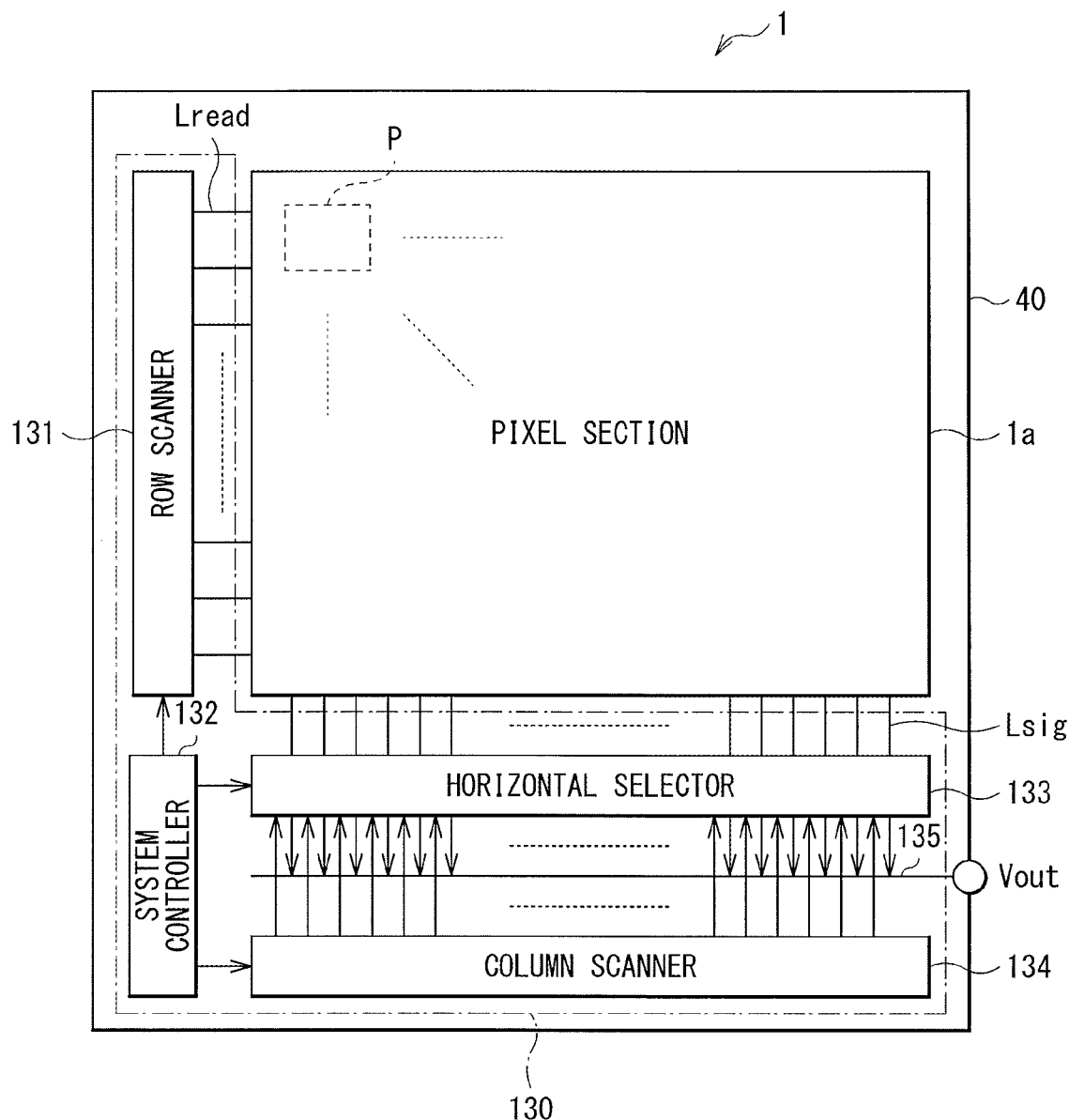
FIG. 45 is a block diagram illustrating a configuration of an imaging apparatus using the imaging element illustrated in FIG. 1 and the like as a pixel.

FIG. 45 illustrates an entire configuration of an imaging apparatus (the imaging apparatus 1) using the imaging element 10A (or the imaging element 10B, 10C, 10D, 10E, 10F, 10G, 10H, 10I, 10J, 10K or 10L) described in the above-described first embodiment (or any of the second to ninth embodiments and the modification examples 1 and 2) for each of the pixels P. The imaging apparatus 1 is a CMOS image sensor, and includes a pixel section 1a serving as an imaging region, and a peripheral circuit section on the semiconductor substrate 40. The peripheral circuit section is provided in a peripheral region of the pixel section 1a, and includes, for example, a row scanner 131, a horizontal selector 133, a column scanner 134, and a system controller 132.

The pixel section 1a includes, for example, a plurality of unit pixels P (each corresponding to the imaging element 10A) arranged two-dimensionally in a matrix. For example, the unit pixels P are wired with pixel drive lines Lread (specifically, row selection lines and reset control lines) for respective pixel rows, and wired with vertical signal lines Lsig for respective pixel columns. The pixel drive lines Lread transmit drive signals for signal reading from the pixels. The pixel drive lines each have one end coupled to a corresponding one of output terminals, corresponding to the respective rows, of the row scanner 131.

The row scanner 131 includes a shift register, an address decoder, etc., and serves as a pixel driver that drives each of the unit pixels P of the pixel section 1a on a row-by-row basis, for example. A signal outputted from each of the unit pixels P of a pixel row selected and scanned by the row scanner 131 is supplied to the horizontal selector 133 through each of the vertical signal lines Lsig. The horizontal selector 133 includes an amplifier, a horizontal selection switch, etc. provided for each of the vertical signal lines Lsig.

The column scanner 134 includes a shift register, an address decoder, etc., and sequentially drives respective horizontal selection switches of the horizontal selector 133 while scanning the horizontal selection switches. Such selective scanning by the column scanner 134 causes signals of the respective pixels transmitted through the respective vertical signal lines Lsig to be outputted in sequence to a horizontal signal line 135 and thereafter transmitted to outside of the semiconductor substrate 40 through the horizontal signal line 135.

A circuit portion including the row scanner 131, the horizontal selector 133, the column scanner 134, and the horizontal signal line 135 may be formed directly on the semiconductor substrate 40, or may be disposed in an external control IC. Further, the circuit portion may be formed in another substrate coupled by a cable, etc.

The system controller 132 receives a clock provided from outside of the semiconductor substrate 40, data to command an operation mode, etc., and also outputs data such as internal information of the imaging apparatus 1. The system controller 132 further includes a timing generator that generates various timing signals, and performs driving control of the peripheral circuit section such as the row scanner 131, the horizontal selector 133, and the column scanner 134 on the basis of the various timing signals generated by this timing generator.

Application Example 2

Figure 46:
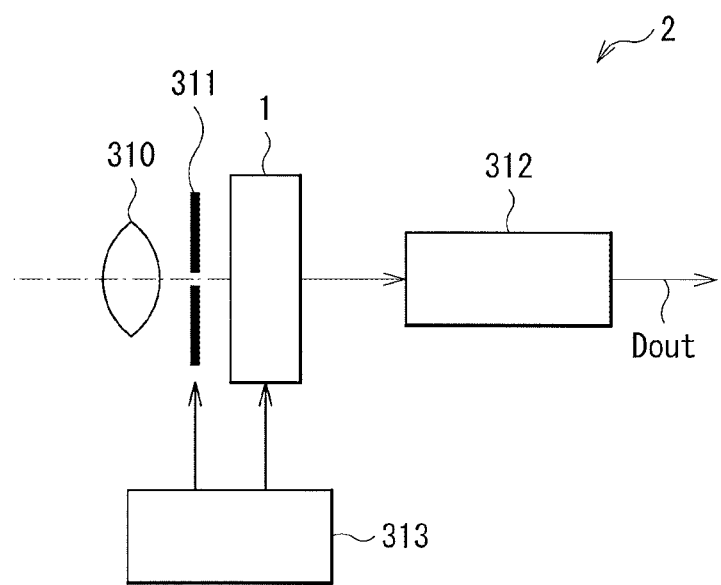
FIG. 46 is a functional block diagram illustrating an example of an electronic apparatus (a camera) using the imaging apparatus illustrated in FIG. 45.

The above-described imaging apparatus 1 is applicable to various types of electronic apparatuses having an imaging function including a camera system such as a digital still camera and a video camera, a mobile phone having an imaging function, etc. FIG. 46 illustrates a schematic configuration of an electronic apparatus 1 (a camera), as an example. The electronic apparatus 1 is, for example, a video camera that enables shooting of a still image or a moving image, and includes the imaging apparatus 1, an optical system (an optical lens) 310, a shutter apparatus 311, a driver 313 that drives the imaging apparatus 1 and the shutter apparatus 311, and a signal processor 312.

The optical system 310 guides image light (incident light) from a subject to the pixel section 1a of the imaging apparatus 1. This optical system 310 may include a plurality of optical lenses. The shutter apparatus 311 controls a period in which the imaging apparatus 1 is irradiated with the light and a period in which the light is blocked. The driver 313 controls a transfer operation of the imaging apparatus 1 and a shutter operation of the shutter apparatus 311. The signal processor 312 performs various kinds of signal processing on a signal outputted from the imaging apparatus 1. An image signal Dout having been subjected to the signal processing is stored in a storage medium such as a memory or outputted to a monitor, etc.

Further, the above-described imaging apparatus 1 is also applicable to the following electronic apparatuses (a capsule type endoscope 10100 and a mobile body such as a vehicle).

Application Example 3

Further Application Example to In-Vivo Information Acquisition System

Figure 47:
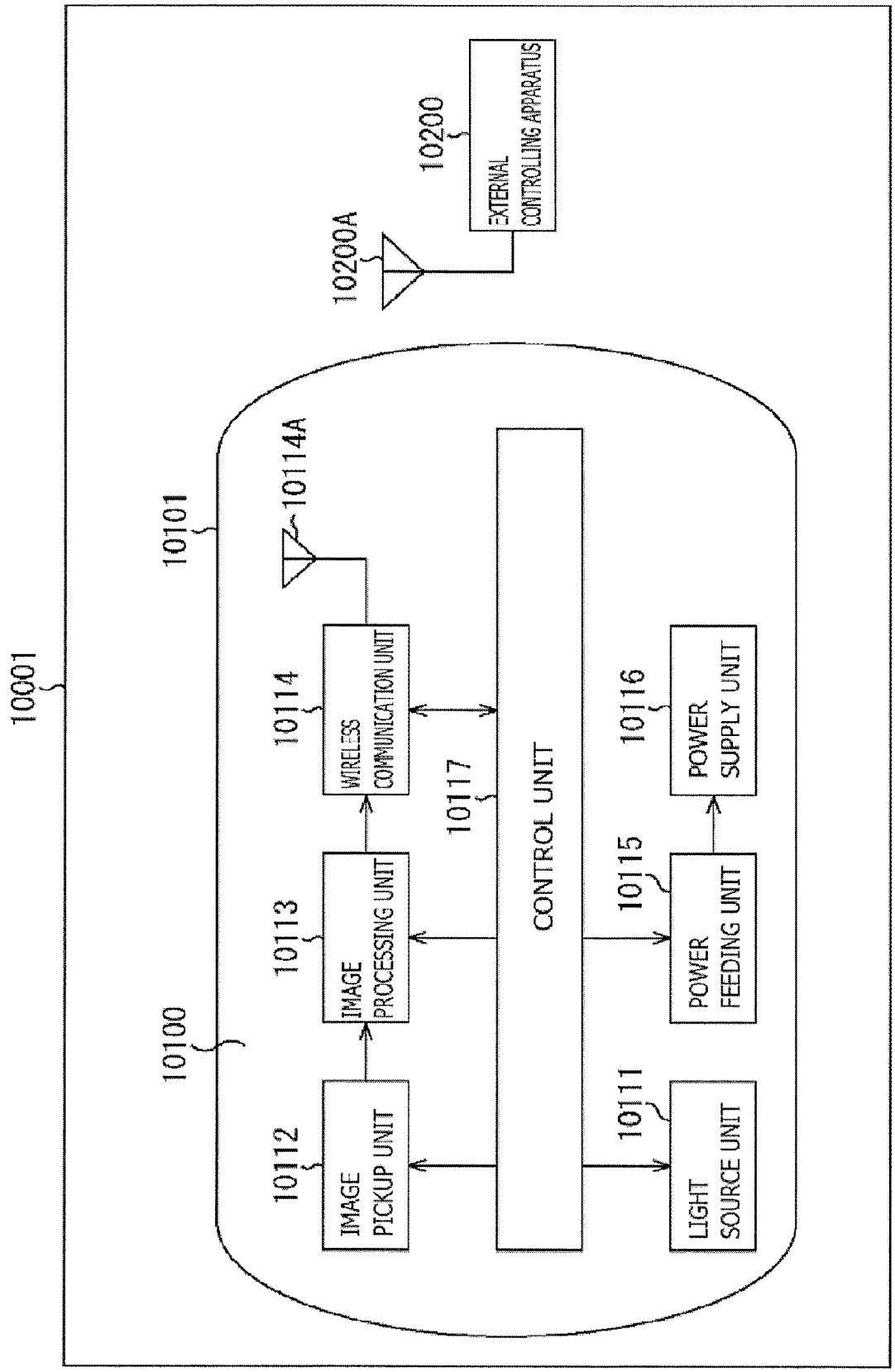
FIG. 47 is a block diagram depicting an example of a schematic configuration of an in-vivo information acquisition system.

FIG. 47 is a block diagram depicting an example of a schematic configuration of an in-vivo information acquisition system of a patient using a capsule type endoscope, to which the technology according to an embodiment of the present disclosure (present technology) can be applied.

The in-vivo information acquisition system 10001 includes a capsule type endoscope 10100 and an external controlling apparatus 10200.

The capsule type endoscope 10100 is swallowed by a patient at the time of inspection. The capsule type endoscope 10100 has an image pickup function and a wireless communication function and successively picks up an image of the inside of an organ such as the stomach or an intestine (hereinafter referred to as in-vivo image) at predetermined intervals while it moves inside of the organ by peristaltic motion for a period of time until it is naturally discharged from the patient. Then, the capsule type endoscope 10100 successively transmits information of the in-vivo image to the external controlling apparatus 10200 outside the body by wireless transmission.

The external controlling apparatus 10200 integrally controls operation of the in-vivo information acquisition system 10001. Further, the external controlling apparatus 10200 receives information of an in-vivo image transmitted thereto from the capsule type endoscope 10100 and generates image data for displaying the in-vivo image on a display apparatus (not depicted) on the basis of the received information of the in-vivo image.

In the in-vivo information acquisition system 10001, an in-vivo image imaged a slate of the inside of the body of a patient can be acquired at any time in this manner for a period of time until the capsule type endoscope 10100 is discharged after it is swallowed.

A configuration and functions of the capsule type endoscope 10100 and the external controlling apparatus 10200 are described in more detail below.

The capsule type endoscope 10100 includes a housing 10101 of the capsule type, in which a light source unit 10111, an image pickup unit 10112, an image processing unit 10113, a wireless communication unit 10114, a power feeding unit 10115, a power supply unit 10116 and a control unit 10117 are accommodated.

The light source unit 10111 includes a light source such as, for example, a light emitting diode (LED) and irradiates light on an image pickup field-of-view of the image pickup unit 10112.

The image pickup unit 10112 includes an image pickup element and an optical system including a plurality of lenses provided at a preceding stage to the image pickup element. Reflected light (hereinafter referred to as observation light) of light irradiated on a body tissue which is an observation target is condensed by the optical system and introduced into the image pickup element. In the image pickup unit 10112, the incident observation light is photoelectrically converted by the image pickup element, by which an image signal corresponding to the observation light is generated. The image signal generated by the image pickup unit 10112 is provided to the image processing unit 10113.

The image processing unit 10113 includes a processor such as a central processing unit (CPU) or a graphics processing unit (GPU) and performs various signal processes for an image signal generated by the image pickup unit 10112. The image processing unit 10113 provides the image signal for which the signal processes have been performed thereby as RAW data to the wireless communication unit 10114.

The wireless communication unit 10114 performs a predetermined process such as a modulation process for the image signal for which the signal processes have been performed by the image processing unit 10113 and transmits the resulting image signal to the external controlling apparatus 10200 through an antenna 10114A. Further, the wireless communication unit 10114 receives a control signal relating to driving control of the capsule type endoscope 10100 from the external controlling apparatus 10200 through the antenna 10114A. The wireless communication unit 10114 provides the control signal received from the external controlling apparatus 10200 to the control unit 10117.

The power feeding unit 10115 includes an antenna coil for power reception, a power regeneration circuit for regenerating electric power from current generated in the antenna coil, a voltage booster circuit and so forth. The power feeding unit 10115 generates electric power using the principle of non-contact charging.

The power supply unit 10116 includes a secondary battery and stores electric power generated by the power feeding unit 10115. In FIG. 47, in order to avoid complicated illustration, an arrows mark indicative of a supply destination of electric power from the power supply unit 10116 and so forth are omitted. However, electric power stored in the power supply unit 10116 is supplied to and can be used to drive the light source unit 10111, the image pickup unit 10112, the image processing unit 10113, the wireless communication unit 10114 and the control unit 10117.

The control unit 10117 includes a processor such as a CPU and suitably controls driving of the light source unit 10111, the image pickup unit 10112, the image processing unit 10113, the wireless communication unit 10114 and the power feeding unit 10115 in accordance with a control signal transmitted thereto from the external controlling apparatus 10200.

The external controlling apparatus 10200 includes a processor such as a CPU or a GPU, a microcomputer, a control board or the like in which a processor and a storage element such as a memory are mixedly incorporated. The external controlling apparatus 10200 transmits a control signal to the control unit 10117 of the capsule type endoscope 10100 through an antenna 10200A to control operation of the capsule type endoscope 10100. In the capsule type endoscope 10100, an irradiation condition of light upon an observation target of the light source unit 10111 can be changed, for example, in accordance with a control signal from the external controlling apparatus 10200. Further, an image pickup condition (for example, a frame rate, an exposure value or the like of the image pickup unit 10112) can be changed in accordance with a control signal from the external controlling apparatus 10200. Further, the substance of processing by the image processing unit 10113 or a condition for transmitting an image signal from the wireless communication unit 10114 (for example, a transmission interval, a transmission image number or the like) may be changed in accordance with a control signal from the external controlling apparatus 10200.

Further, the external controlling apparatus 10200 performs various image processes for an image signal transmitted thereto from the capsule type endoscope 10100 to generate image data for displaying a picked up in-vivo image on the display apparatus. As the image processes, various signal processes can be performed such as, for example, a development process (demosaic process), an image quality improving process (bandwidth enhancement process, a super-resolution process, a noise reduction (NR) process and/or image stabilization process) and/or an enlargement process (electronic zooming process). The external controlling apparatus 10200 controls driving of the display apparatus to cause the display apparatus to display a picked up in-vivo image on the basis of generated image data. Alternatively, the external controlling apparatus 10200 may also control a recording apparatus (not depicted) to record generated image data or control a printing apparatus (not depicted) to output generated image data by printing.

In the foregoing, the description has been given of one example of the in-vivo information acquisition system to which the technology according to the present disclosure is applicable. The technology according to the present disclosure may be applied to, for example, the image pickup unit 10112 among the components of the configuration described above. This makes it possible to obtain a clearer image of the surgical region. Hence, inspection accuracy is improved.

Application Example 4

Further Application Example to Mobile Body

The technology according to the present disclosure (the present technology) is applicable to various products. For example, the technology according to the present disclosure may be achieved in the form of an apparatus to be mounted to a mobile body of any kind such as an automobile, an electric vehicle, a hybrid electric vehicle, a motorcycle, a bicycle, a personal mobility, an airplane, a drone, a vessel, and a robot.

Figure 48:
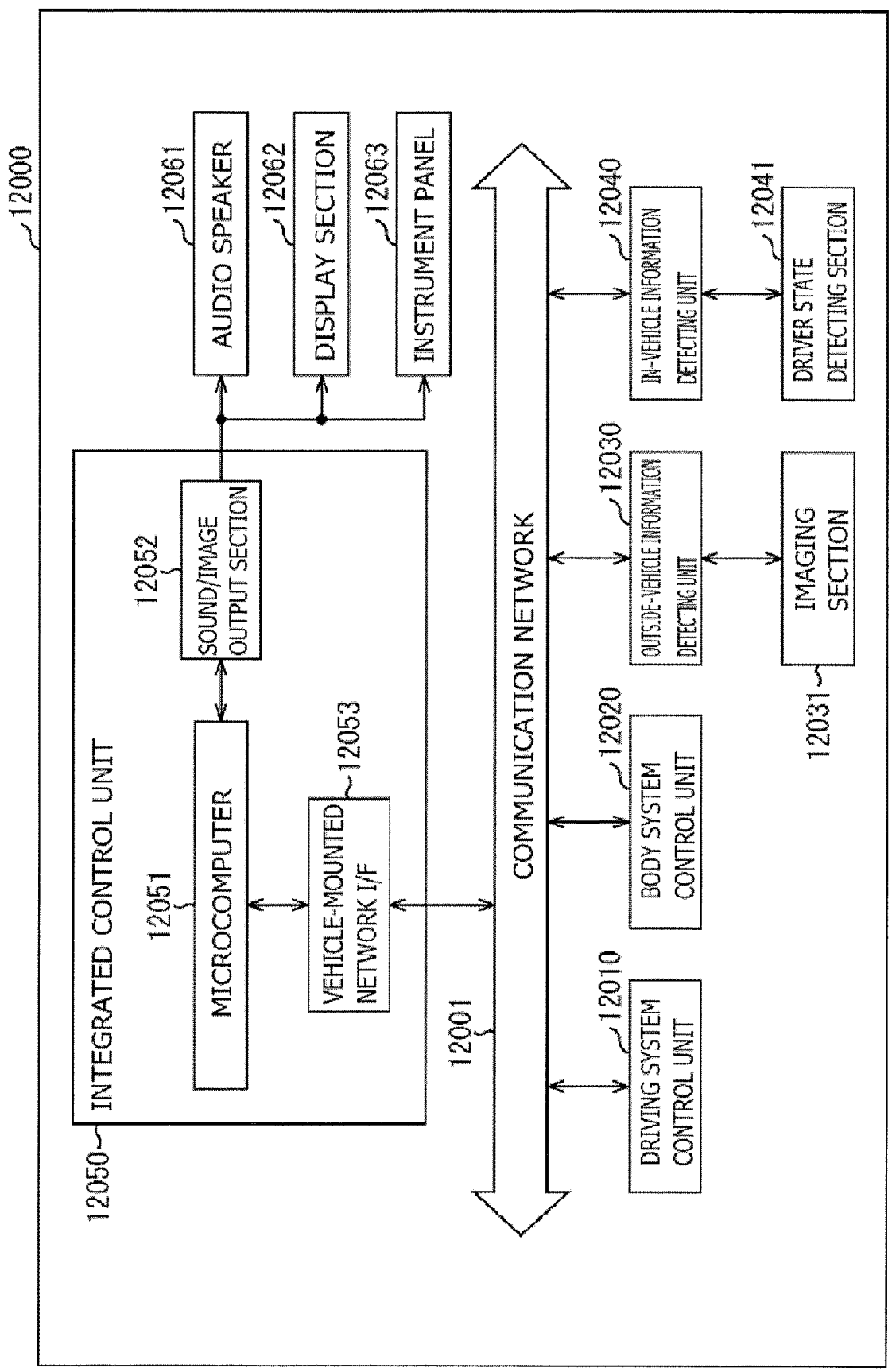
FIG. 48 is a block diagram depicting an example of schematic configuration of a vehicle control system.

FIG. 48 is a block diagram depicting an example of schematic configuration of a vehicle control system as an example of a mobile body control system to which the technology according to an embodiment of the present disclosure can be applied.

The vehicle control system 12000 includes a plurality of electronic control units connected to each other via a communication network 12001. In the example depicted in FIG. 48, the vehicle control system 12000 includes a driving system control unit 12010, a body system control unit 12020, an outside-vehicle information detecting unit 12030, an in-vehicle information detecting unit 12040, and an integrated control unit 12050. In addition, a microcomputer 12051, a sound/image output section 12052, and a vehicle-mounted network interface (I/F) 12053 are illustrated as a functional configuration of the integrated control unit 12050.

The driving system control unit 12010 controls the operation of devices related to the driving system of the vehicle in accordance with various kinds of programs. For example, the driving system control unit 12010 functions as a control device for a driving force generating device for generating the driving force of the vehicle, such as an internal combustion engine, a driving motor, or the like, a driving force transmitting mechanism for transmitting the driving force to wheels, a steering mechanism for adjusting the steering angle of the vehicle, a braking device for generating the braking force of the vehicle, and the like.

The body system control unit 12020 controls the operation of various kinds of devices provided to a vehicle body in accordance with various kinds of programs. For example, the body system control unit 12020 functions as a control device for a keyless entry system, a smart key system, a power window device, or various kinds of lamps such as a headlamp, a backup lamp, a brake lamp, a turn signal, a fog lamp, or the like. In this case, radio waves transmitted from a mobile device as an alternative to a key or signals of various kinds of switches can be input to the body system control unit 12020. The body system control unit 12020 receives these input radio waves or signals, and controls a door lock device, the power window device, the lamps, or the like of the vehicle.

The outside-vehicle information detecting unit 12030 detects information about the outside of the vehicle including the vehicle control system 12000. For example, the outside-vehicle information detecting unit 12030 is connected with an imaging section 12031. The outside-vehicle information detecting unit 12030 makes the imaging section 12031 image an image of the outside of the vehicle, and receives the imaged image. On the basis of the received image, the outside-vehicle information detecting unit 12030 may perform processing of detecting an object such as a human, a vehicle, an obstacle, a sign, a character on a road surface, or the like, or processing of detecting a distance thereto.

The imaging section 12031 is an optical sensor that receives light, and which outputs an electric signal corresponding to a received light amount, of the light. The imaging section 12031 can output the electric signal as an image, or can output the electric signal as information about a measured distance. In addition, the light received by the imaging section 12031 may be visible light, or may be invisible light such as infrared rays or the like.

The in-vehicle information detecting unit 12040 detects information about the inside of the vehicle. The in-vehicle information detecting unit 12040 is, for example, connected with a driver state detecting section 12041 that detects the state of a driver. The driver state detecting section 12041, for example, includes a camera that images the driver. On the basis of detection information input from the driver state detecting section 12041, the in-vehicle information detecting unit 12040 may calculate a degree of fatigue of the driver or a degree of concentration of the driver, or may determine whether the driver is dozing.

The microcomputer 12051 can calculate a control target value for the driving force generating device, the steering mechanism, or the braking device on the basis of the information about the inside or outside of the vehicle which information is obtained by the outside-vehicle information detecting unit 12030 or the in-vehicle information detecting unit 12040, and output a control command to the driving system control unit 12010. For example, the microcomputer 12051 can perform cooperative control intended to implement functions of an advanced driver assistance system (ADAS) which functions include collision avoidance or shock mitigation for the vehicle, following driving based on a following distance, vehicle speed maintaining driving, a warning of collision of the vehicle, a warning of deviation of the vehicle from a lane, or the like.

In addition, the microcomputer 12051 can perform cooperative control intended for automatic driving, which makes the vehicle to travel autonomously without depending on the operation of the driver, or the like, by controlling the driving force generating device, the steering mechanism, the braking device, or the like on the basis of the information about the outside or inside of the vehicle which information is obtained by the outside-vehicle information detecting unit 12030 or the in-vehicle information detecting unit 12040.

In addition, the microcomputer 12051 can output a control command to the body system control unit 12020 on the basis of the information about the outside of the vehicle which information is obtained by the outside-vehicle information detecting unit 12030. For example, the microcomputer 12051 can perform cooperative control intended to prevent a glare by controlling the headlamp so as to change from a high beam to a low beam, for example, in accordance with the position of a preceding vehicle or an oncoming vehicle detected by the outside-vehicle information detecting unit 12030.

The sound/image output section 12052 transmits an output signal of at least one of a sound and an image to an output device capable of visually or auditorily notifying information to an occupant of the vehicle or the outside of the vehicle. In the example of FIG. 48, an audio speaker 12061, a display section 12062, and an instrument panel 12063 are illustrated as the output device. The display section 12062 may, for example, include at least one of an on-board display and a head-up display.

Figure 49:
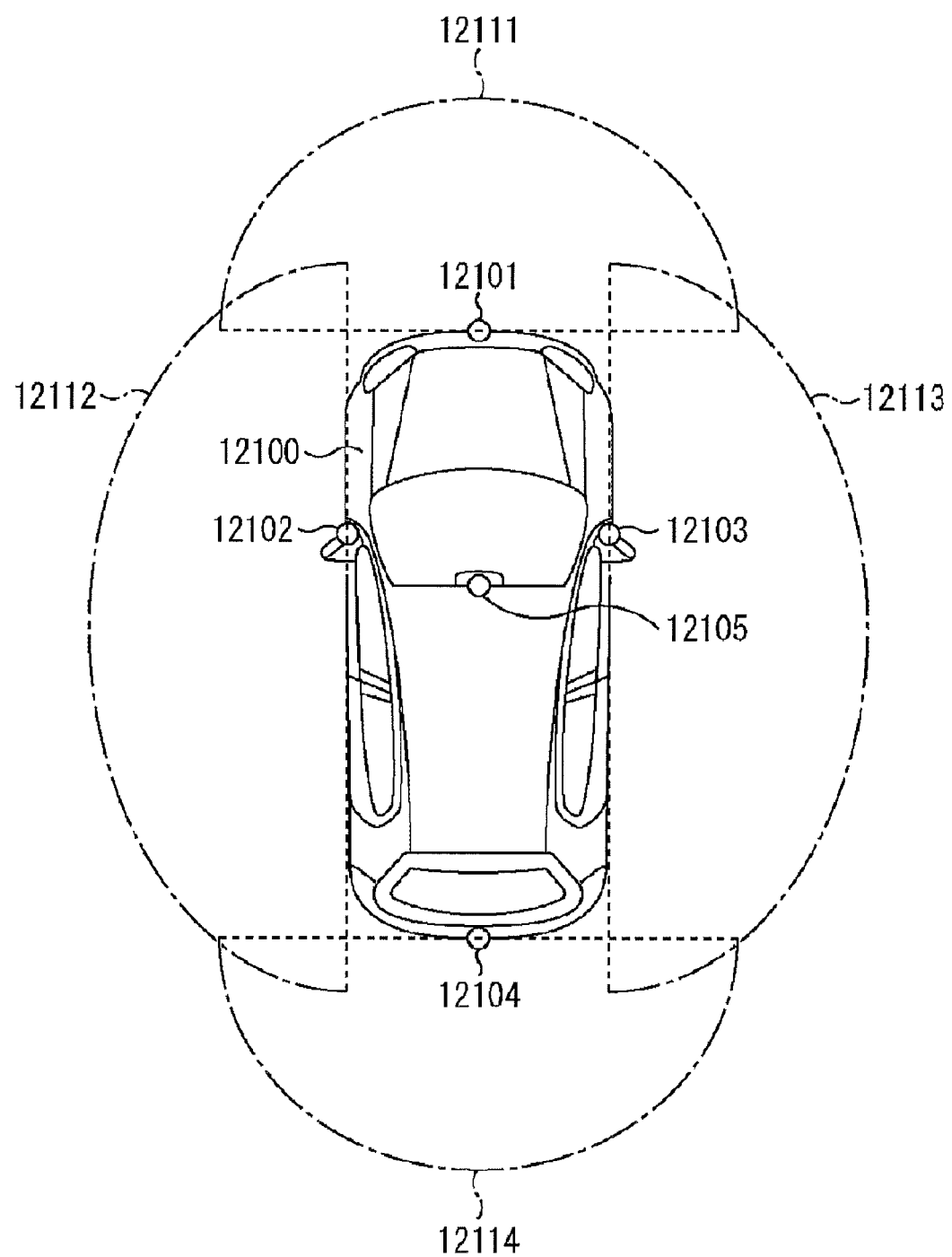
FIG. 49 is a diagram of assistance in explaining an example of an installation position of an imaging section.

FIG. 49 is a diagram depicting an example of the installation position of the imaging section 12031.

In FIG. 49, the imaging section 12031 includes imaging sections 12101, 12102, 12103, 12104, and 12105.

The imaging sections 12101, 12102, 12103, 12104, and 12105 are, for example, disposed at positions on a front nose, sideview mirrors, a rear bumper, and a back door of the vehicle 12100 as well as a position on an upper portion of a windshield within the interior of the vehicle. The imaging section 12101 provided to the front nose and the imaging section 12105 provided to the upper portion of the windshield within the interior of the vehicle obtain mainly an image of the front of the vehicle 12100. The imaging sections 12102 and 12103 provided to the sideview mirrors obtain mainly an image of the sides of the vehicle 12100. The imaging section 12104 provided to the rear bumper or the back door obtains mainly an image of the rear of the vehicle 12100. The imaging section 12105 provided to the upper portion of the windshield within the interior of the vehicle is used mainly to detect a preceding vehicle, a pedestrian, an obstacle, a signal, a traffic sign, a lane, or the like.

Incidentally, FIG. 49 depicts an example of photographing ranges of the imaging sections 12101 to 12104. An imaging range 12111 represents the imaging range of the imaging section 12101 provided to the front nose. Imaging ranges 12112 and 12113 respectively represent the imaging ranges of the imaging sections 12102 and 12103 provided to the sideview mirrors. An imaging range 12114 represents the imaging range of the imaging section 12104 provided to the rear bumper or the back door. A bird's-eye image of the vehicle 12100 as viewed from above is obtained by superimposing image data imaged by the imaging sections 12101 to 12104, for example.

At least one of the imaging sections 12101 to 12104 may have a function of obtaining distance information. For example, at least one of the imaging sections 12101 to 12104 may be a stereo camera constituted of a plurality of imaging elements, or may be an imaging element having pixels for phase difference detection.

For example, the microcomputer 12051 can determine a distance to each three-dimensional object within the imaging ranges 12111 to 12114 and a temporal change in the distance (relative speed with respect to the vehicle 12100) on the basis of the distance information obtained from the imaging sections 12101 to 12104, and thereby extract, as a preceding vehicle, a nearest three-dimensional object in particular that is present on a traveling path of the vehicle 12100 and which travels in substantially the same direction as the vehicle 12100 at a predetermined speed (for example, equal to or more than 0 km/hour). Further, the microcomputer 12051 can set a following distance to be maintained in front of a preceding vehicle in advance, and perform automatic brake control (including following stop control), automatic acceleration control (including following start control), or the like. It is thus possible to perform cooperative control intended for automatic driving that makes the vehicle travel autonomously without depending on the operation of the driver or the like.

For example, the microcomputer 12051 can classify three-dimensional object data on three-dimensional objects into three-dimensional object data of a two-wheeled vehicle, a standard-sized vehicle, a large-sized vehicle, a pedestrian, a utility pole, and other three-dimensional objects on the basis of the distance information obtained from the imaging sections 12101 to 12104, extract the classified three-dimensional object data, and use the extracted three-dimensional object data for automatic avoidance of an obstacle. For example, the microcomputer 12051 identifies obstacles around the vehicle 12100 as obstacles that the driver of the vehicle 12100 can recognize visually and obstacles that are difficult for the driver of the vehicle 12100 to recognize visually. Then, the microcomputer 12051 determines a collision risk indicating a risk of collision with each obstacle. In a situation in which the collision risk is equal to or higher than a set value and there is thus a possibility of collision, the microcomputer 12051 outputs a warning to the driver via the audio speaker 12061 or the display section 12062, and performs forced deceleration or avoidance steering via the driving system control unit 12010. The microcomputer 12051 can thereby assist in driving to avoid collision.

At least one of the imaging sections 12101 to 12104 may be an infrared camera that detects infrared rays. The microcomputer 12051 can, for example, recognize a pedestrian by determining whether or not there is a pedestrian in imaged images of the imaging sections 12101 to 12104. Such recognition of a pedestrian is, for example, performed by a procedure of extracting characteristic points in the imaged images of the imaging sections 12101 to 12104 as infrared cameras and a procedure of determining whether or not it is the pedestrian by performing pattern matching processing on a series of characteristic points representing the contour of the object. When the microcomputer 12051 determines that there is a pedestrian in the imaged images of the imaging sections 12101 to 12104, and thus recognizes the pedestrian, the sound/image output section 12052 controls the display section 12062 so that a square contour line for emphasis is displayed so as to be superimposed on the recognized pedestrian. The sound image output section 12052 may also control the display section 12062 so that an icon or the like representing the pedestrian is displayed at a desired position.

Although the first to ninth embodiments, the modification examples 1 and 2, and the application examples have been described above, the present disclosure is not limited to the above-described embodiments and the like, and may be modified in a variety of ways. For example, in the above-described first embodiment and the like, only the photoelectric conversion layer 20 is provided on the wiring layer 30 as the photoelectric converter, but the content of the present disclosure is not limited to such a configuration. For example, a so-called inorganic photoelectric converter may be disposed below the semiconductor substrate 40.

Moreover, in the imaging element and the imaging apparatus of the present disclosure, it is not necessary to include all the components described in the above-described embodiments, etc., and any other layer may be further included.

It is to be noted that the effects described herein are merely illustrative and non-limiting, and other effects may be included.

It is to be noted that the present disclosure may have the following configurations.

(1)

An imaging element including:

a photoelectric conversion layer;

a first electrode that collects a negative signal charge generated in the photoelectric conversion layer; and a second electrode that collects a positive signal charge generated in the photoelectric conversion layer.

each of the first electrode and the second electrode being provided on side opposite to a light incident surface of the photoelectric conversion layer.

(2)

The imaging element according to (1), in which different voltages are applied to the first electrode and the second electrode.

(3)

The imaging element according to (1) or (2), in which the photoelectric conversion layer includes a third electrode on side of the light incident surface.

(4)

The imaging element according to (3), in which a voltage lower than a voltage applied to the first electrode and higher than a voltage applied to the second electrode is applied to the third electrode.

(5)

The imaging element according to (3) or (4), in which the photoelectric conversion layer includes a first insulating layer between the photoelectric conversion layer and the third electrode.

(6)

The imaging element according to (5), in which the first insulating layer has an opening at a position opposed to at least one of the first electrode or the second electrode.

(7)

The imaging element according to (6), in which an area of the opening is smaller than areas of the first electrode and the second electrode opposed to the opening.

(8)

The imaging element according to any one of (1) to (7), including a fourth electrode in at least a portion between the first electrode and the second electrode.

(9)

The imaging element according to (8), in which a voltage lower than a voltage applied to the first electrode and higher than a voltage applied to the second electrode is applied to the fourth electrode.

(10)

The imaging element according to any one of (1) to (9), in which the first electrode and the second electrode are provided upright in a stacking direction, and at least a portion of each of the first electrode and the second electrode is embedded in the photoelectric conversion layer.

(11)

The imaging element according to any one of (1) to (10), in which the photoelectric conversion layer includes, between the first electrode and the second electrode, a barrier layer that prevents injection of a charge from each of the first electrode and the second electrode to the photoelectric conversion layer.

(12)

The imaging element according to any one oft (1) to (11), in which the first electrode includes a first accumulation electrode that accumulates the negative signal charge generated in the photoelectric conversion layer and a first readout electrode that reads the negative signal charge accumulated in the first accumulation electrode, and the second electrode includes a second accumulation electrode that accumulates the positive signal charge generated in the photoelectric conversion layer, and a second readout electrode that reads the positive signal charge accumulated in the second accumulation electrode.

(13)

The imaging element according to (12), in which the photoelectric conversion layer includes a second insulating layer between the first accumulation electrode and the second accumulation electrode, and is electrically coupled to the first readout electrode and the second readout electrode.

(14)

The imaging element according to (12) or (13), in which the first electrode has a first barrier forming electrode between the first accumulation electrode and the first readout electrode, and the second electrode has a second barrier forming electrode between the second accumulation electrode and the second readout electrode.

(15)

The imaging element according to (14), in which a first voltage higher than a voltage of the second accumulation electrode is applied to the first barrier forming electrode during charge accumulation, and a second voltage lower than a voltage of the first accumulation electrode is applied to the second barrier forming electrode during charge accumulation, and the first voltage is higher than the second voltage.

(16)

The imaging element according to any one of (1) to (15), further including a controller that controls potentials of the first electrode and the second electrode.

(17)

The imaging element according to (16), in which the controller switches a polarity of the signal charges collected in the first electrode and a polarity of the signal charge collected in the second electrode to a same polarity or different polarities.

(18)

An imaging apparatus including a plurality of pixels each of which includes one or a plurality of imaging elements, the imaging element including:

a photoelectric conversion layer, a first electrode that collects a negative signal charge generated in the photoelectric conversion layer, and a second electrode that collects a positive signal charge generated in the photoelectric conversion layer, each of the first electrode and the second electrode being provided on side opposite to a light incident surface of the photoelectric conversion layer.

This application claims the benefit of Japanese Priority Patent Application JP2017-045687 filed with the Japan Patent Office on Mar. 10, 2017, the entire contents of which are incorporated herein by reference.

It should be understood by those skilled in the art that various modifications, combinations, sub-combinations, and alterations may occur depending on design requirements and other factors insofar as they are within the scope of the appended claims or the equivalents thereof.

What is claimed is:

1. An imaging element, comprising:
    a photoelectric conversion layer;
    a first electrode that collects a negative signal charge generated in the photoelectric conversion layer; and
    a second electrode that collects a positive signal charge generated in the photoelectric conversion layer,
    wherein each of the first electrode and the second electrode are provided on a side of the photoelectric conversion layer opposite to a light incident surface of the photoelectric conversion layer, wherein the photoelectric conversion layer includes a third electrode on side of the light incident surface, wherein the photoelectric conversion layer includes a first insulating layer between the photoelectric conversion layer and the third electrode, and wherein the first insulating layer has an opening at a position opposed to at least one of the first electrode or the second electrode.

2. The imaging element according to claim 1, wherein an area of the opening is smaller than areas of the first electrode and the second electrode opposed to the opening.

3. The imaging element according to claim 1, comprising a fourth electrode in at least a portion between the first electrode and the second electrode.

4. The imaging element according to claim 3, wherein a voltage lower than a voltage applied to the first electrode and higher than a voltage applied to the second electrode is applied to the fourth electrode.

5. The imaging element according to claim 1, wherein the photoelectric conversion layer includes, between the first electrode and the second electrode, a barrier layer that prevents injection of a charge from each of the first electrode and the second electrode to the photoelectric conversion layer.

6. The imaging element according to claim 1, further comprising a controller that controls potentials of the first electrode and the second electrode.

7. An imaging element, comprising:
a photoelectric conversion layer;
a first electrode that collects a negative signal charge generated in the photoelectric conversion layer; and
a second electrode that collects a positive signal charge generated in the photoelectric conversion layer,
wherein each of the first electrode and the second electrode are provided on a side of the photoelectric conversion layer opposite to a light incident surface of the photoelectric conversion layer, wherein the first electrode and the second electrode are provided upright in a stacking direction, and wherein at least a portion of each of the first electrode and the second electrode is embedded in the photoelectric conversion layer.

8. The imaging element according to claim 7, wherein different voltages are applied to the first electrode and the second electrode.

9. The imaging element according to claim 7, wherein the photoelectric conversion layer includes a third electrode on side of the light incident surface.

10. The imaging element according to claim 9, wherein a voltage lower than a voltage applied to the first electrode and higher than a voltage applied to the second electrode is applied to the third electrode.

11. The imaging element according to claim 9, wherein the photoelectric conversion layer includes a first insulating layer between the photoelectric conversion layer and the third electrode.

12. An imaging, element, comprising:
a photoelectric conversion layer;
a first electrode that collects a negative signal charge generated in the photoelectric conversion layer; and
second electrode that collects a positive charge generated in the photoelectric conversion layer,
wherein each of the first electrode and the second electrode are provided on a side of the photoelectric conversion layer opposite to a light incident surface of the photoelectric conversion layer,
wherein the first electrode includes a first accumulation electrode that accumulates the negative signal charge generated in the photoelectric conversion layer and a first readout electrode that reads the negative signal charge accumulated in the first accumulation electrode, and
wherein the second electrode includes a second accumulation electrode that accumulates the positive signal charge generated in the photoelectric conversion layer, and a second readout electrode that reads the positive signal charge accumulated in the second accumulation electrode.

13. The imaging element according to claim 12, wherein the photoelectric conversion layer includes a second insulating layer between the first accumulation electrode and the second accumulation electrode, and is electrically coupled to the first readout electrode and the second readout electrode.

14. The imaging element according to claim 12, wherein
the first electrode includes a first barrier forming electrode between the first accumulation electrode and the first readout electrode, and
the second electrode includes a second barrier forming electrode between the second accumulation electrode and the second readout electrode.

15. The imaging element according to claim 14, wherein
a first voltage higher than a voltage of the second accumulation electrode is applied to the first barrier forming electrode during charge accumulation, and a second voltage lower than a voltage of the first accumulation electrode is applied to the second barrier forming electrode during charge accumulation, and
the first voltage is higher than the second voltage.

16. The imaging element according to claim 12, wherein different voltages are applied to the first electrode and the second electrode.

17. The imaging element according to claim 12, wherein the photoelectric conversion layer includes a third electrode on side of the light incident surface.

18. The imaging element according to claim 17, wherein a voltage lower than a voltage applied to the first electrode and higher than a voltage applied to the second electrode is applied to the third electrode.

19. The imaging element according to claim 17, wherein the photoelectric conversion layer includes a first insulating layer between the photoelectric conversion layer and the third electrode.

20. An imaging element, comprising:
a photoelectric conversion layer;
a first electrode that collects a negative signal charge generated in the photoelectric conversion layer;
a second electrode that collects a positive signal charge generated in the photoelectric conversion layer; and
a controller that controls potentials of the first electrode and the second electrode,
wherein each of the first electrode and the second electrode are provided on a side of the photoelectric conversion layer opposite to a light incident surface of the photoelectric conversion layer, and wherein the controller switches a polarity of the signal charges collected in the first electrode and a polarity of the signal charge collected in the second electrode to a same polarity or different polarities.

\* \* \* \* \*